(12) United States Patent
Wang et al.

(10) Patent No.: US 7,124,342 B2
(45) Date of Patent: Oct. 17, 2006

(54) SMART CAPTURE FOR ATPG (AUTOMATIC TEST PATTERN GENERATION) AND FAULT SIMULATION OF SCAN-BASED INTEGRATED CIRCUITS

(75) Inventors: Laung-Terng Wang, Sunnyvale, CA (US); Khader S. Abdel-Hafez, San Francisco, CA (US); Xiaoqing Wen, Sunnyvale, CA (US); Boryau (Jack) Sheu, San Jose, CA (US); Shun-Miin (Sam) Wang, San Jose, CA (US)

(73) Assignee: Syntest Technologies, Inc., Sunnyvale, CA (US)

( * ) Notice: Subject to any disclaimer, the term of this patent is extended or adjusted under 35 U.S.C. 154(b) by 285 days.

(21) Appl. No.: 10/850,460

(22) Filed: May 21, 2004

(65) Prior Publication Data

US 2005/0262409 A1    Nov. 24, 2005

(51) Int. Cl.
*G06F 11/00* (2006.01)
(52) U.S. Cl. .................. 714/741; 714/726; 714/744
(58) Field of Classification Search ............. 714/724, 714/30, 731, 729, 741, 744; 375/354
See application file for complete search history.

(56) References Cited

U.S. PATENT DOCUMENTS

| | | | | |
|---|---|---|---|---|
| 5,625,630 | A * | 4/1997 | Abramovici et al. | 714/724 |
| 5,680,543 | A * | 10/1997 | Bhawmik | 714/30 |
| 5,909,451 | A * | 6/1999 | Lach et al. | 714/726 |
| 5,949,692 | A | 9/1999 | Beausang et al. | |
| 6,070,260 | A * | 5/2000 | Buch et al. | 714/731 |
| 6,195,776 | B1 | 2/2001 | Ruiz et al. | |
| 6,442,722 | B1 * | 8/2002 | Nadeau-Dostie et al. | 714/731 |
| 6,715,094 | B1 * | 3/2004 | Jacobs | 713/400 |
| 6,760,392 | B1 * | 7/2004 | Tan et al. | 375/354 |
| 6,954,887 | B1 * | 10/2005 | Wang et al. | 714/729 |
| 6,957,403 | B1 * | 10/2005 | Wang et al. | 716/3 |
| 7,007,213 | B1 * | 2/2006 | Wang et al. | 714/729 |

OTHER PUBLICATIONS

X. Lin and R. Thompson, "Test Generation for Designs with Multiple Clocks", Proc., ACM/IEEE Design Automation Conf., Anaheim, California, pp. 662-667, Jun. 2-6, 2003.

* cited by examiner

*Primary Examiner*—David Ton
(74) *Attorney, Agent, or Firm*—Jim Zegeer

(57) ABSTRACT

A method for generating stimuli and test responses for testing faults in a scan-based integrated circuit in a selected scan-test mode or a selected self-test mode, the scan-based integrated circuit containing a plurality of scan chains, N clock domains, and C cross-clock domain blocks, each scan chain comprising multiple scan cells coupled in series, each clock domain having one capture clock, each cross-clock domain block comprising a combinational logic network. The method comprises compiling the scan-based integrated circuit into a sequential circuit model; specifying input constraints on the scan-based integrated circuit during a shift and capture operation; specifying a clock grouping to map the N clock domains into G clock domain groups, where N>G>1; transforming the sequential circuit model into an equivalent combinational circuit model according to the input constraints and the clock grouping; and generating the stimuli and test responses on the equivalent combinational circuit model according to the input constraints.

102 Claims, 28 Drawing Sheets

SMART CAPTURE FOR ATPG (AUTOMATIC TEST PATTERN GENERATION) AND FAULT SIMULATION OF SCAN-BASED INTEGRATED CIRCUITS

RELATED APPLICATION DATA

This application claims the benefit of U.S. Provisional Application No. 60/442,901 filed May 23, 2003, titled "Smart ATPG (Automatic Test Pattern Generation) for Scan-Based Integrated Circuits", which is hereby incorporated by reference.

FIELD OF THE INVENTION

The present invention generally relates to the field of scan-based design and test using design-for-test (DFT) techniques. Specifically, the present invention relates to the field of Scan/ATPG (automatic test pattern generation), Logic BIST (built-in self-test), and Compressed Scan/ATPG.

BACKGROUND OF THE INVENTION

In this specification, the term "integrated circuit" is used to describe a chip or MCM (multi-chip module) embedded with DFT (design-for-test) techniques.

An integrated circuit or circuit assembly generally contains multiple clocks, which are either generated internally or supplied externally. Each clock is distributed to a set of storage elements via a skew-minimized network, which supplies clock pulses to all storage elements essentially at the same time. Such a clock, its related storage elements, and all combinational logic blocks bounded by these storage elements, form a clock domain. While the clock skew within a single clock domain is designed to be negligible, the clock skew between different clock domains is unbounded and can vary greatly for different storage elements.

Scan-based design is the most widely used design-for-test (DFT) approach for producing high-quality integrated circuits. Scan-based design requires that all storage elements in an integrated circuit, such as D flip-flops, be replaced with their scan-equivalent storage elements, such as Scan D flip-flops, otherwise known as scan cells. These scan cells are connected to form one or more scan chains, with each scan chain being controlled by one or more scan enable (SE) signals and capture clocks (CK) each belonging to a separate clock or frequency domain.

Testing a scan-based integrated circuit proceeds in a sequence of shift-in/shift-out operation and capture operation, repeated for a predetermined number of test patterns. During the shift operation, scan enable (SE) signals, local to all scan cells in a clock domain, are used to configure all scan cells in an integrated circuit into scan chains by selecting the scan data inputs as the input source of all scan cells in the scan chains, and a predetermined stimuli during scan-test or a pseudorandom stimuli during self-test is shifted serially through the scan chains into all scan cells in the circuit. During the capture operation, the scan enable (SE) signal is used to select the data inputs as the input source of all scan cells to test the functional path of the circuit using the stimulus loaded during the shift operation.

Automatic test pattern generation (ATPG) and fault simulation are used to generate the scan test patterns, and to measure their fault coverage respectively. In order to simplify the ATPG and fault simulation process, an event-based logic simulator, as opposed to a timing logic simulator, is embedded within the ATPG and fault simulation engine, used to perform the logic simulation of the capture operation of the scan based test. This makes it impossible to apply the capture clocks of different clock domains simultaneously during the capture operation and simulate the results, since the clock skew between different clock domains would result in incorrect values being captured into some scan cells in the event-based simulation. Different approaches for applying the capture clocks during the capture operation have been developed in order to get around this problem.

Prior-art solution #1, see FIG. 2, is commonly referred to as the one-hot method. In this method all capture clocks are used during the shift operation to set up the stimulus, but only one capture clock is applied during each capture operation. Multiple patterns are used to test the logic paths connected to scan cells belonging to different clock domains. The main advantage of this method is the simplicity in implementing the ATPG and fault simulation engine. The main disadvantage of this method is that a large number of test patterns are required to test the circuit, since only one clock domain can be tested in any given pattern. This further results in longer test time and larger test data volume, which increases the total test cost.

Prior-art solution #2, see FIG. 3, is described in U.S. Pat. No. 6,195,776 by Ruiz et al. (2001). In this approach, a clock order is used to apply selected capture clocks sequentially during the capture operation. However, during ATPG and fault simulation, these capture clocks are simulated in parallel while selectively setting unknown values ('X') on different logic paths, depending on the clock order. This guarantees that the results of the parallel cycle-based simulation will match the results of the sequential application of the clocks during the actual capture operation of the test pattern. The main advantage of this approach is that it achieves the same fault coverage as prior-art #1 using a smaller set of test vectors and reduced CPU time. The main disadvantage of this approach is that the test size is still large, since the ATPG and fault simulator are pessimistic in calculating the fault coverage of different scan test patterns due to the unknown values.

Prior-art solution #3, see FIG. 4, is described by Lin et al. In this approach, a clock order is used to apply selected capture clocks sequentially during the capture operation. Multi-timeframe ATPG and fault simulation is used during the capture operation to calculate the exact fault coverage of the test patterns applied. The main advantage of this approach is that the test size is smaller than the previous two approaches, and can approach the optimal set of test vectors, provided that all clocks are applied during the capture operation of the ATPG and fault simulation. In practice, this is difficult to perform, since it results in a dramatic increase in CPU time requirements. In practice, the number of clocks that can be applied is limited, resulting in a sub-optimal set of test patterns using longer CPU time.

Prior-art solution #4, see FIG. 5, is described in U.S. patent application No. 20020184560 by Wang et al. In this approach, a clock order is used to apply selected capture clocks sequentially during the capture operation. A circuit expansion process is used to transform the circuit into an equivalent combinational circuit model, where logic paths are expanded to simulate the results of a multi-timeframe simulation with a single time-frame simulation of the expanded circuit. The main advantage of this approach is that its test size is small, and approaches the optimum set of test vectors for any given circuit. Furthermore, this is accomplished with a realistic increase in memory size, as opposed to an unrealistic increase in CPU time as in prior-art #3. The main disadvantage of this approach is that the increase in memory size might prevent the circuit from being able to fit within a given system memory, and might become un-reasonable as design size continues to grow.

Therefore, there is a need for an improved ATPG and fault simulation, comprising a method and a computer-aided design (CAD) system, that is capable of achieving high fault coverage using an optimum set of test vectors within reasonable memory size and CPU time.

SUMMARY OF THE INVENTION

Accordingly, the present invention is intended to achieve three objectives: (1) providing an improved ATPG (automatic test pattern generation) and fault simulation method capable of using a cycle-based logic simulator to simulate multiple-clock events and generate an optimal set of test patterns with low memory usage and short CPU time, (2) providing a method for conducting clock grouping and clock ordering automatically and efficiently, and (3) providing a method to improve the efficiency of the method of prior-art #2 summarized in BACKGROUND and detailed in U.S. Pat. No. 6,195,776 by Ruiz et al. (2001). The present invention further comprises a CAD (computer-aided design) system that implements the methods. The present invention is summarized as follow:

(a) Circuit Expansion Based Improvement on ATPG and Fault Simulation

The present invention comprises any method that uses a hybrid ATPG and fault simulation approach capable of selectively using the circuit expansion or multi-timeframe simulation method in conjunction with any number of other prior-art methods. This hybrid method allows the testing of all cross-clock domain blocks in a circuit while meeting input constraints regarding required memory usage, required CPU time and required test-pattern count. This is done by selectively grouping the clock domains into clock domain groups, and performing circuit expansion or a multi-timeframe simulation on selected clock domain groups and cross-clock domain blocks, while selecting other prior-art methods to test the remaining clock domain groups and cross-clock domain blocks to meet the required criteria.

(b) Clock Domain Grouping

The purpose of clock grouping in the present invention is to conduct circuit expansion on the combinational logic blocks related to the grouped clocks. The present invention comprises any method that identifies those clocks which, when grouped together and for which circuit expansion is conducted, will best improve the performance of ATPG and fault simulation.

(c) Clock Domain Merging

The present invention comprises any method that merges a set of clock domains together. For example, suppose that one clock domain CD1 interacts to another clock domain CD2 through a cross-clock domain logic block CCD12. Also suppose that CD1 is captured before CD2. Merging CD1 and CD2 together means that two-time frames will be used for circuit transformation related to the two clock domains and their corresponding cross-clock domain logic blocks. The benefits are as follows: Even the clock domain CD2 is captured after the clock domain CD1 is captured, the controllability of the cross-clock domain logic block CCD12 is still high since the clock domain CD1 is also transformed to obtain the values in the clock domain CD1 after it is captured. As a result, all faults in the cross-clock domain logic block CCD12 can be detected or located. The benefit of clock domain grouping is that it can reduce the number of necessary ordered sequences of capture clocks.

(d) Domain-Interconnect Graph Based Capture Order Selection

In order to conduct circuit expansion on a clock group, it is necessary to select a capture order for all the grouped clocks. It is based on such an order that a sequential circuit can be transformed into its equivalent combinational circuit model. The present invention comprises any method that automatically selects an optimal or near-optimal set of capture orders for each clock group based on a domain-interconnect graph. A domain-interconnect graph is a directed graph, which is used to represent the relationship among all clock domains. A node represents a clock domain while a directed edge between any two nodes represents the corresponding cross-clock domain logic block. Such a domain-interconnect graph can be built based on the result of analyzing clock domains. Based on such a domain-interconnect graph, an optimal or near-optimal set of capture orders can be selected automatically.

(e) Improvement on Unknown-Value Based Multiple Timeframe Handling

As a summarized in BACKGROUND and detailed in U.S. Pat. No. 6,195,776 by Ruiz et al. (2001), prior-art #2 simulates all capture clocks in parallel by selectively setting unknown (X) values on different logic paths, depending on the clock order. The present invention comprises any method that generalizes this unknown-value based method into a constrained-value method. This is achieved by allowing the constraining of a cross-clock domain logic block with logic values, 1 and 0, as well as unknown-values, X's, to force an ATPG program to generate patterns where the cross-clock domain logic block does not change its state during a capture operation. As a result, a fault simulator can perform an accurate fault simulation of patterns where the cross-clock domain logic remains in a constant state during a capture operation. This further improves the accuracy of the fault simulation and ATPG of the unknown-value method. Therefore, a smaller test pattern set and greater measured fault coverage can be achieved.

To summarize, the present invention uses a hybrid approach for ATPG and fault simulation based on circuit expansion, which is supported by automatic clock grouping and capture order selection. In addition, the present invention uses a new technique to improve the efficiency of an existing multiple timeframe handling solution for ATPG and fault simulation. In conclusion, the present invention provides an efficient solution to ATPG and fault simulation for testing complicated and large-scale scan-based integrated circuits or circuit assemblies by achieving high fault coverage for stuck-at faults, bridging faults, IDDQ faults, transition faults launched from capture, transition faults launched from shift, path-delay faults launched from capture, and path-delay faults launched from shift, with lower memory usage and a smaller number of test patterns.

BRIEF DESCRIPTION OF THE DRAWINGS

The above and other objects, advantages and features of the invention will become more apparent when considered with the following specification and accompanying drawings wherein.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
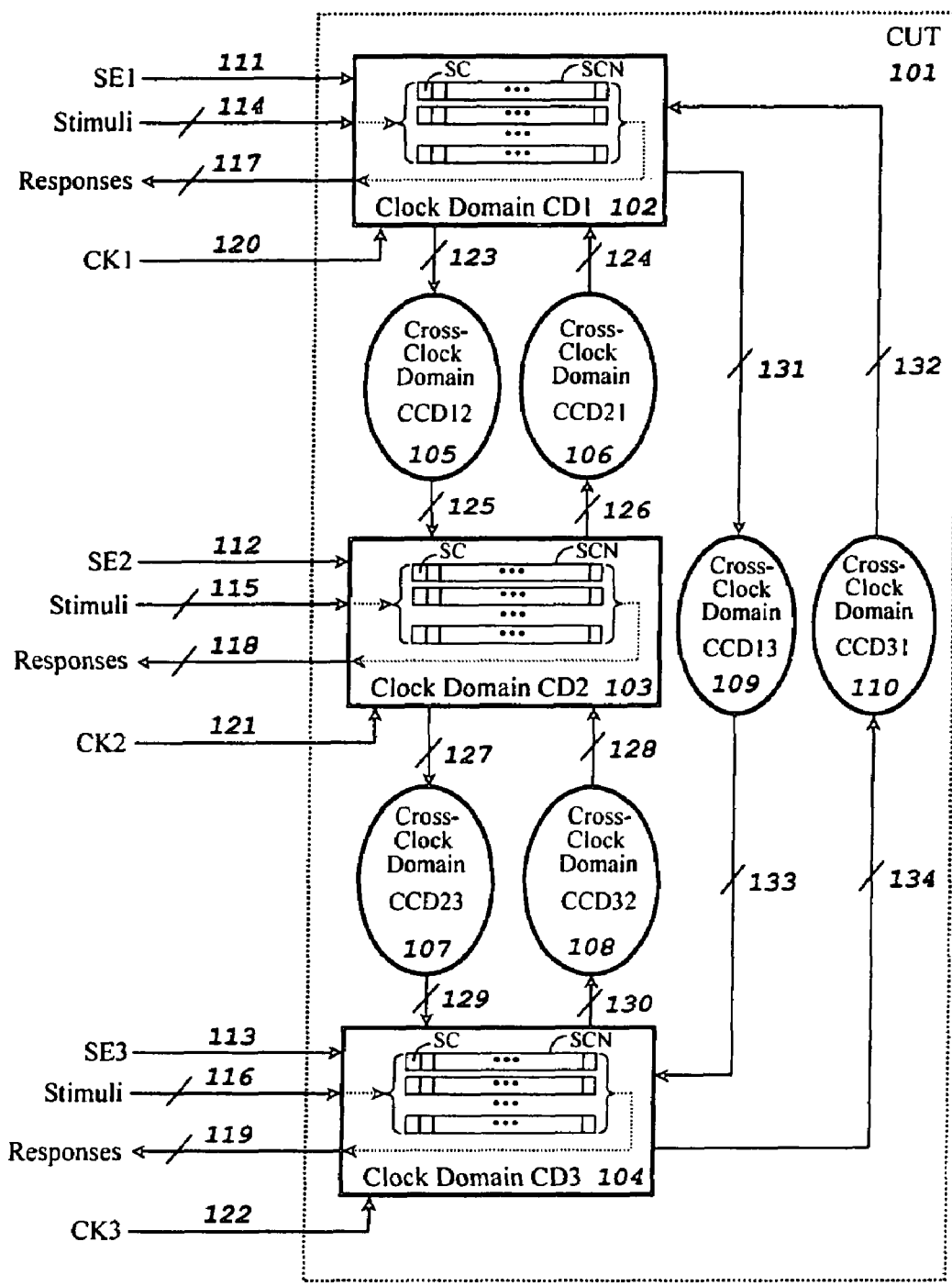
FIG. 1 shows a block diagram of a scan-based integrated circuit with three clock domains, inter-related with each other through six cross-clock domain blocks.

FIG. 1 shows a block diagram of a scan-based integrated circuit 101 with three inter-related clock domains, CD1 102 to CD3 104, and three scan clocks, CK1 120 to CK3 122. Each clock controls one clock domain. In addition, CD1 102 interacts to CD2 103 through the cross-clock domain block CCD12 105, CD2 103 interacts to CD1 102 through the cross-clock domain block CCD21 106, CD2 103 interacts to CD3 104 through the cross-clock domain block CCD23 107, CD3 104 interacts to CD2 103 through the cross-clock domain block CCD32 108, CD1 102 interacts to CD3 104 through the cross-clock domain block CCD13 109, and CD3 104 interacts to CD1 102 through the cross-clock domain block CCD3 1110.

The CUT (circuit-under-test) 101 is a scan-based integrated circuit, in which all of its storage cells are replaced with scan cells SC and all scan cells SC are connected into one or more scan chains SCN. Note that a scan cell is usually a clocked storage cell with two input ports, one called a data input port and the other called a scan input port, selectable with a scan enable (SE) signal. The data input port is connected to functional logic, which is used to capture test responses. The scan input port is connected to the output port of another scan cell or to an external scan input signal; this way, a scan chain, i.e. shift register, can be formed to bring in test stimuli or bring out captured test responses.

The CUT 101 can be tested in either scan-test mode or self-test mode. The two modes differ in how test stimuli, 114 to 116, are generated and provided, how test responses, 117 to 119, are collected and analyzed, and how scan enable signals, SE1 111 to SE3 113, and scan clocks, CK1 120 to CK3 122, are controlled. In scan-test mode, test stimuli, 114 to 116, are generated by an ATPG (automatic test pattern generation) program and applied by an ATE (automatic test equipment). The ATE also collects and analyzes test responses, 117 to 119, and controls all scan enable signals SE1 111 to SE3 113, and scan clocks, CK1 120 to CK3 122. In self-test mode, test stimuli, 114 to 116, are generated and provided by an on-chip PRPG (pseudo-random pattern generator). The test responses, 117 to 119, are collected and analyzed by an on-chip MISR (multi-input signature register). Scan enable signals, SE1 111 to SE3 113, and scan clocks, CK1 120 to CK3 122, are also controlled by on-chip circuitry in self-test mode.

In both scan-test and self-test mode, test is conducted by repeating two operations: namely shift and capture. During a shift operation, all scan cells SC are configured into one or more scan chains SCN, i.e. shift registers, by properly controlled scan enable signals, SE1 111 to SE3 113. Test stimuli, 114 to 116, are then shifted into these scan chains SCN. During a capture operation, all scan cells SC are configured by properly controlled scan enable signals, SE1 111 to SE3 113, to catch data from their data input ports. During this capture operation, test responses, 117 to 119, corresponding to the test stimuli, 114 to 116, shifted into scan cells during the shift operation are captured into scan cells SC by activating scan clocks CK1 120 to CK3 122 in one way or another. During the next shift operation, captured test responses are shifted out of the CUT to either ATE in scan-test mode or to MISR in self-test mode. Note that, at the same time as this shift operation, new test stimuli are also shifted in.

Obviously, both scan-test and self-test consist of an ATPG and fault simulation process. Test stimuli are either generated by an ATPG or by a PRPG and fault simulation is often needed to check if a fault is detected by a test stimulus or test pattern. In ATPG and fault simulation, it is necessary to assume what logic values are captured as test responses during a capture operation.

If a CUT has only one scan clock, assumed test responses are generally the same as actual test responses. If a CUT has multiple scan clocks, assumed test responses may be different from actual test responses. The reason is that there are usually unpredictable clock skews between any two clock domains, although clock skews in each clock domain can be minimized through clock tree synthesis. Such cross-clock domain and unpredictable clock skews, if not handled properly in ATPG and fault simulation, will cause a difference in assumed test responses and actual test responses. As a result, ATPG results and fault coverage will become inaccurate. Therefore, it is critical to take the impact of such unpredictable clock skews into consideration in ATPG and fault simulation in order to guarantee correct ATPG and fault simulation results.

Figure 2A:
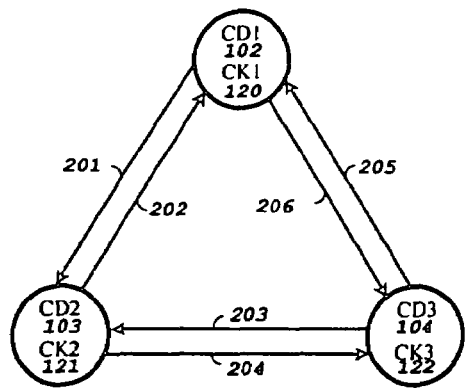
FIG. 2A shows the domain-interconnect graph used to represent the relationship among the clock domains shown in FIG. 1, with regard to prior-art solution #1.

FIG. 2A shows the domain-interconnect graph used to represent the relationship among the clock domains shown in FIG. 1, with regard to prior-art solution #1. 3 nodes are used to represent the 3 clock domains, CD1 102 to CD3 104. The corresponding scan clocks, CK1 120 to CK3 122, are also shown in the nodes for easy comprehension. The directed edge between two nodes represents a cross-clock domain block. For example, the edge 201 represents the cross-clock domain block CCD12 105 as shown in FIG. 1.

Figure 2B:
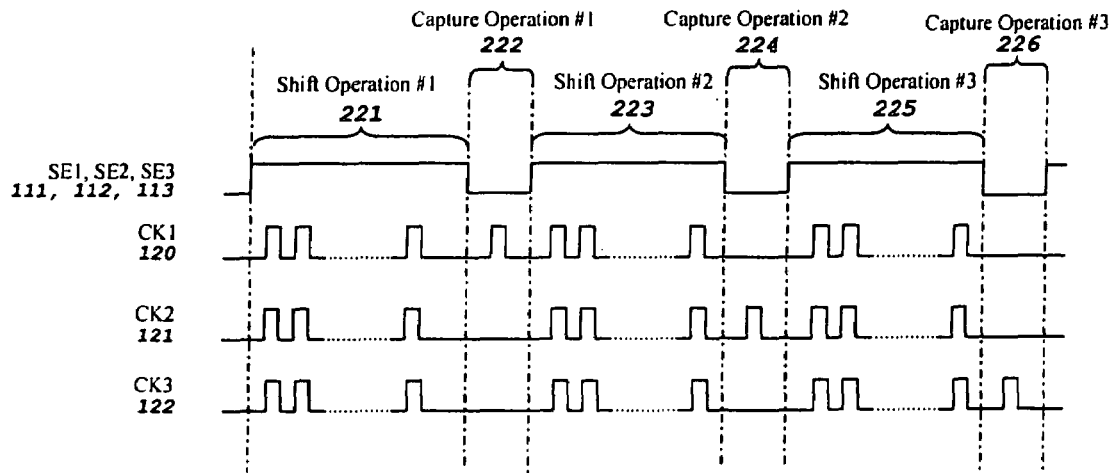
FIG. 2B shows the scan clock waveforms in ATPG (automatic test pattern generation) and fault simulation in order to detect or locate stuck-at faults, bridging faults, or IDDQ faults, with regard to prior-art solution #1.
Figure 2C:
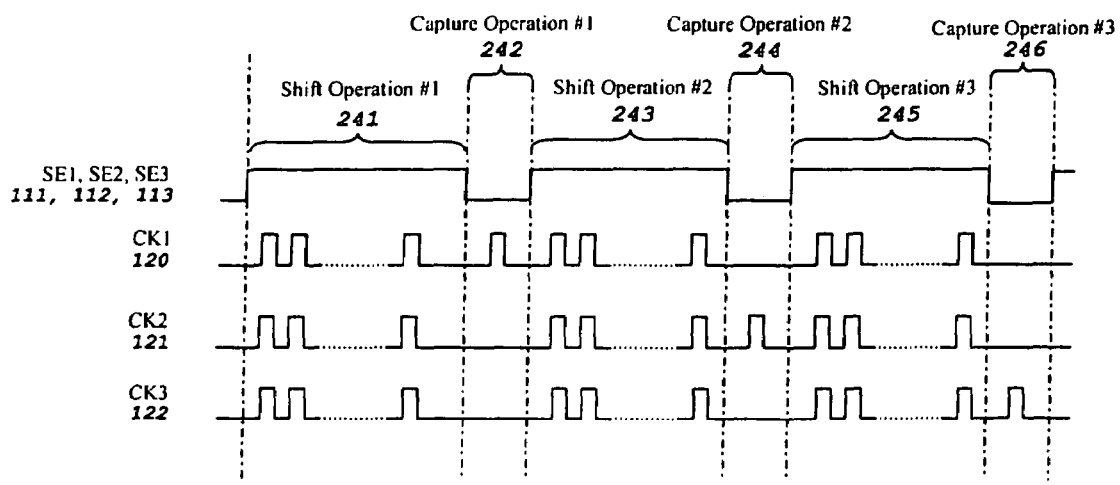
FIG. 2C shows the scan clock waveforms in actual test application in order to detect or locate stuck-at faults, bridging faults, or IDDQ faults, with regard to prior-art solution #1.

FIG. 2B shows the scan clock waveforms in ATPG (automatic test pattern generation) and fault simulation and FIG. 2C shows the scan clock waveforms in actual test application, both for detecting or locating stuck-at faults, bridging faults, or IDDQ faults (referred to as faults) and with regard to prior-art solution #1.

In order to avoid the impact of unpredictable clock skews among different clock domains, this solution, also called the one-hot technique, requires that only one scan clock be activated during each capture operation as shown in FIG. 2C. Generally, if scan clocks are activated in this manner, the circuit behavior during a capture operation can be fully represented by only one copy of the corresponding combinational logic portion in the circuit, for the purpose of ATPG and fault simulation. As a result, the impact of unpredictable clock skews can be easily avoided in ATPG and fault simulation.

As shown in FIG. 2B, whenever the scan clock CK1 120 is activated, all faults in the clock domain CD1 102 and cross-clock domain blocks, CCD21 106 and CCD31 110, can be targeted in ATPG and fault simulation; whenever the scan clock CK2 121 is activated, all faults in the clock domain CD2 103 and cross-clock domain blocks, CCD12 105 and CCD32 108, can be targeted in ATPG and fault simulation; and whenever the scan clock CK3 122 is activated, all faults in the clock domain CD3 104 and cross-clock domain blocks, CCD13 109 and CCD23 107, can be targeted in ATPG and fault simulation. As a result, all faults in the CUT 101 can be targeted in ATPG and fault simulation.

The fault coverage of this solution is usually high since all faults can be targeted in ATPG and fault simulation. In addition, a combinational ATPG program is enough when test patterns are to be generated deterministically. Furthermore, its memory usage is low since, in order to conduct ATPG and fault simulation for one capture operation with regard to one scan clock, it is only necessary to keep the circuit model data for the corresponding clock domain and the cross-clock domain blocks that interact to the clock domain. However, the number of test patterns generated by this solution is large and CPU time is long. The reasons are that each run of ATPG and fault simulation can only target faults in one clock domain and a few corresponding cross-clock domain blocks and that after a capture operation is conducted for a scan clock, a shift operation must be conducted in order to shift out the test responses and shift in new test stimuli.

Figure 3A:
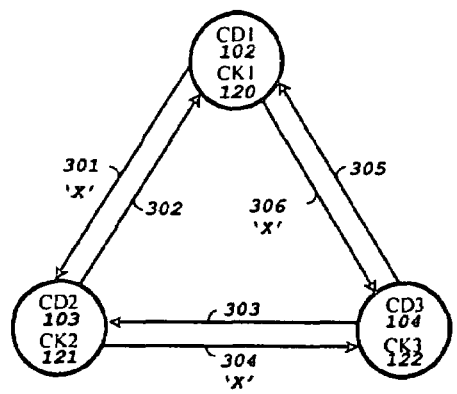
FIG. 3A shows the domain-interconnect graph used to represent the relationship among the clock domains shown in FIG. 1, with regard to prior-art solution #2.

FIG. 3A shows the domain-interconnect graph used to represent the relationship among the clock domains shown in FIG. 1, with regard to prior-art solution #2. The meanings of nodes and edges are the same as explained for FIG. 2A.

Figure 3B:
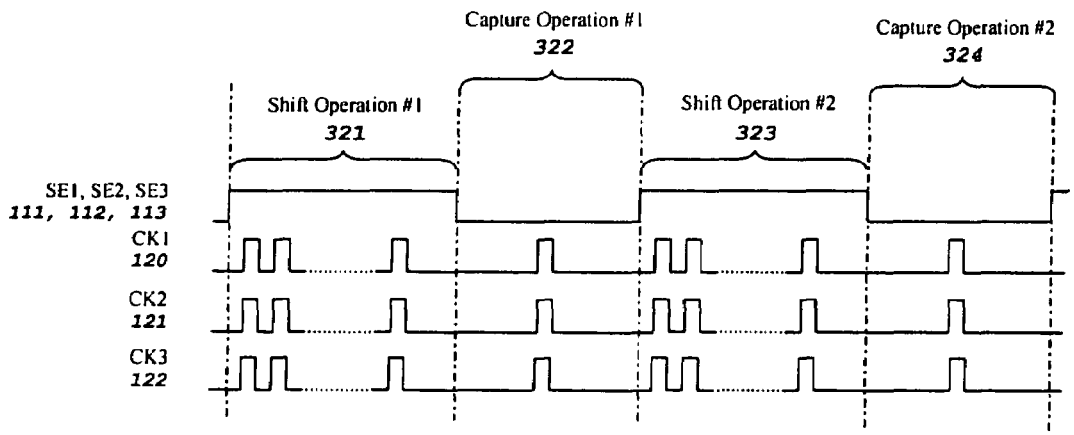
FIG. 3B shows the scan clock waveforms in ATPG (automatic test pattern generation) and fault simulation in order to detect or locate stuck-at faults, bridging faults, or IDDQ faults, with regard to prior-art solution #2.
Figure 3C:
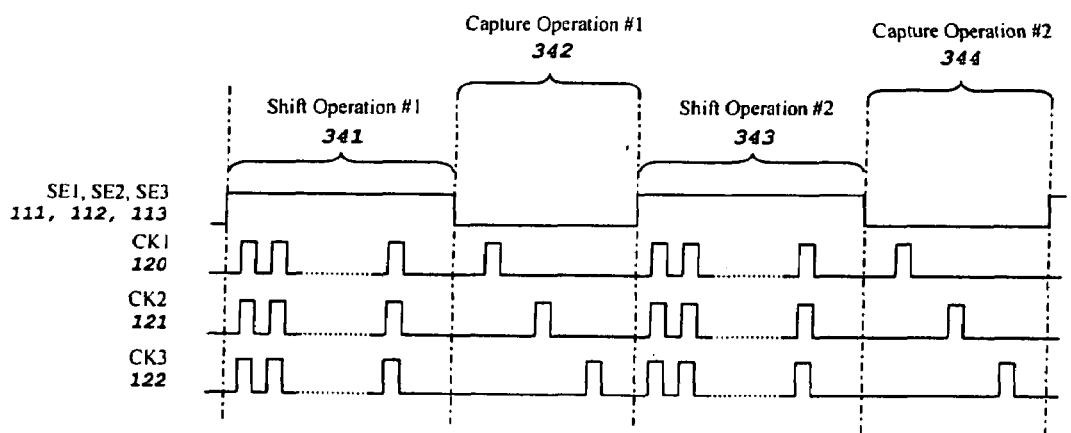
FIG. 3C shows the scan clock waveforms in actual test application in order to detect or locate stuck-at faults, bridging faults, or IDDQ faults, with regard to prior-art solution #2.

FIG. 3B shows the scan clock waveforms in ATPG (automatic test pattern generation) and fault simulation and FIG. 3C shows the scan clock waveforms in actual test application, both for detecting or locating stuck-at faults, bridging faults, or IDDQ faults (referred to as faults) and with regard to prior-art solution #2.

As shown in FIG. 3C, this solution requires that scan clocks, CK1 120 to CK3 122, be activated one by one in a selected order during each capture operation, and that the capture pulse delays between CK1 120 and CK2 121 and between CK2 121 and CK3 122 are larger than the possible corresponding clock skews. This will guarantee that the test responses captured during a capture operation are not affected by unpredictable clock skews.

Generally, if scan clocks are activated in this manner, the circuit behavior during a capture operation can only be fully represented by several copies of the corresponding combinational logic portion in the circuit, each with a different set of constraints on its inputs and outputs and each corresponding to a different timeframe, for the purpose of ATPG and fault simulation. This solution, however, only selects one copy of the combinational logic portion corresponding to the so-called PCE (primary capture event) and uses it for ATPG and fault simulation. Obviously, some constraints on the inputs and outputs of the selected copy have to be set to unknown (X) values since other related copies are discarded.

This solution only needs a combinational ATPG program when test patterns are to be generated deterministically. Its memory usage is also low since, in order to handle each capture operation, it is only necessary to keep one copy of the circuit model data. However, the fault coverage of this solution may be low since unknown values assigned as constraints may result in more undetected faults. Some techniques can be used to contain the impact of unknown values in fault coverage, but may result in a larger number of test patterns or longer CPU time.

Figure 4A:
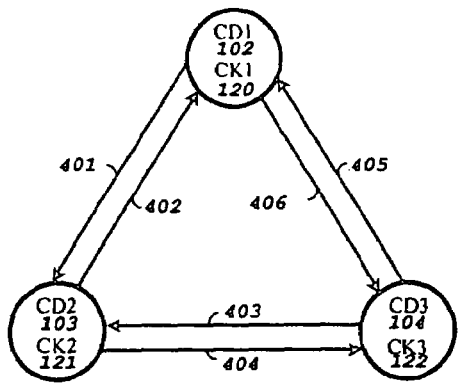
FIG. 4A shows the domain-interconnect graph used to represent the relationship among the clock domains shown in FIG. 1, with regard to prior-art solution #3.

FIG. 4A shows the domain-interconnect graph used to represent the relationship among the clock domains shown in FIG. 1, with regard to prior-art solution #3. The meanings of nodes and edges are the same as explained for FIG. 2A.

Figure 4B:
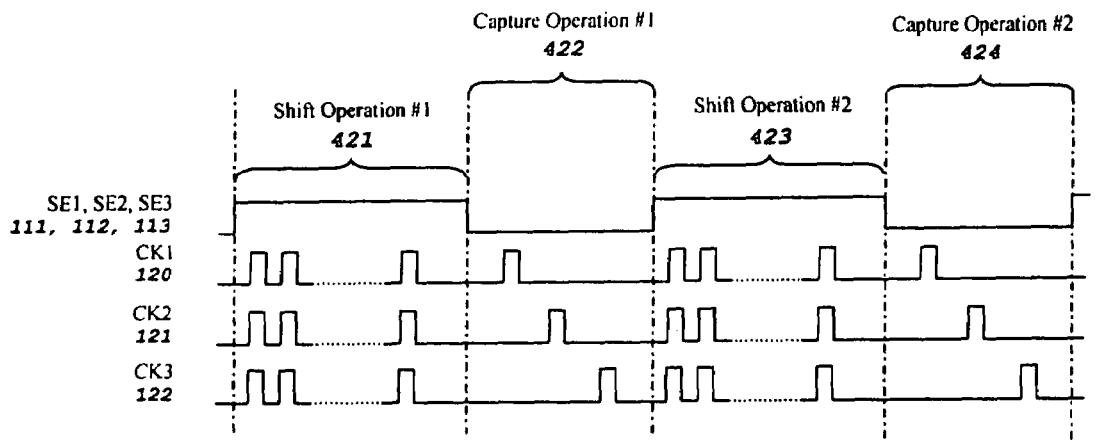
FIG. 4B shows the scan clock waveforms in ATPG (automatic test pattern generation) and fault simulation in order to detect or locate stuck-at faults, bridging faults, or IDDQ faults, with regard to prior-art solution #3.
Figure 4C:
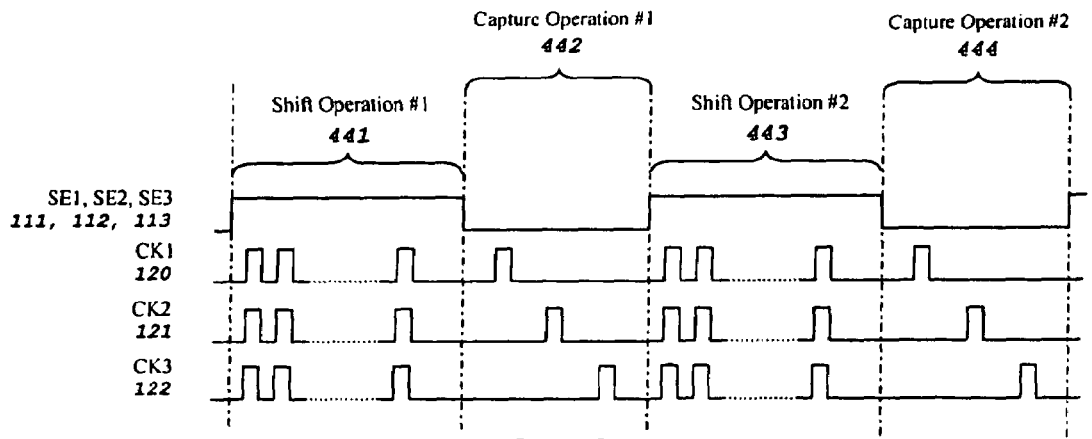
FIG. 4C shows the scan clock waveforms in actual test application in order to detect or locate stuck-at faults, bridging faults, or IDDQ faults, with regard to prior-art solution #3.

FIG. 4B shows the scan clock waveforms in ATPG (automatic test pattern generation) and fault simulation and FIG. 4C shows the scan clock waveforms in actual test application, both for detecting or locating stuck-at faults, bridging faults, or IDDQ faults (referred to as faults) and with regard to prior-art solution #3.

As shown in FIG. 4C, this solution requires that scan clocks, CK1 120 to CK3 122, be activated one by one in a selected order during each capture operation, and that the capture pulse delays between CK1 120 and CK2 121 and between CK2 121 and CK3 122 are larger than the possible corresponding clock skews. This will guarantee that the test responses captured during a capture operation are not affected by unpredictable clock skews.

Generally, if scan clocks are activated in this manner, the circuit behavior during a capture operation can only be fully represented by several copies of the corresponding combinational logic portion in the circuit, each with a different set of constraints on its inputs and outputs and each corresponding to a different timeframe, for the purpose of ATPG and fault simulation. This solution processes the multiple circuit model copies for different timeframes in a serial manner one by one.

When the scan clock CK1 120 is activated, all faults in the clock domain CD1 102 and the cross-clock domain blocks CCD21 106 and CCD31 110 can be targeted in ATPG and fault simulation, corresponding to test stimuli shifted-in through scan chains in three clock domains, CD1 102 to CD3 104. When the scan clock CK2 121 is activated, all faults in the clock domain CD2 103 and the cross-clock domain blocks CCD12 105 and CCD32 108 can be targeted in ATPG and fault simulation, corresponding to test stimuli shifted-in through scan chains in two clock domains, CD2 103 and CD3 104, as well as test responses captured by CK1 120. When the scan clock CK3 122 is activated, all faults in the clock domain CD3 104 and the cross-clock domain blocks CCD13 109 and CCD23 107 can be targeted in ATPG and fault simulation, corresponding to test stimuli shifted-in through scan chains in one clock domain, CD3 104, as well as test responses captured by CK1 120 and CK2 121.

This solution can target all faults in a whole circuit without the need of assigning any unknown values. As a result, it is possible to achieve high fault coverage. The number of test pattern is also smaller than that of prior-art solution #1 and prior-art solution #2 since a fault in any clock domain or any cross-clock domain block can be targeted in ATPG and fault simulation corresponding to any capture operation. However, a sequential ATPG program needs to be used with the capability of handling multiple timeframes. This will significantly increase CPU time and memory usage so that in practice, the number of timeframes may have to be limited to a rather smaller number than the number of scan clocks. Obviously, this limitation will compromise the usefulness of this solution.

Figure 5A:
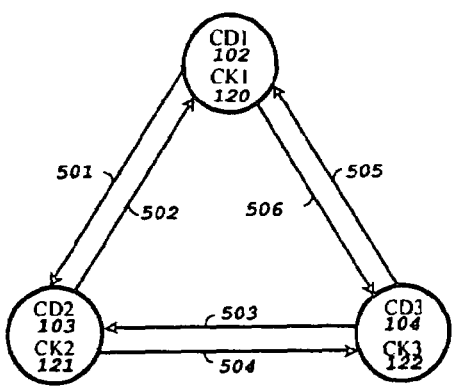
FIG. 5A shows the domain-interconnect graph used to represent the relationship among the clock domains shown in FIG. 1, with regard to prior-art solution #4.

FIG. 5A shows the domain-interconnect graph used to represent the relationship among the clock domains shown in FIG. 1, with regard to prior-art solution #4. The meanings of nodes and edges are the same as explained for FIG. 2A.

Figure 5B:
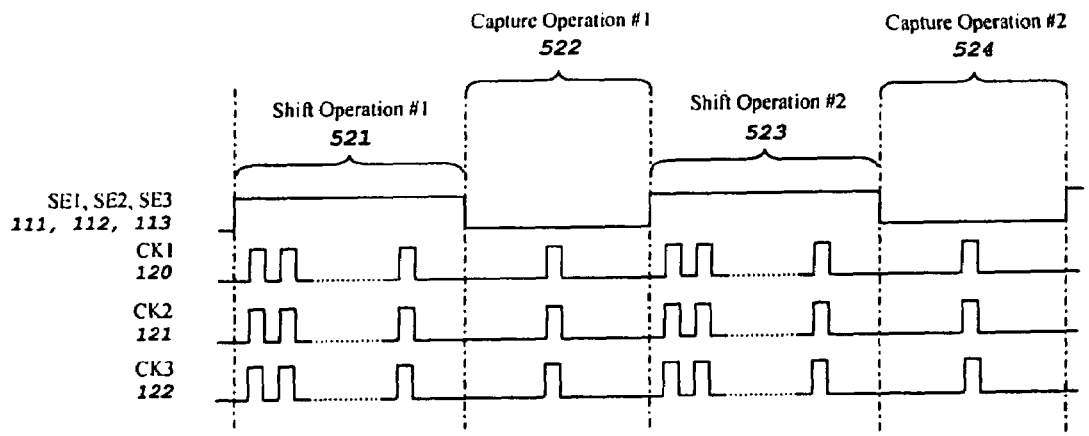
FIG. 5B shows the scan clock waveforms in ATPG (automatic test pattern generation) and fault simulation in order to detect or locate stuck-at faults, bridging faults, or IDDQ faults, with regard to prior-art solution #4.
Figure 5C:
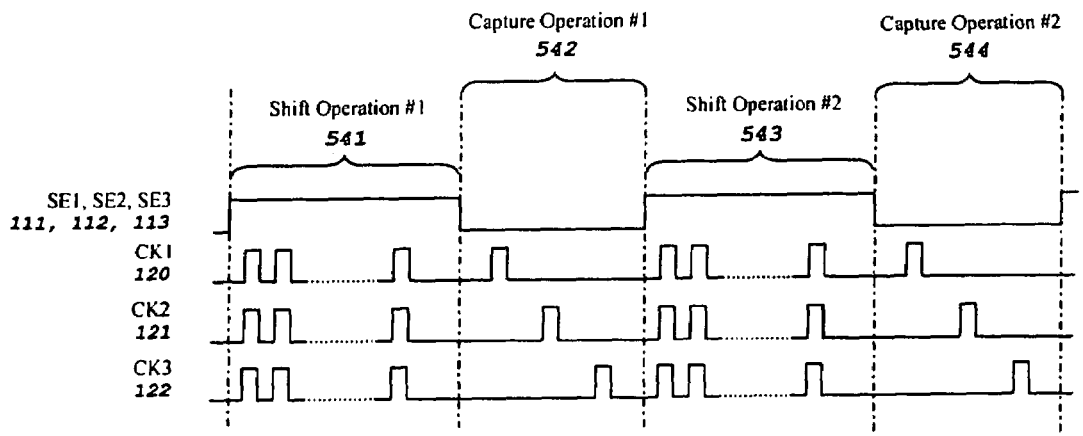
FIG. 5C shows the scan clock waveforms in actual test application in order to detect or locate stuck-at faults, bridging faults, or IDDQ faults, with regard to prior-art solution #4.

FIG. 5B shows the scan clock waveforms in ATPG (automatic test pattern generation) and fault simulation and FIG. 5C shows the scan clock waveforms in actual test application, both for detecting or locating stuck-at faults, bridging faults, or IDDQ faults (referred to as faults) and with regard to prior-art solution #4.

As shown in FIG. 5C, this solution requires that scan clocks, CK1 120 to CK3 122, be activated one by one in a selected order during each capture operation, and that the capture pulse delays between CK1 120 and CK2 121 and between CK2 121 and CK3 122 are larger than the possible corresponding clock skews. This will guarantee that the test responses captured during a capture operation are not affected by unpredictable clock skews.

Generally, if scan clocks are activated in this manner, the circuit behavior during a capture operation can only be fully represented by several copies of the corresponding combinational logic portion in the circuit, each with a different set of constraints on its inputs and outputs and each corresponding to a different timeframe, for the purpose of ATPG and fault simulation. This solution processes the multiple circuit model copies for different timeframes all at the same time by conducting circuit expansion to generate a complete set of data containing all the circuit model copies. That is, circuit expansion is a circuit modeling technique that uses multiple copies of a block to represent the different state of the block at different times. Note that circuit expansion needs to be conducted under a given order of capture clock pulses. In the example shown in FIG. 5B and FIG. 5C, the capture order is CK1 120→CK2 121→CK3 122. Different capture orders will result in different results of circuit expansion. Obviously, after circuit expansion, it is not necessary to handle scan clocks explicitly and ATPG and fault simulation can be complete conducted on a combinational circuit model.

This solution can use a combinational ATPG program when test patterns are to be generated deterministically. Fault coverage is high since all faults in a whole circuit can be targeted in ATPG and fault simulation. The CPU time is also less than that of prior-art solution #3 since the latter needs to use a sequential ATPG program. The number of test pattern is smaller than that of prior-art solution #1 and prior-art solution #2 since a fault in any clock domain or any cross-clock domain block can be targeted in ATPG and fault simulation corresponding to any capture operation. However, the memory usage may be high in some cases since multiple copies of the same block may be needed at the same time.

Figure 6A:
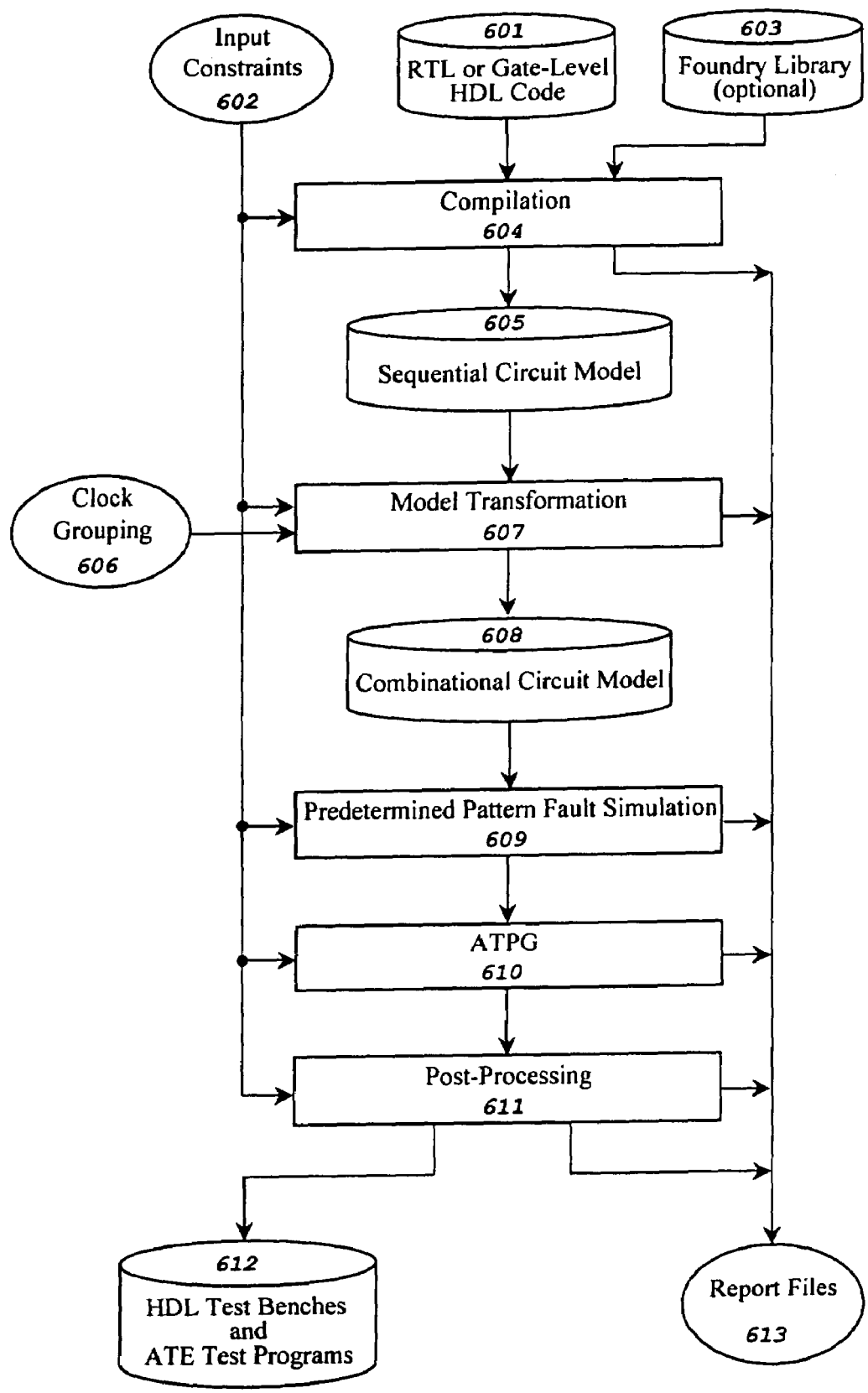
FIG. 6A shows a flow diagram of the method for ATPG (automatic test pattern generation) and fault simulation with clock grouping and circuit expansion in scan-test mode, in accordance with the present invention.

FIG. 6A shows a flow diagram of the method for ATPG (automatic test pattern generation) and fault simulation with clock grouping and circuit expansion in scan-test mode, in accordance with the present invention. The method accepts the user-supplied RTL (register-transfer level) or gate-level HDL (hardware design language) code 601 representing a scan-based integrated circuit design. In addition, input constraints 602 and an optional foundry library 603 are also provided. The input constraints 602 contain input constraint information on all clocks and scan enable (SE) signals. This method consists of compilation 604, model transformation 607, predetermined pattern fault simulation 609, ATPG 610, and post-processing 611. The compilation step 604 compiles the HDL code 601 into a sequential circuit model 605. The model transformation step 607 converts the sequential circuit model 605 into an equivalent combinational circuit model 608. Circuit expansion based on the clock grouping information 606 is also conducted at this step. The predetermined pattern fault simulation step 609 identifies the faults that are detected by a set of predetermined patterns. The ATPG step 610 generates test patterns for detecting faults. Finally, the post-processing step 611 generates HDL test benches and ATE (automatic test equipment) test programs 612. All reports and errors are stored in the report files 613.

Figure 6B:
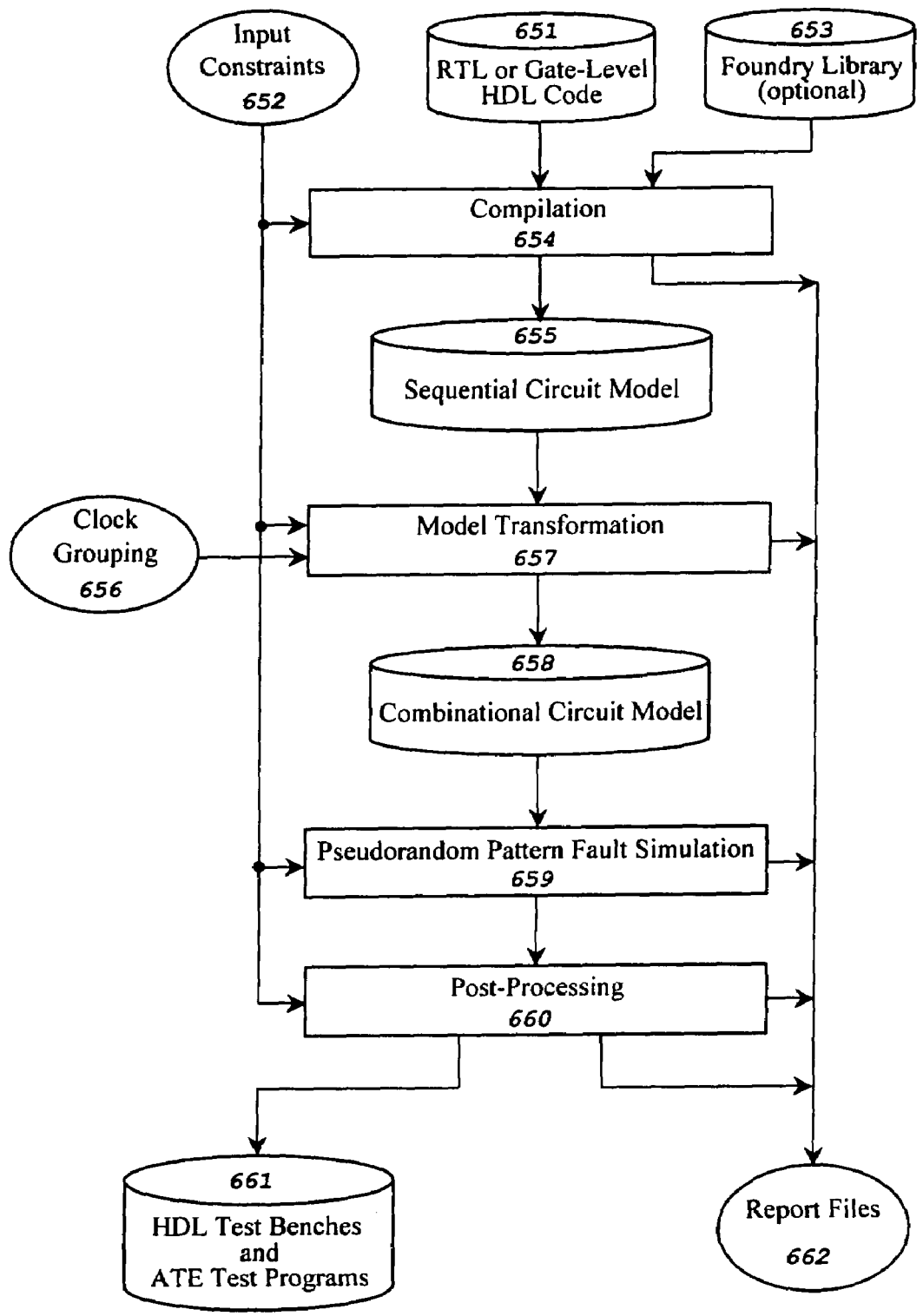
FIG. 6B shows a flow diagram of the method for fault simulation with clock grouping and circuit expansion in self-test mode, in accordance with the present invention.

FIG. 6B shows a flow diagram of the method for fault simulation with clock grouping and circuit expansion in self-test mode, in accordance with the present invention. The method accepts the user-supplied RTL (register-transfer level) or gate-level HDL (hardware design language) code 651 representing a scan-based integrated circuit design. In addition, input constraints 652 and an optional foundry library 653 are also provided. The input constraints 652 contain input constraint information on all clocks and scan enable (SE) signals. This method consists of compilation 654, model transformation 657, pseudo-random pattern fault simulation 659, and post-processing 660. The compilation step 654 compiles the HDL code 651 into a sequential circuit model 655. The model transformation step 657 converts the sequential circuit model 655 into an equivalent combinational circuit model 658. Circuit expansion based on the clock grouping information 656 is also conducted at this step. The pseudo-random pattern fault simulation step 659 identifies the faults that are detected by a set of pseudo-random patterns. Finally, the post-processing step 660 generates HDL test benches and ATE (automatic test equipment) test programs 661. All reports and errors are stored in the report files 662.

Figure 7A:
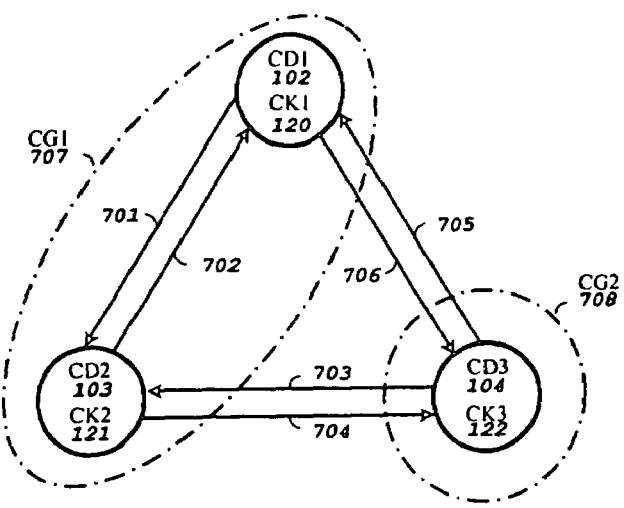
FIG. 7A shows the domain-interconnect graph used to represent the relationship among the clock domains shown in FIG. 1, with clock grouping in a first embodiment of the present invention.

FIG. 7A shows the domain-interconnect graph used to represent the relationship among the clock domains shown in FIG. 1, with clock grouping in a first embodiment of the present invention. 3 nodes are used to represent the 3 clock domains, CD1 102 to CD3 104. The corresponding scan clocks, CK1 120 to CK3 122, are also shown in the nodes for easy comprehension. The directed edge between two nodes represents a cross-clock domain block. For example, the edge 701 represents the cross-clock domain block CCD12 105 as shown in FIG. 1. In addition, there are two clock groups. One consists of two scan clocks, CK1 120 and CK2 121, as well as the corresponding clock domains, CD1 102 and CD2 103. The other consists of one scan clock CK3 122 and its corresponding clock domain, CD3 104.

Figure 7B:
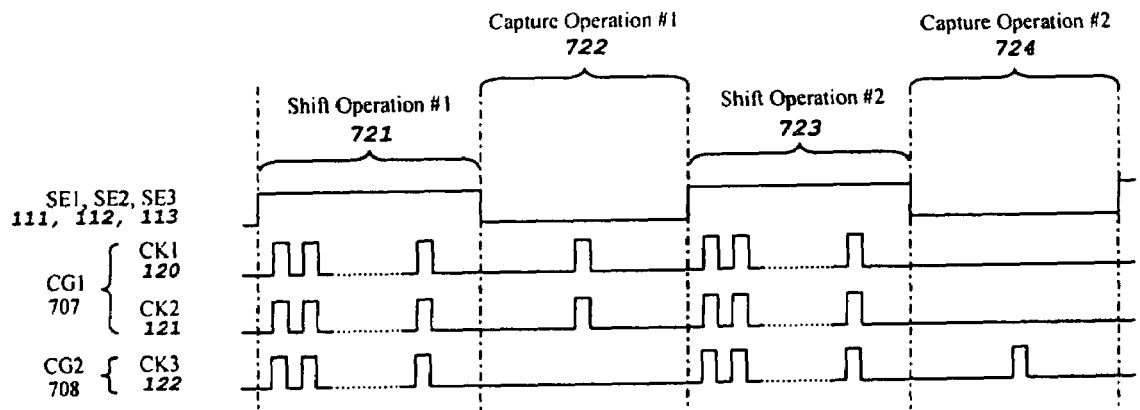
FIG. 7B shows the scan clock waveforms in ATPG (automatic test pattern generation) and fault simulation in order to detect or locate stuck-at faults, bridging faults, or IDDQ faults, with regard to clock grouping in a first embodiment of the present invention.
Figure 7C:
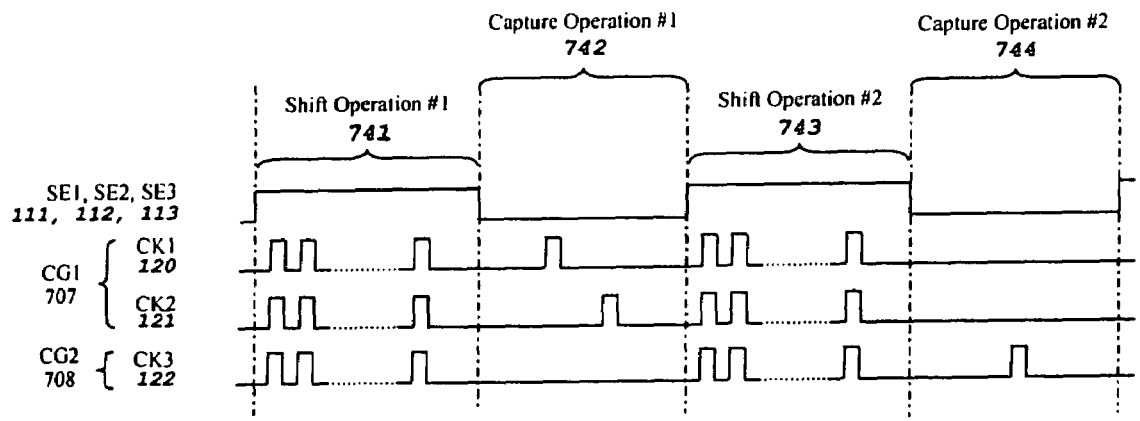
FIG. 7C shows the scan clock waveforms in actual test application in order to detect or locate stuck-at faults, bridging faults, or IDDQ faults, with regard to clock grouping in a first embodiment of the present invention.

FIG. 7B shows the scan clock waveforms in ATPG (automatic test pattern generation) and fault simulation and FIG. 7C shows the scan clock waveforms in actual test application, both for detecting or locating stuck-at faults, bridging faults, or IDDQ faults, (referred to as faults) with regard to clock grouping in a first embodiment of the present invention.

This embodiment requires that all scan clocks be grouped into a set of clock groups and that the scan clocks in only one clock group be activated during each capture operation. In addition, if a clock group contains multiple scan clocks, this embodiment requires that the scan clocks be activated one by one in a selected order and that the capture pulse delay between any scan clocks is larger than the possible corresponding clock skew. For example, FIG. 7A shows two scan clock groups, CG1 707={CK1 120, CK121} and CG2 708={CK3 122}, which capture in different capture operations. When clock group CG1 707 captures, a capture order of CK1 120→CK2 121 is used. That is, scan clocks CK1 120 and CK2 121 are allowed to capture one by one during a capture operation but the capture pulse delay between CK1 120 and CK2 121 should be larger than the possible corresponding clock skew.

Generally, if a clock group contains only one scan clock, the circuit behavior when the scan clock captures can be fully represented by only one copy of the corresponding combinational logic portion in the circuit. If a clock group contains multiple scan clocks, this embodiment conducts circuit expansion in order to represent the circuit behavior with only one set of circuit data. The reason why this is possible is that circuit expansion uses multiple copies of a logic block to represent the different state of the block at different times. In FIG. 7B, for example, circuit expansion is conducted for clock domains CD1 102 and CD2 103. Optionally, circuit expansion can also be conducted for cross-clock domain blocks between CD1 102 and CD2 103. During a capture operation where scan clocks CK1 120 and CK2 121 capture, all faults in clock domains CD1 102 and CD2 103 as well as cross-clock domain blocks between CD1 102 and CD2 103 can be targeted. During a capture operation where scan clock CK3 122 captures, all faults in clock domains CD3 104 as well as cross-clock domain blocks CCD13 109 and CCD23 107 can be targeted.

This embodiment of the present invention only needs a combinational ATPG program when test patterns are to be generated deterministically. In addition, this embodiment can alleviate the disadvantages of both prior-art solution #1 and prior-art solution #4. The number of test patterns will be smaller than that of prior-art solution #1 since any fault in clock domains CD1 102 and CD2 103 can be targeted during the same capture operation. The memory usage will be less than that of prior-art solution #4 since circuit expansion is only conducted for part of a circuit.

Figure 8A:
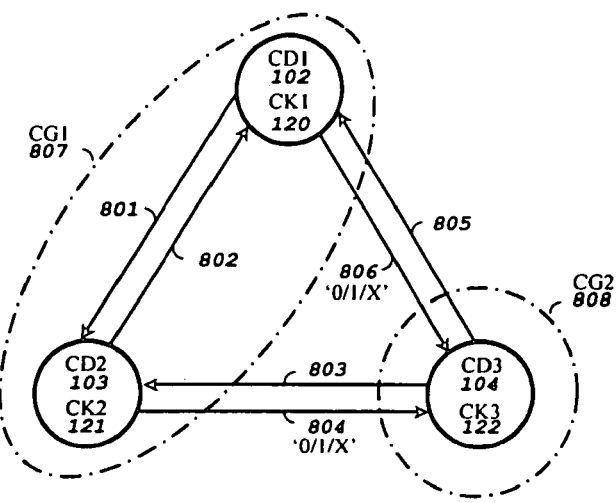
FIG. 8A shows the domain-interconnect graph used to represent the relationship among the clock domains shown in FIG. 1, with clock grouping in a second embodiment of the present invention.

FIG. 8A shows the domain-interconnect graph used to represent the relationship among the clock domains shown in FIG. 1, with clock grouping in a second embodiment of the present invention. The meanings of nodes, edges, and clock groups are the same as explained in FIG. 7A.

Figure 8B:
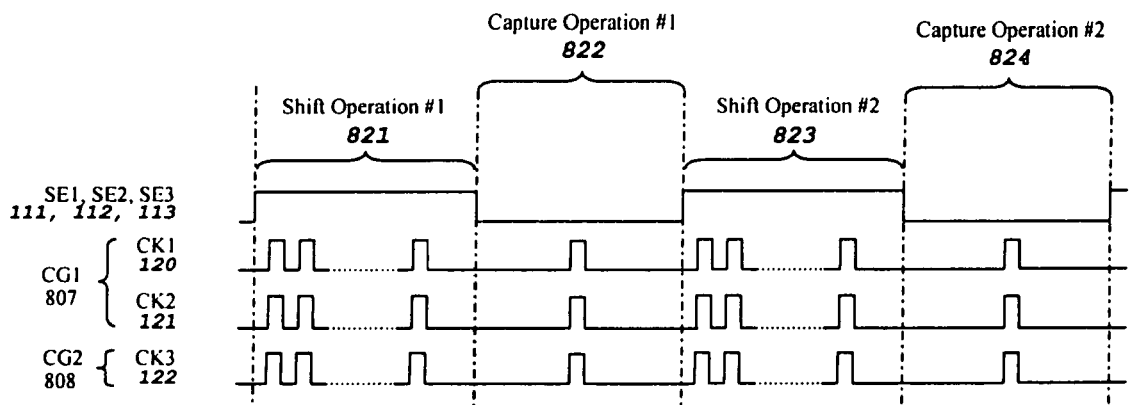
FIG. 8B shows the scan clock waveforms in ATPG (automatic test pattern generation) and fault simulation in order to detect or locate stuck-at faults, bridging faults, or IDDQ faults, with regard to clock grouping in a second embodiment of the present invention.
Figure 8C:
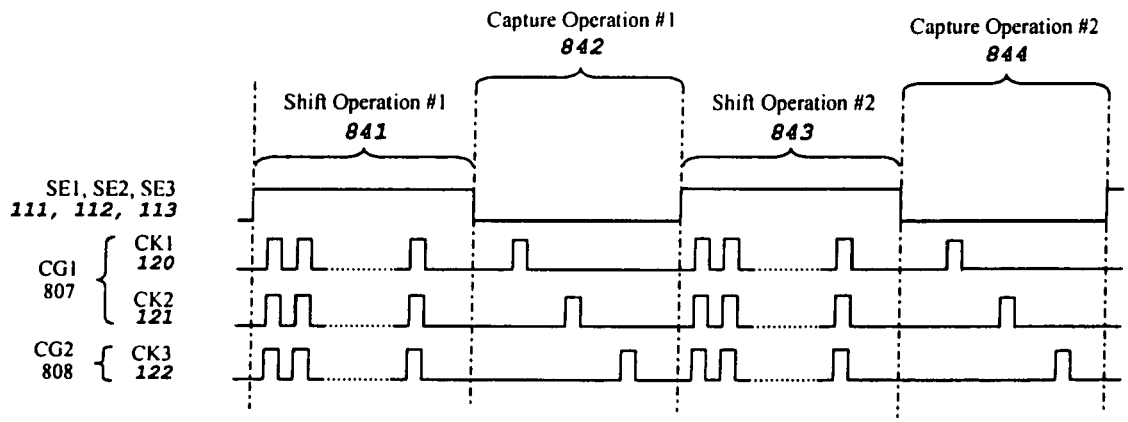
FIG. 8C shows the scan clock waveforms in actual test application in order to detect or locate stuck-at faults, bridging faults, or IDDQ faults, with regard to clock grouping in a second embodiment of the present invention.

FIG. 8B shows the scan clock waveforms in ATPG (automatic test pattern generation) and fault simulation and FIG. 8C shows the scan clock waveforms in actual test application, both for detecting or locating stuck-at faults, bridging faults, or IDDQ faults, (referred to as faults) with regard to clock grouping in a second embodiment of the present invention.

This embodiment requires that all scan clocks be grouped into a set of clock groups and that the clock groups be activated one by one in a selected order during each capture operation. In addition, the capture pulse delays between each clock group should be larger than the possible corresponding clock skew. Furthermore, if a clock group contains multiple scan clocks, this embodiment requires that the scan clocks are activated one by one in a selected order and that the capture pulse delay between any scan clocks is larger than the possible corresponding clock skew. For example, FIG. 8A shows two scan clock groups, CG1 807={CK1 120, CK121} and CG2 808={CK3 122}, which capture one by one during any capture operation. When clock group CG1 808 captures, a capture order of CK1 120→CK2 121 is used. That is, scan clocks CK1 120 and CK2 121 are allowed to capture one by one during a capture operation but the capture pulse delay between CK1 120 and CK2 121 should be larger than the possible corresponding clock skew.

Generally, if scan clocks are activated in this manner, the circuit behavior during a capture operation can only be fully represented by several copies of the corresponding combinational logic portion in the circuit, each with a different set of constraints on its inputs and outputs and each corresponding to a different timeframe, for the purpose of ATPG and fault simulation. This embodiment only selects one copy of the combinational logic portion. Obviously, some constraints on the inputs and outputs of the selected copy have to be set to unknown (X) values since other related copies are discarded. In addition, for those scan clocks in one clock group, this embodiment conducts circuit expansion in order to represent the corresponding circuit behavior with only one set of circuit data. The reason why this is possible is that circuit expansion uses multiple copies of a logic block to represent the different state of the block at different times. In FIG. 8B, for example, circuit expansion is conducted for clock domains CD1 102 and CD2 103. Optionally, circuit expansion can also be conducted for cross-clock domain blocks between CD1 102 and CD2 103. For example, in ATPG and fault simulation for the clock domains CD1 102 and CD2 103, it is necessary to assign unknown values to the signal lines coming from CCD31 110 and CCD32 108. However, only one expanded copy of the clock domains CD1 102 and CD2 103 is used. This way, the ATPG results are guaranteed to be accurate even clock skews may exist between different clock domains.

This embodiment of the present invention only needs a combinational ATPG program when test patterns are to be generated deterministically. In addition, this embodiment can alleviate the disadvantages of both prior-art solution #2 and prior-art solution #4. The fault coverage of this embodiment will be higher than that of prior-art solution #2 since a smaller number of unknown values are assigned. The memory usage will be less than that of prior-art solution #4 since circuit expansion is only conducted for part of a circuit.

Figure 9A:
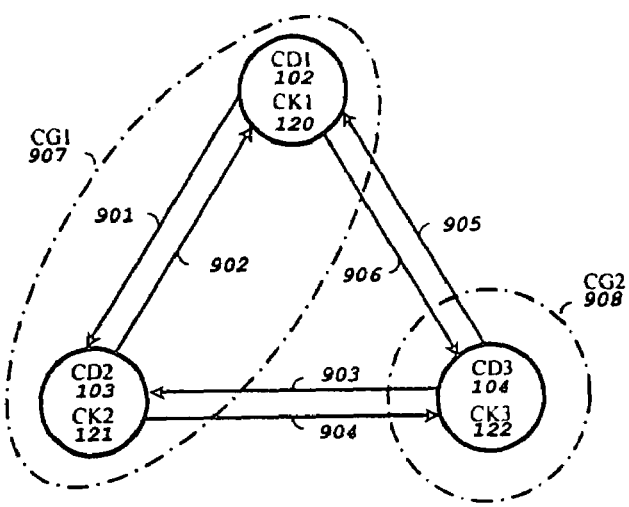
FIG. 9A shows the domain-interconnect graph used to represent the relationship among the clock domains shown in FIG. 1, with clock grouping in a third embodiment of the present invention.

FIG. 9A shows the domain-interconnect graph used to represent the relationship among the clock domains shown in FIG. 1, with clock grouping in a third embodiment of the present invention. The meanings of nodes, edges, and clock groups are the same as explained in FIG. 7A.

Figure 9B:
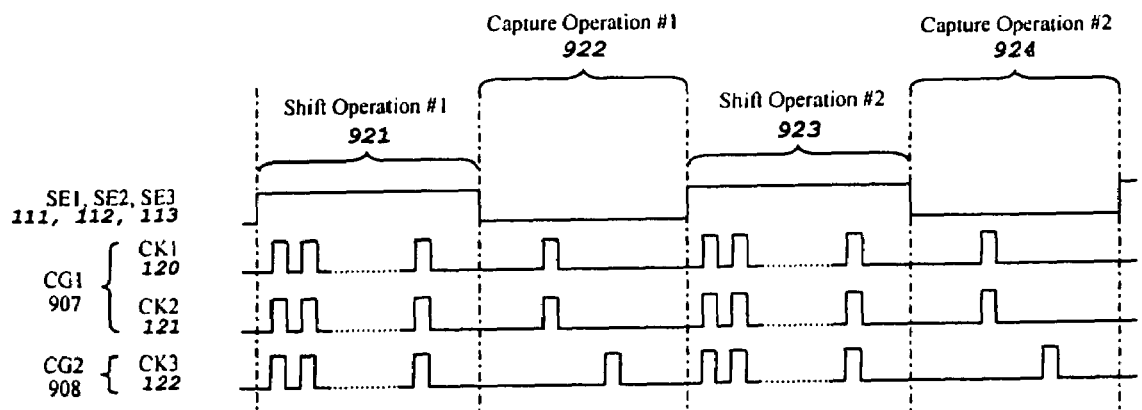
FIG. 9B shows the scan clock waveforms in ATPG (automatic test pattern generation) and fault simulation in order to detect or locate stuck-at faults, bridging faults, or IDDQ faults, with regard to clock grouping in a third embodiment of the present invention.
Figure 9C:
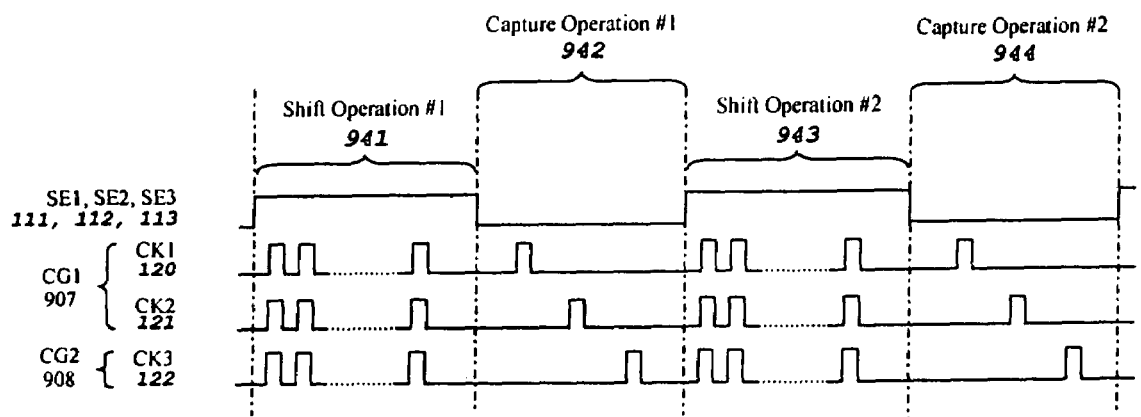
FIG. 9C shows the scan clock waveforms in actual test application in order to detect or locate stuck-at faults, bridging faults, or IDDQ faults, with regard to clock grouping in a third embodiment of the present invention.

FIG. 9B shows the scan clock waveforms in ATPG (automatic test pattern generation) and fault simulation and FIG. 9C shows the scan clock waveforms in actual test application, both for detecting or locating stuck-at faults, bridging faults, or IDDQ faults, (referred to as faults) with regard to clock grouping in a third embodiment of the present invention.

This embodiment requires that all scan clocks be grouped into a set of clock groups and that the clock groups be activated one by one in a selected order during each capture operation. In addition, the capture pulse delays between each clock group should be larger than the possible corresponding clock skew. Furthermore, if a clock group contains multiple scan clocks, this embodiment requires that the scan clocks are activated one by one in a selected order and that the capture pulse delay between any scan clocks is larger than the possible corresponding clock skew. For example, FIG. 9A shows two scan clock groups, CG1 907={CK1 120, CK121} and CG2 908={CK3 122}, which capture one by one during any capture operation. When clock group CG1 908 captures, a capture order of CK1 120→CK2 121 is assumed. That is, scan clocks CK1 120 and CK2 121 are allowed to capture one by one during a capture operation but the capture pulse delay between CK1 120 and CK2 121 should be larger than the possible corresponding clock skew.

Generally, if scan clocks are activated in this manner, the circuit behavior during a capture operation can only be fully represented by several copies of the corresponding combinational logic portion in the circuit, each with a different set of constraints on its inputs and outputs and each corresponding to a different timeframe, for the purpose of ATPG and fault simulation. This embodiment processes the multiple circuit model copies for different timeframes in a series manner one by one. In addition, for those scan clocks in one clock group, this embodiment conducts circuit expansion in order to represent the corresponding circuit behavior with only one set of circuit data. The reason why this is possible is that circuit expansion uses multiple copies of a logic block to represent the different state of the block at different times. In FIG. 9B, for example, circuit expansion is conducted for clock domains CD1 102 and CD2 103. Optionally, circuit expansion can also be conducted for cross-clock domain blocks between CD1 102 and CD2 103.

When scan clocks CK1 120 and CK2 121 are activated one by one, all stuck-at faults in the clock domains CD1 102 and CD2 103, as well as the cross-clock domain blocks CCD12 105 and CCD21 106, can be targeted in the same run of ATPG and fault simulation, corresponding to test stimuli shifted-in through scan chains in three clock domains, CD1 102 to CD3 104. When the scan clock CK3 122 is activated, all stuck-at fault in the clock domain CD3 104 and the cross-clock domain blocks CCD13 109 and CCD23 107 can be targeted in ATPG and fault simulation, corresponding to test stimuli shifted-in through scan chains in two clock domains, CD2 103 and CD3 104, as well as test responses captured by CK1 120 and CK2 121.

This embodiment of the present invention can alleviate the disadvantages of both prior-art solution #3 and prior-art solution #4. A sequential ATPG program needs to be used but with fewer timeframes. This will result in less CPU time and memory usage than prior-art solution #3. The memory usage will be less than that of prior-art solution #4 since circuit expansion is only conducted for part of a circuit.

Figure 10A:
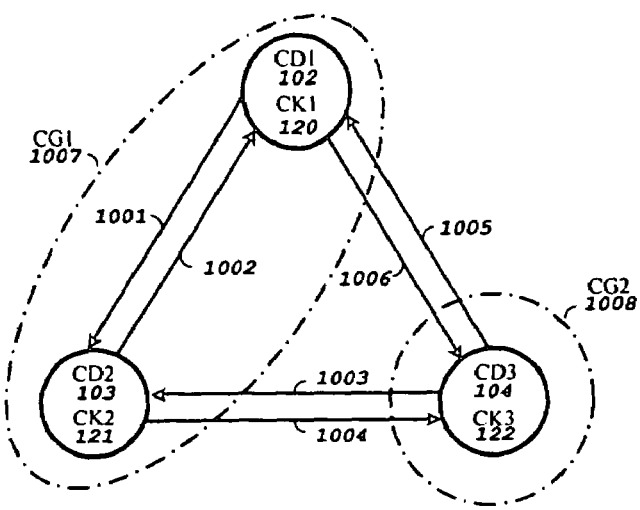
FIG. 10A shows the domain-interconnect graph used to represent the relationship among the clock domains shown in FIG. 1, with clock grouping in a fourth embodiment of the present invention.

FIG. 10A shows the domain-interconnect graph used to represent the relationship among the clock domains shown in FIG. 1, with clock grouping in a fourth embodiment of the present invention. The meanings of nodes, edges, and clock groups are the same as explained in FIG. 7A.

Figure 10B:
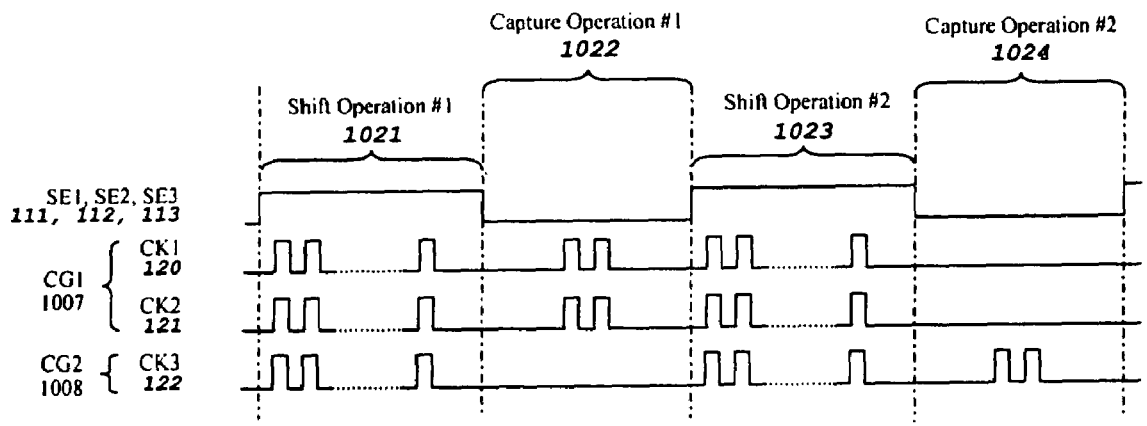
FIG. 10B shows the scan clock waveforms in ATPG (automatic test pattern generation) and fault simulation in order to detect or locate transition faults or path-delay faults launched from capture, with regard to clock grouping in a fourth embodiment of the present invention.
Figure 10C:
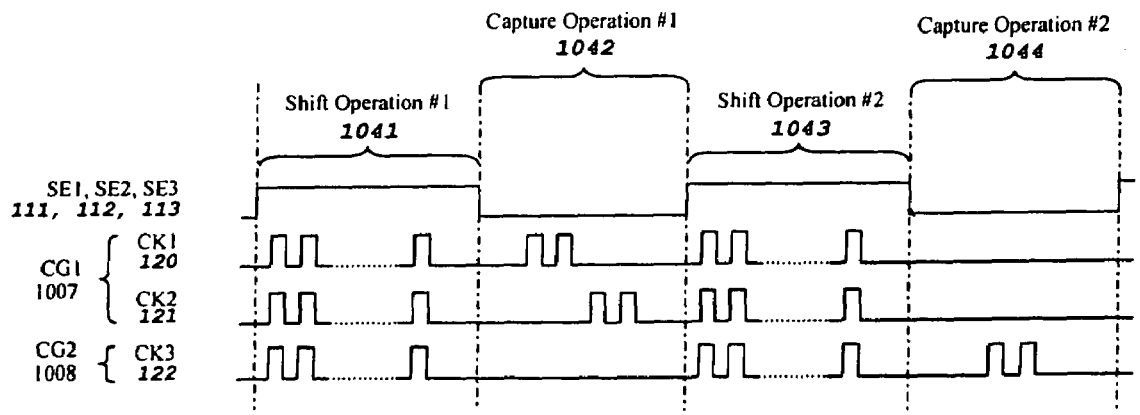
FIG. 10C shows the scan clock waveforms in actual test application in order to detect or locate transition faults or path-delay faults launched from capture, with regard to clock grouping in a fourth embodiment of the present invention.

FIG. 10B shows the scan clock waveforms in ATPG (automatic test pattern generation) and fault simulation and FIG. 10C shows the scan clock waveforms in actual test application, both for detecting or locating transition faults or path-delay faults launched from capture, with regard to clock grouping in a fourth embodiment of the present invention. This embodiment is basically the same as the embodiment shown in FIG. 7. The only difference is that this embodiment uses two at-speed pulses for each capture. This allows this embodiment to detect or locate transition faults or path-delay faults launched from capture. Refer to the descriptions of FIG. 7 for more details.

Figure 11A:
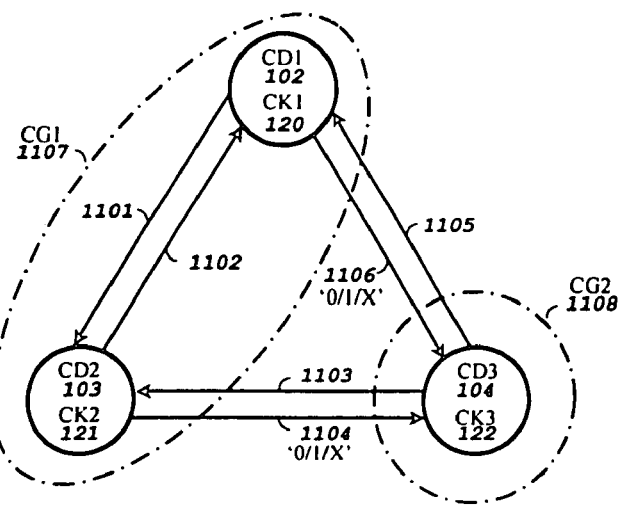
FIG. 11A shows the domain-interconnect graph used to represent the relationship among the clock domains shown in FIG. 1, with clock grouping in a fifth embodiment of the present invention.

FIG. 11A shows the domain-interconnect graph used to represent the relationship among the clock domains shown in FIG. 1, with clock grouping in a fifth embodiment of the present invention. The meanings of nodes, edges, and clock groups are the same as explained in FIG. 7A.

Figure 11B:
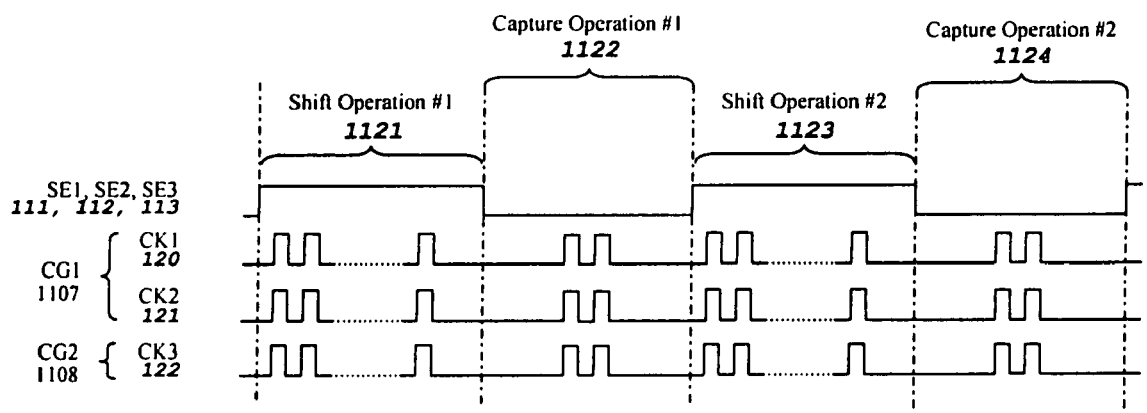
FIG. 11B shows the scan clock waveforms in ATPG (automatic test pattern generation) and fault simulation in order to detect or locate transition faults or path-delay faults launched from capture, with regard to clock grouping in a fifth embodiment of the present invention.
Figure 11C:
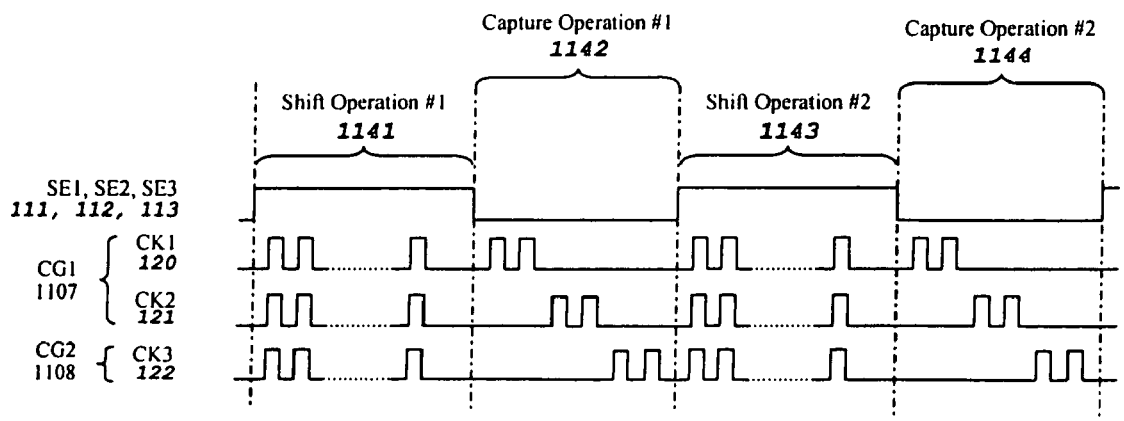
FIG. 11C shows the scan clock waveforms in actual test application in order to detect or locate transition faults or path-delay faults launched from capture, with regard to clock grouping in a fifth embodiment of the present invention.

FIG. 11B shows the scan clock waveforms in ATPG (automatic test pattern generation) and fault simulation and FIG. 11C shows the scan clock waveforms in actual test application, both for detecting or locating transition faults or path-delay faults launched from capture, with regard to clock grouping in a fifth embodiment of the present invention. This embodiment is basically the same as the embodiment shown in FIG. 8. The only difference is that this embodiment uses two at-speed pulses for each capture. This allows this embodiment to detect or locate transition faults or path-delay faults launched from capture. Refer to the descriptions of FIG. 8 for more details.

Figure 12A:
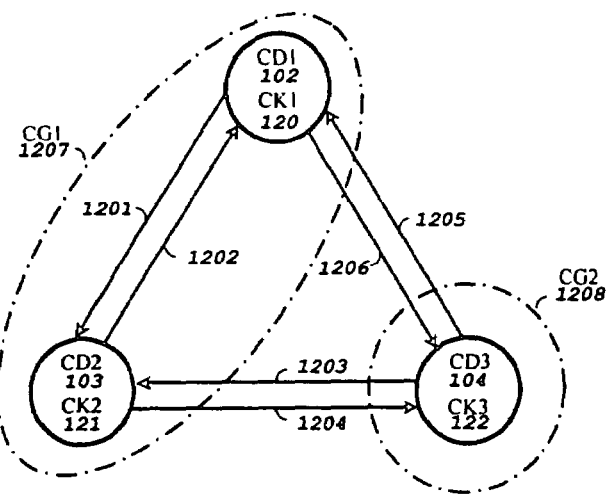
FIG. 12A shows the domain-interconnect graph used to represent the relationship among the clock domains shown in FIG. 1, with clock grouping in a sixth embodiment of the present invention.

FIG. 12A shows the domain-interconnect graph used to represent the relationship among the clock domains shown in FIG. 1, with clock grouping in a sixth embodiment of the present invention. The meanings of nodes, edges, and clock groups are the same as explained in FIG. 7A.

Figure 12B:
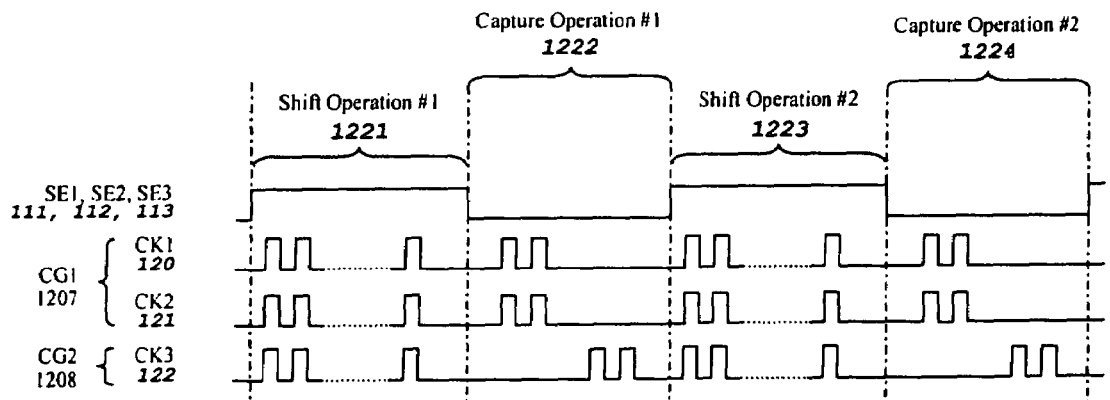
FIG. 12B shows the scan clock waveforms in ATPG (automatic test pattern generation) and fault simulation in order to detect or locate transition faults or path-delay faults launched from capture, with regard to clock grouping in a sixth embodiment of the present invention.
Figure 12C:
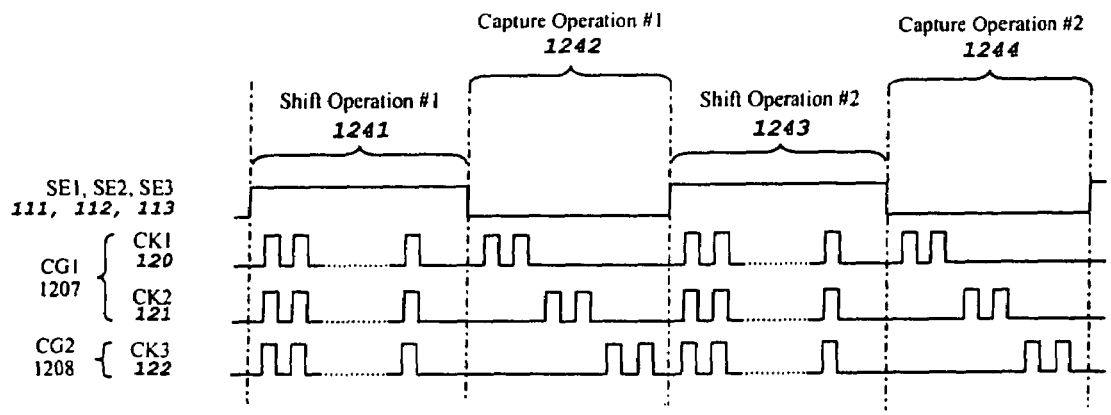
FIG. 12C shows the scan clock waveforms in actual test application in order to detect or locate transition faults or path-delay faults launched from capture, with regard to clock grouping in a sixth embodiment of the present invention.

FIG. 12B shows the scan clock waveforms in ATPG (automatic test pattern generation) and fault simulation and FIG. 12C shows the scan clock waveforms in actual test application, both for detecting or locating transition faults or path-delay faults launched from capture, with regard to clock grouping in a sixth embodiment of the present invention. This embodiment is basically the same as the embodiment shown in FIG. 9. The only difference is that this embodiment uses two at-speed pulses for each capture. This allows this embodiment to detect or locate transition faults or path-delay faults launched from capture. Refer to the descriptions of FIG. 9 for more details.

Figure 13A:
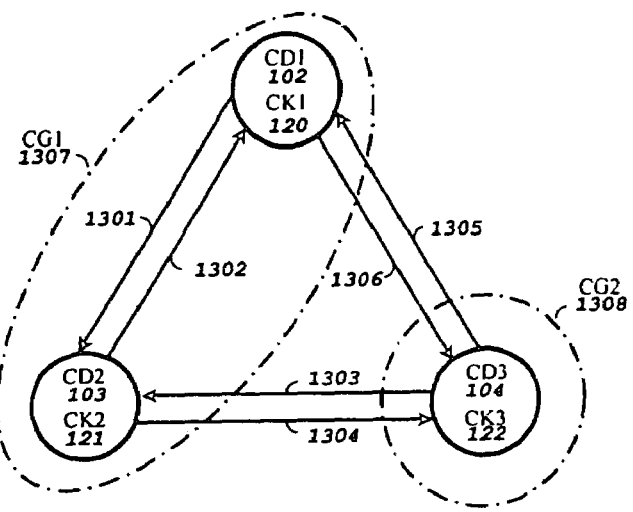
FIG. 13A shows the domain-interconnect graph used to represent the relationship among the clock domains shown in FIG. 1, with clock grouping in a seventh embodiment of the present invention.

FIG. 13A shows the domain-interconnect graph used to represent the relationship among the clock domains shown in FIG. 1, with clock grouping in a seventh embodiment of the present invention. The meanings of nodes, edges, and clock groups are the same as explained in FIG. 7A.

Figure 13B:
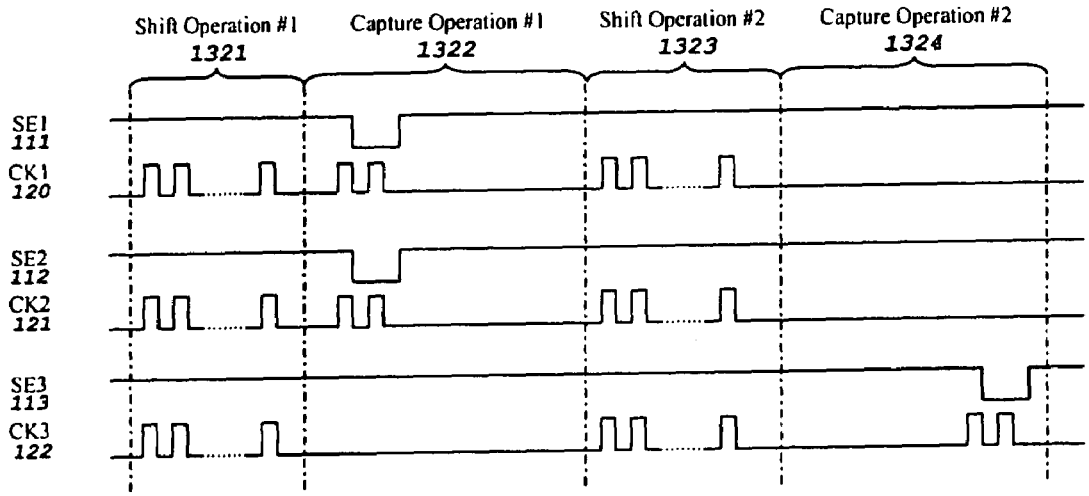
FIG. 13B shows the scan clock waveforms in ATPG (automatic test pattern generation) and fault simulation in order to detect or locate transition faults or path-delay faults launched from shift, with regard to clock grouping in a seventh embodiment of the present invention.
Figure 13C:
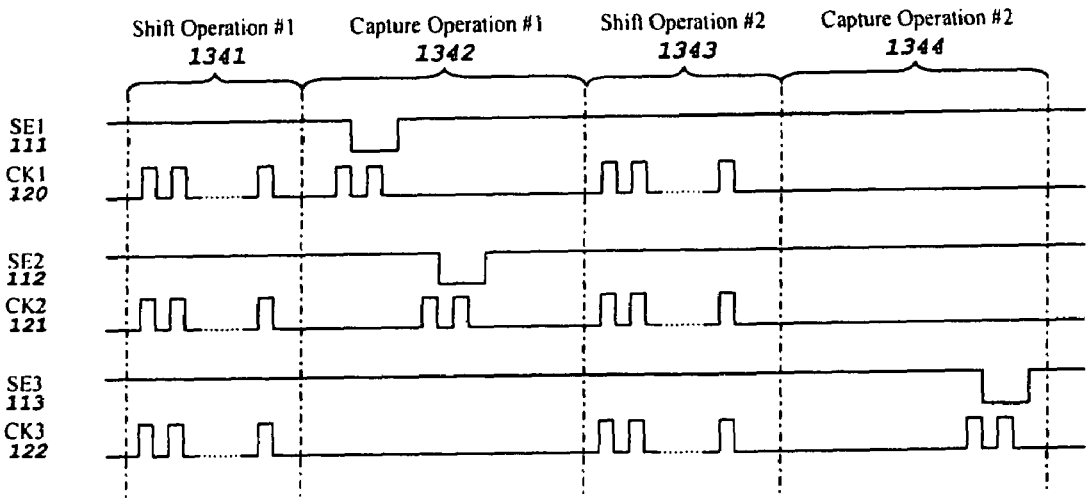
FIG. 13C shows the scan clock waveforms in actual test application in order to detect or locate transition faults or path-delay faults launched from shift, with regard to clock grouping in a seventh embodiment of the present invention.

FIG. 13B shows the scan clock waveforms in ATPG (automatic test pattern generation) and fault simulation and FIG. 13C shows the scan clock waveforms in actual test application, both for detecting or locating transition faults or path-delay faults launched from shift with regard to clock grouping in a seventh embodiment of the present invention. This embodiment is basically the same as the embodiment shown in FIG. 7. The only difference is that this embodiment uses one at-speed pulse for each capture. This allows this embodiment to detect or locate transition faults or path-delay faults launched from shift. Refer to the descriptions of FIG. 7 for more details.

Figure 14A:
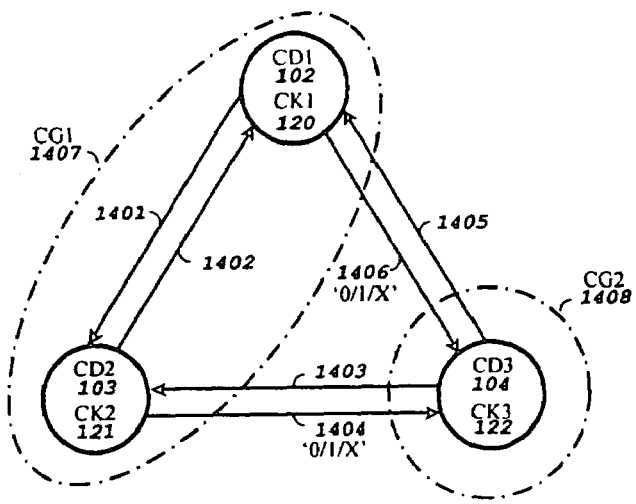
FIG. 14A shows the domain-interconnect graph used to represent the relationship among the clock domains shown in FIG. 1, with clock grouping in an eighth embodiment of the present invention.

FIG. 14A shows the domain-interconnect graph used to represent the relationship among the clock domains shown in FIG. 1, with clock grouping in an eighth embodiment of the present invention. The meanings of nodes, edges, and clock groups are the same as explained in FIG. 7A.

Figure 14B:
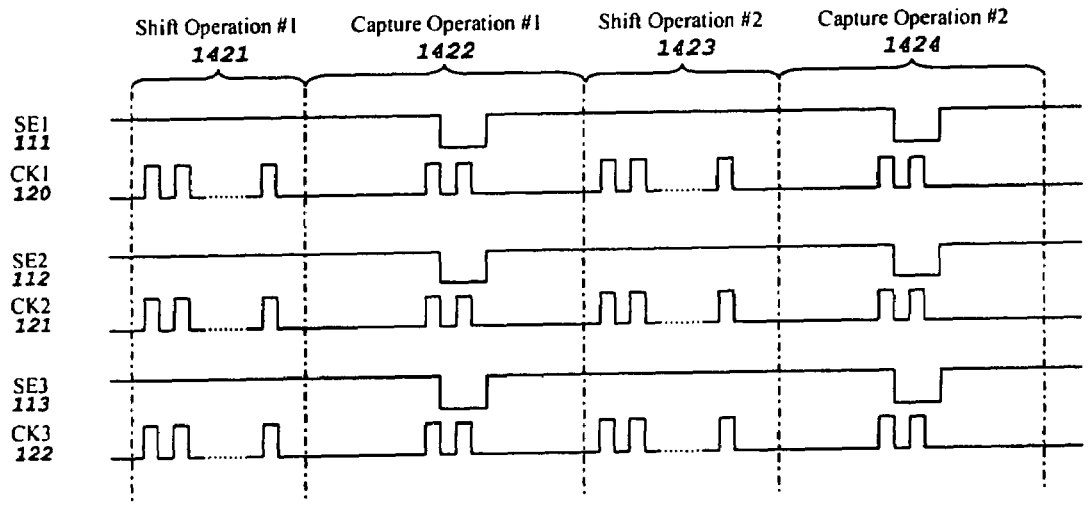
FIG. 14B shows the scan clock waveforms in ATPG (automatic test pattern generation) and fault simulation in order to detect or locate transition faults or path-delay faults launched from shift, with regard to clock grouping in an eighth embodiment of the present invention.
Figure 14C:
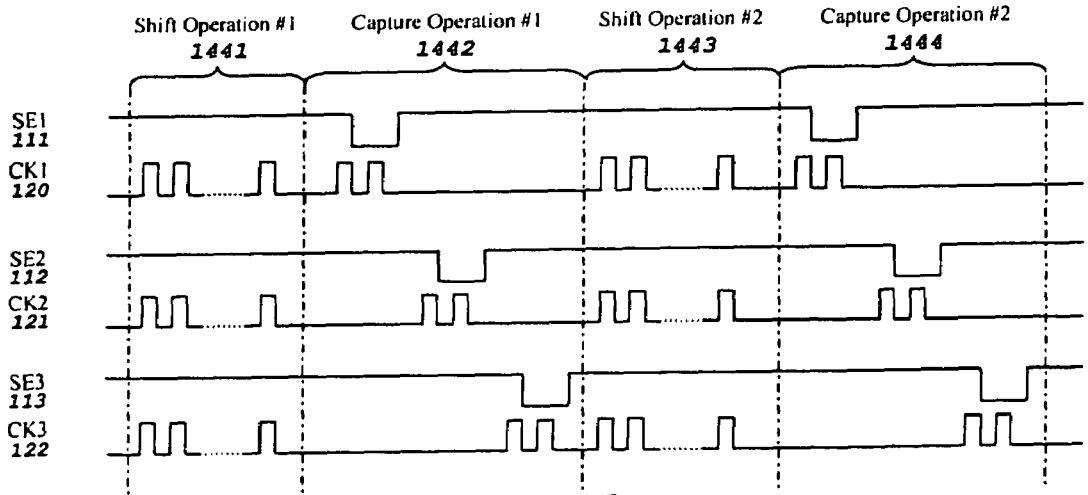
FIG. 14C shows the scan clock waveforms in actual test application in order to detect or locate transition faults or path-delay faults launched from shift, with regard to clock grouping in an eighth embodiment of the present invention.

FIG. 14B shows the scan clock waveforms in ATPG (automatic test pattern generation) and fault simulation and FIG. 14C shows the scan clock waveforms in actual test application, both for detecting or locating transition faults or path-delay faults launched from shift, with regard to clock grouping in an eighth embodiment of the present invention. This embodiment is basically the same as the embodiment shown in FIG. 8. The only difference is that this embodiment uses one at-speed pulse for each capture. This allows this embodiment to detect or locate transition faults or path-delay faults launched from shift. Refer to the descriptions of FIG. 8 for more details.

Figure 15A:
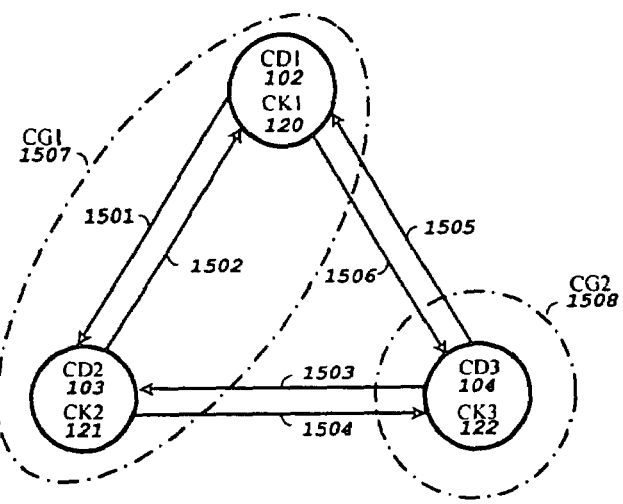
FIG. 15A shows the domain-interconnect graph used to represent the relationship among the clock domains shown in FIG. 1, with clock grouping in a ninth embodiment of the present invention.

FIG. 15A shows the domain-interconnect graph used to represent the relationship among the clock domains shown in FIG. 1, with clock grouping in a ninth embodiment of the present invention. The meanings of nodes, edges, and clock groups are the same as explained in FIG. 7A.

Figure 15B:
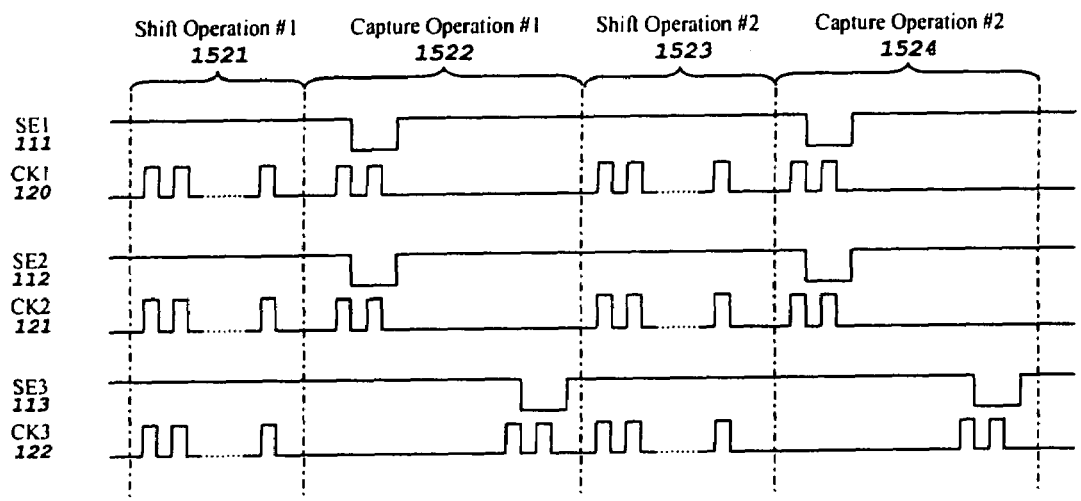
FIG. 15B shows the scan clock waveforms in ATPG (automatic test pattern generation) and fault simulation in order to detect or locate transition faults or path-delay faults launched from shift, with regard to clock grouping in a ninth embodiment of the present invention.
Figure 15C:
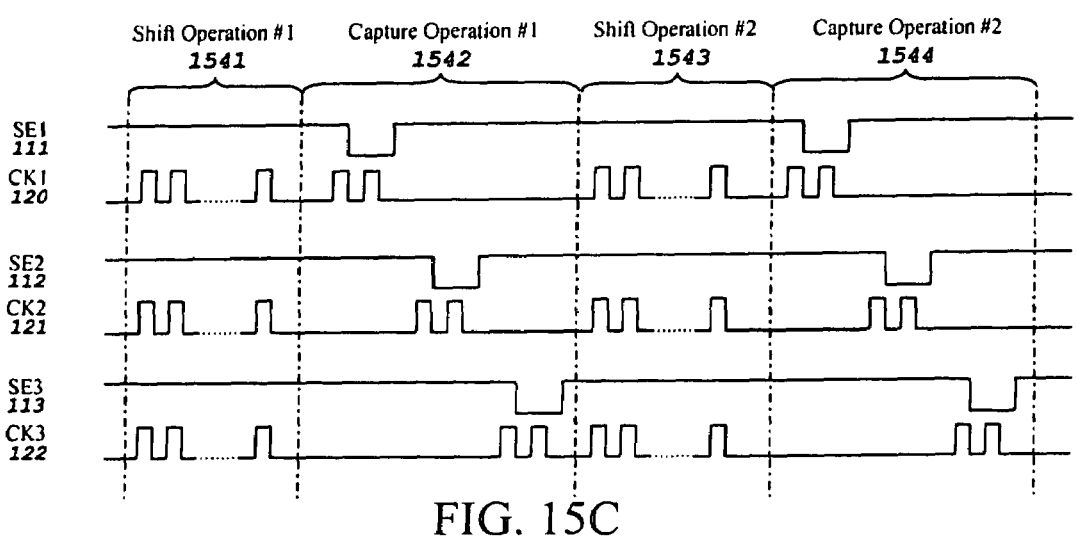
FIG. 15C shows the scan clock waveforms in actual test application in order to detect or locate transition faults or path-delay faults launched from shift, with regard to clock grouping in a ninth embodiment of the present invention.

FIG. 15B shows the scan clock waveforms in ATPG (automatic test pattern generation) and fault simulation and FIG. 15C shows the scan clock waveforms in actual test application, both for detecting or locating transition faults or path-delay faults launched from shift, with regard to clock grouping in a ninth embodiment of the present invention. This embodiment is basically the same as the embodiment shown in FIG. 9. The only difference is that this embodiment uses one at-speed pulse for each capture. This allows this embodiment to detect or locate transition faults or path-delay faults launched from shift. Refer to the descriptions of FIG. 9 for more details.

Figure 16A:
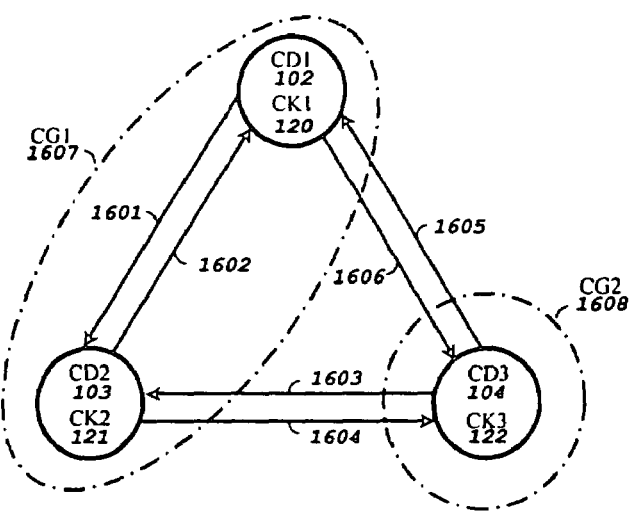
FIG. 16A shows the domain-interconnect graph used to represent the relationship among the clock domains shown in FIG. 1, with clock grouping in a tenth embodiment of the present invention.

FIG. 16A shows the domain-interconnect graph used to represent the relationship among the clock domains shown in FIG. 1, with clock grouping in a tenth embodiment of the present invention. The meanings of nodes, edges, and clock groups are the same as explained in FIG. 7A.

Figure 16B:
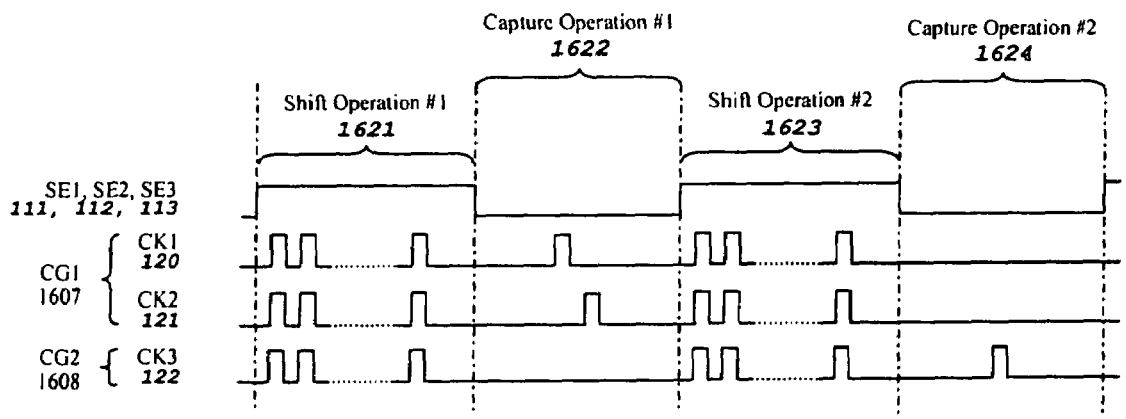
FIG. 16B shows the scan clock waveforms in ATPG (automatic test pattern generation) and fault simulation in order to detect or locate stuck-at faults, bridging faults, or IDDQ faults, with regard to clock grouping in a tenth embodiment of the present invention.
Figure 16C:
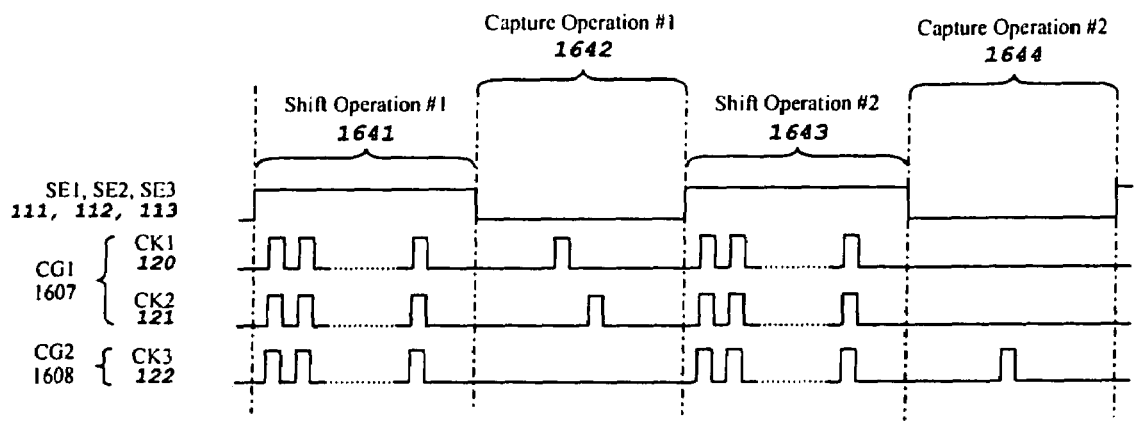
FIG. 16C shows the scan clock waveforms in actual test application in order to detect or locate stuck-at faults, bridging faults, or IDDQ faults, with regard to clock grouping in a tenth embodiment of the present invention.

FIG. 16B shows the scan clock waveforms in ATPG (automatic test pattern generation) and fault simulation and FIG. 16C shows the scan clock waveforms in actual test application, both for detecting or locating stuck-at faults, bridging faults, or IDDQ faults, with regard to clock grouping in a tenth embodiment of the present invention.

This embodiment requires that all scan clocks be grouped into a set of clock groups and that the scan clocks in only one clock group be activated during each capture operation. In addition, if a clock group contains multiple scan clocks, this embodiment requires that the scan clocks be activated one by one in a selected order and that the capture pulse delay between any scan clocks is larger than the possible corresponding clock skew.

Generally, if a clock group contains only one scan clock, the circuit behavior when the scan clock captures can be fully represented by only one copy of the corresponding combinational logic portion in the circuit. If a clock group contains multiple scan clocks that are activated one by one in a selected order, the circuit behavior during a capture operation can only be fully represented by several copies of the corresponding combinational logic portion in the circuit, each with a different set of constraints on its inputs and outputs and each corresponding to a different timeframe, for the purpose of ATPG and fault simulation. This embodiment processes the multiple circuit model copies for different timeframes in a serial manner one by one.

This embodiment of the present invention only needs a sequential ATPG program when test patterns are to be generated deterministically. In addition, this embodiment can alleviate the disadvantage of prior-art solution #3 by reducing CPU time and memory usage.

Figure 17A:
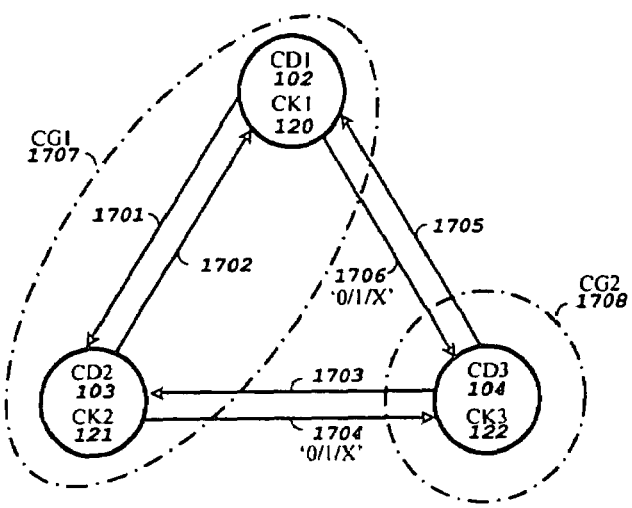
FIG. 17A shows the domain-interconnect graph used to represent the relationship among the clock domains shown in FIG. 1, with clock grouping in an eleventh embodiment of the present invention.

FIG. 17A shows the domain-interconnect graph used to represent the relationship among the clock domains shown in FIG. 1, with clock grouping in an eleventh embodiment of the present invention. The meanings of nodes, edges, and clock groups are the same as explained in FIG. 7A.

Figure 17B:
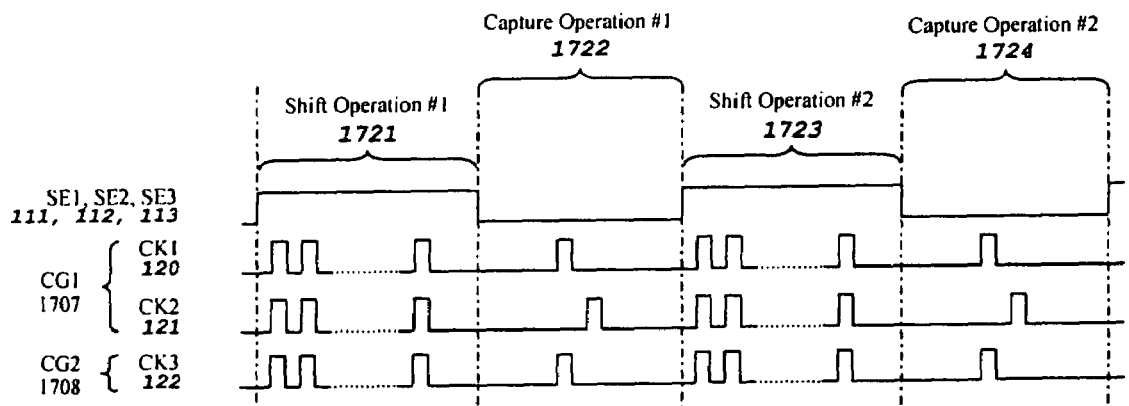
FIG. 17B shows the scan clock waveforms in ATPG (automatic test pattern generation) and fault simulation in order to detect or locate stuck-at faults, bridging faults, or IDDQ faults, with regard to clock grouping in an eleventh embodiment of the present invention.
Figure 17C:
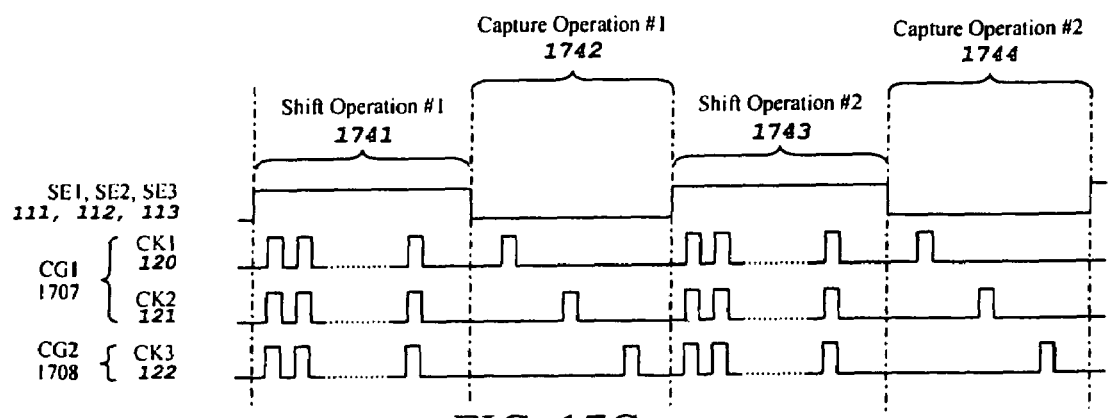
FIG. 17C shows the scan clock waveforms in actual test application in order to detect or locate stuck-at faults, bridging faults, or IDDQ faults, with regard to clock grouping in an eleventh embodiment of the present invention.

FIG. 17B shows the scan clock waveforms in ATPG (automatic test pattern generation) and fault simulation and FIG. 17C shows the scan clock waveforms in actual test application, both for detecting or locating stuck-at faults, bridging faults, or IDDQ faults, with regard to clock grouping in an eleventh embodiment of the present invention.

This embodiment requires that all scan clocks be grouped into a set of clock groups and that the scan clocks in all clock groups be activated during each capture operation. In addition, this embodiment requires that the scan clocks be activated one by one in a selected order and that the capture pulse delay between any scan clocks is larger than the possible corresponding clock skew.

Generally, if scan clocks are activated in this manner, the circuit behavior during a capture operation can only be fully represented by several copies of the corresponding combinational logic portion in the circuit, each with a different set of constraints on its inputs and outputs and each corresponding to a different timeframe, for the purpose of ATPG and fault simulation. This embodiment processes the multiple circuit model copies for different timeframes in a series manner one by one for scan clocks in the clock group CG1 1707. However, for the scan clock in the clock group CG2 1708, some constraints on the inputs and outputs of the corresponding circuit copy are set to unknown (X) values.

This embodiment of the present invention only needs a sequential ATPG program when test patterns are to be generated deterministically. In addition, this embodiment can alleviate the disadvantages of prior-art solution #2 and prior-art solution #3 by achieving higher fault coverage with lower memory usage.

Figure 18A:
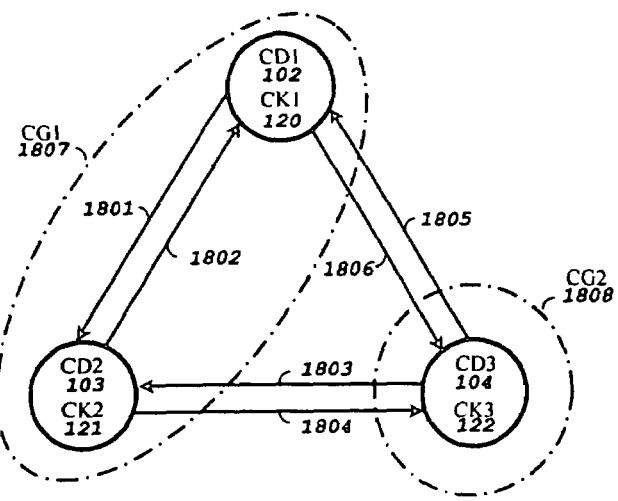
FIG. 18A shows the domain-interconnect graph used to represent the relationship among the clock domains shown in FIG. 1, with clock grouping in a twelfth embodiment of the present invention.

FIG. 18A shows the domain-interconnect graph used to represent the relationship among the clock domains shown in FIG. 1, with clock grouping in a twelfth embodiment of the present invention. The meanings of nodes, edges, and clock groups are the same as explained in FIG. 7A.

Figure 18B:
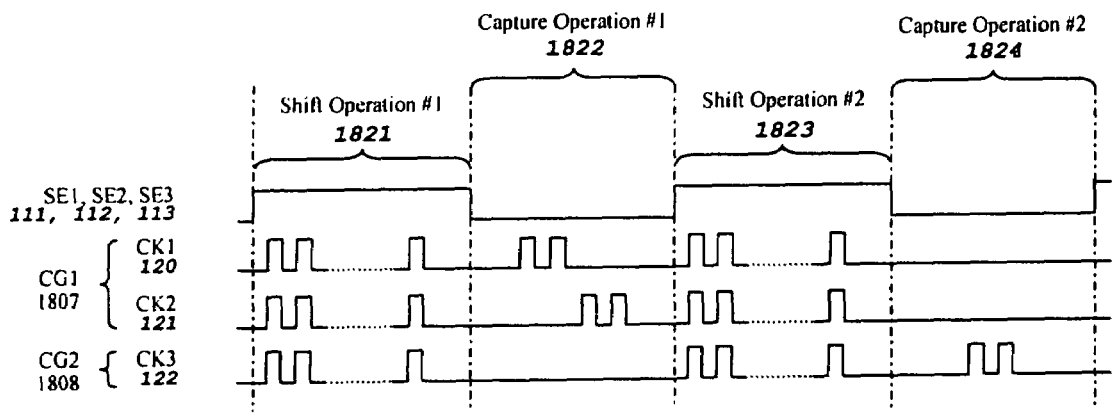
FIG. 18B shows the scan clock waveforms in ATPG (automatic test pattern generation) and fault simulation in order to detect or locate transition faults or path-delay faults launched from capture, with regard to clock grouping in a twelfth embodiment of the present invention.
Figure 18C:
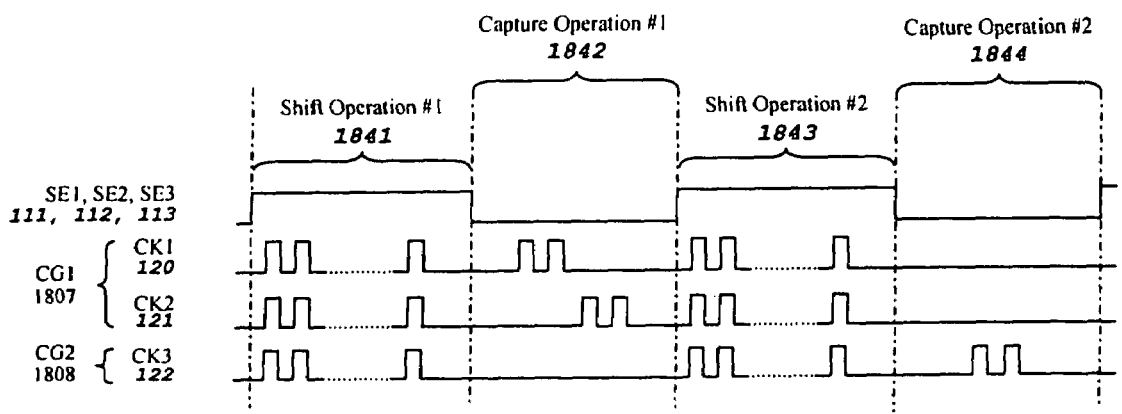
FIG. 18C shows the scan clock waveforms in actual test application in order to detect or locate transition faults or path-delay faults launched from capture, with regard to clock grouping in a twelfth embodiment of the present invention.

FIG. 18B shows the scan clock waveforms in ATPG (automatic test pattern generation) and fault simulation and FIG. 18C shows the scan clock waveforms in actual test application, both for detecting or locating transition faults or path-delay faults launched from capture, with regard to clock grouping in a twelfth embodiment of the present invention. This embodiment is basically the same as the embodiment shown in FIG. 16. The only difference is that this embodiment uses two at-speed pulses for each capture. This allows this embodiment to detect or locate transition faults or path-delay faults launched from capture. Refer to the descriptions of FIG. 16 for more details.

Figure 19A:
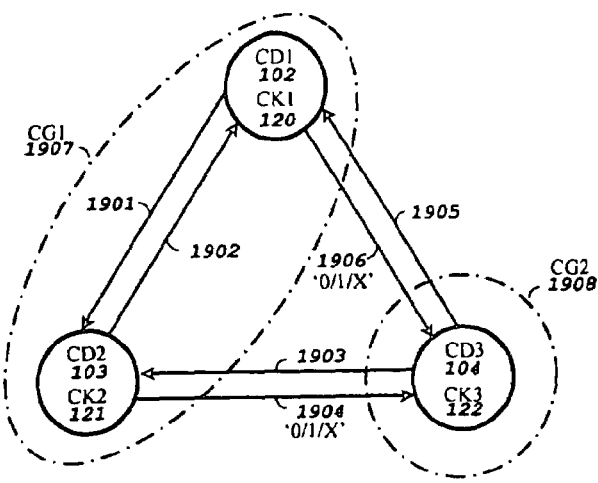
FIG. 19A shows the domain-interconnect graph used to represent the relationship among the clock domains shown in FIG. 1, with clock grouping in a thirteenth embodiment of the present invention.

FIG. 19A shows the domain-interconnect graph used to represent the relationship among the clock domains shown in FIG. 1, with clock grouping in a thirteenth embodiment of the present invention. The meanings of nodes, edges, and clock groups are the same as explained in FIG. 7A.

Figure 19B:
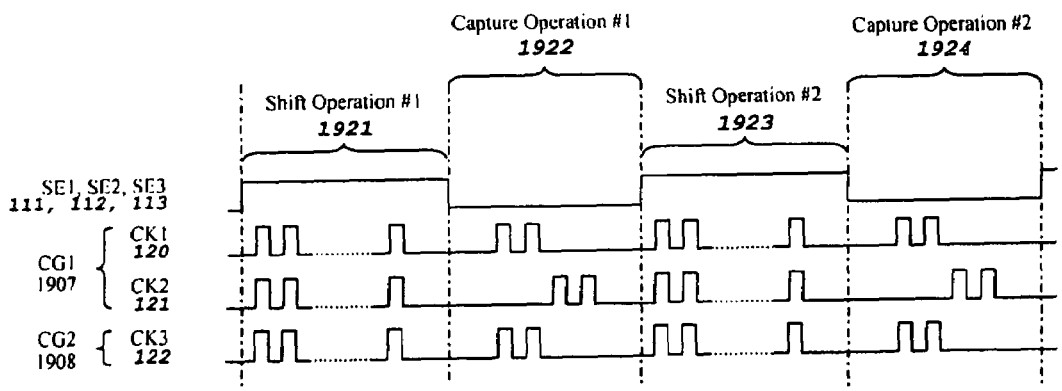
FIG. 19B shows the scan clock waveforms in ATPG (automatic test pattern generation) and fault simulation in order to detect or locate transition faults or path-delay faults launched from capture, with regard to clock grouping in a thirteenth embodiment of the present invention.
Figure 19C:
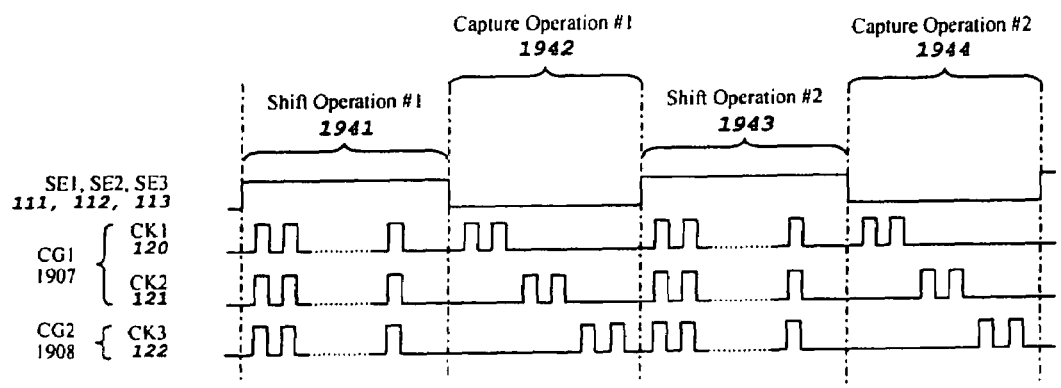
FIG. 19C shows the scan clock waveforms in actual test application in order to detect or locate transition faults or path-delay faults launched from capture, with regard to clock grouping in a thirteenth embodiment of the present invention.

FIG. 19B shows the scan clock waveforms in ATPG (automatic test pattern generation) and fault simulation and FIG. 19C shows the scan clock waveforms in actual test application, both for detecting or locating transition faults or path-delay faults launched from capture, with regard to clock grouping in a thirteenth embodiment of the present invention. This embodiment is basically the same as the embodiment shown in FIG. 17. The only difference is that this embodiment uses two at-speed pulses for each capture. This allows this embodiment to detect or locate transition faults or path-delay faults launched from capture. Refer to the descriptions of FIG. 17 for more details.

Figure 20A:
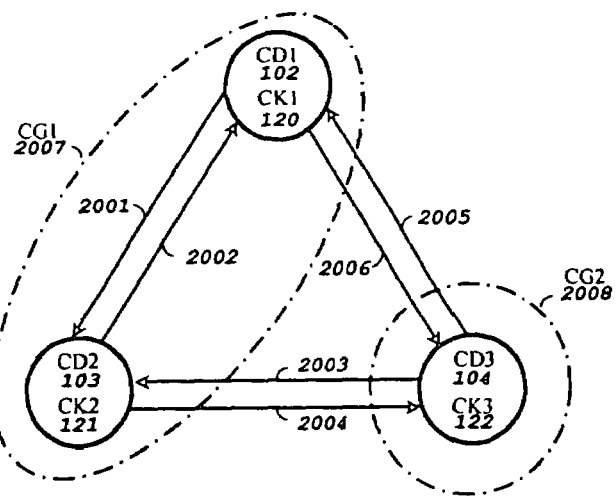
FIG. 20A shows the domain-interconnect graph used to represent the relationship among the clock domains shown in FIG. 1, with clock grouping in a fourteenth embodiment of the present invention.

FIG. 20A shows the domain-interconnect graph used to represent the relationship among the clock domains shown in FIG. 1, with clock grouping in a thirteenth embodiment of the present invention. The meanings of nodes, edges, and clock groups are the same as explained in FIG. 7A.

Figure 20B:
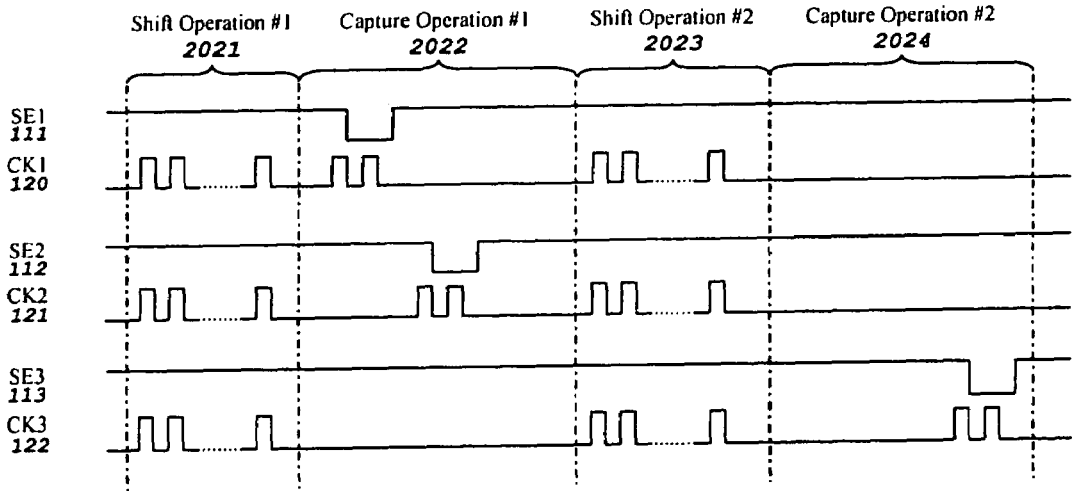
FIG. 20B shows the scan clock waveforms in ATPG (automatic test pattern generation) and fault simulation in order to detect or locate transition faults or path-delay faults launched from shift, with regard to clock grouping in a fourteenth embodiment of the present invention.
Figure 20C:
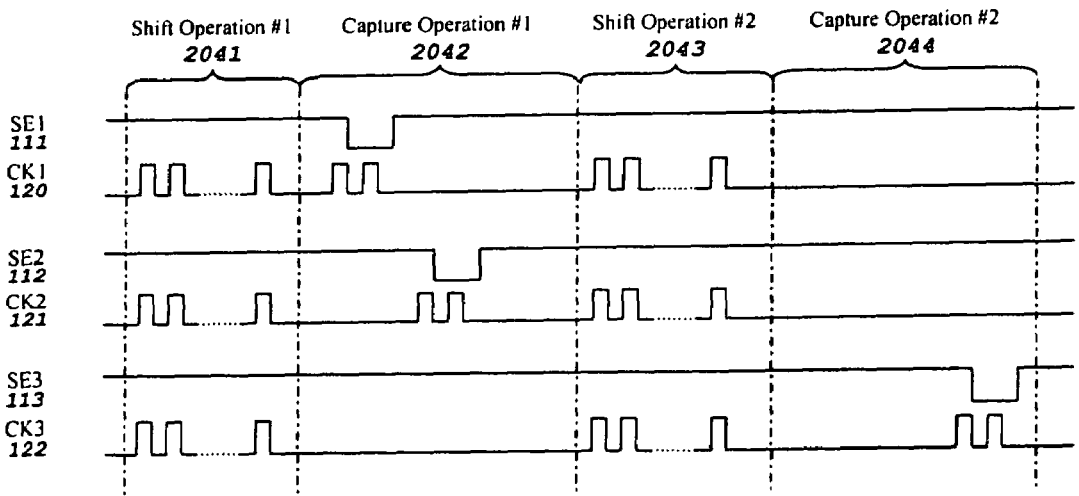
FIG. 20C shows the scan clock waveforms in actual test application in order to detect or locate transition faults or path-delay faults launched from shift, with regard to clock grouping in a fourteenth embodiment of the present invention.

FIG. 20B shows the scan clock waveforms in ATPG (automatic test pattern generation) and fault simulation and FIG. 20C shows the scan clock waveforms in actual test application, both for detecting or locating transition faults or path-delay faults launched from shift, with regard to clock grouping in a thirteenth embodiment of the present invention. This embodiment is basically the same as the embodiment shown in FIG. 16. The only difference is that this embodiment uses one at-speed pulse for each capture. This allows this embodiment to detect or locate transition faults or path-delay faults launched from shift. Refer to the descriptions of FIG. 16 for more details.

Figure 21A:
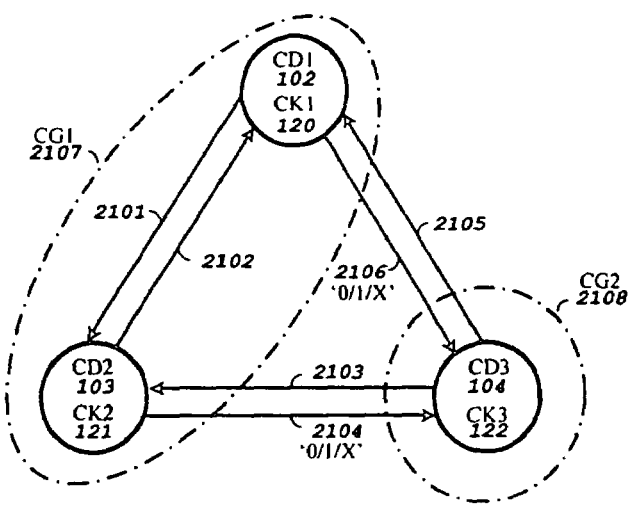
FIG. 21A shows the domain-interconnect graph used to represent the relationship among the clock domains shown in FIG. 1, with clock grouping in a fifteenth embodiment of the present invention.

FIG. 21A shows the domain-interconnect graph used to represent the relationship among the clock domains shown in FIG. 1, with clock grouping in a fifteenth embodiment of the present invention. The meanings of nodes, edges, and clock groups are the same as explained in FIG. 7A.

Figure 21B:
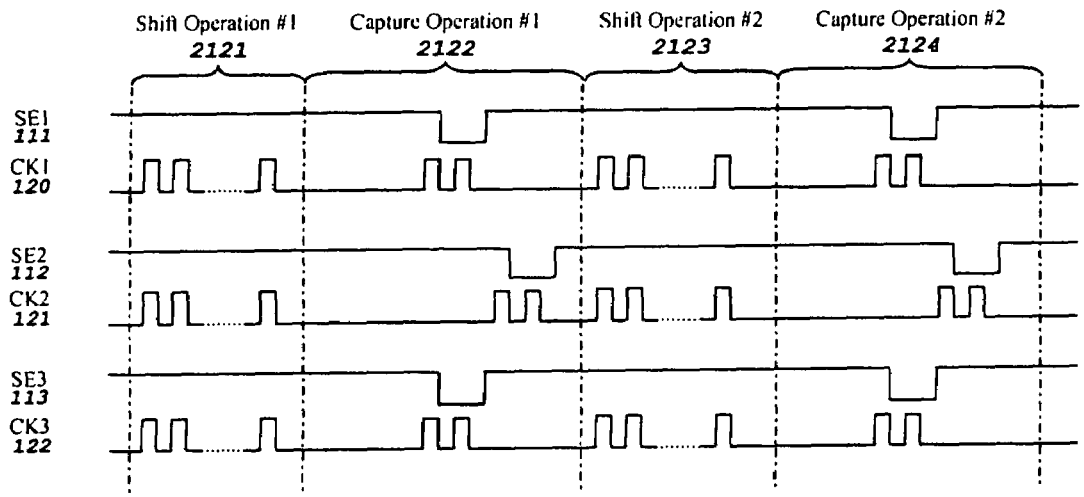
FIG. 21B shows the scan clock waveforms in ATPG (automatic test pattern generation) and fault simulation in order to detect or locate transition faults or path-delay faults launched from shift, with regard to clock grouping in a fifteenth embodiment of the present invention.
Figure 21C:
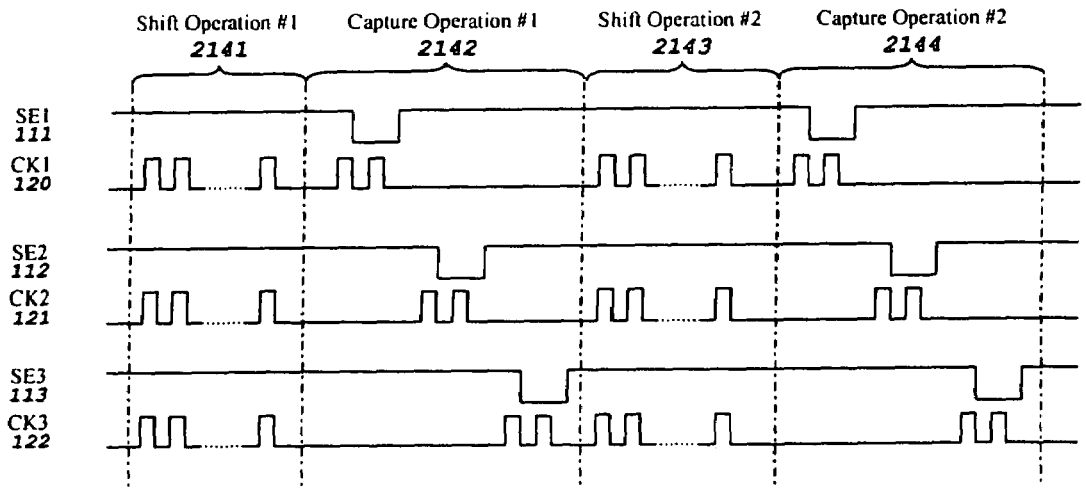
FIG. 21C shows the scan clock waveforms in actual test application in order to detect or locate transition faults or path-delay faults launched from shift, with regard to clock grouping in a fifteenth embodiment of the present invention.

FIG. 21B shows the scan clock waveforms in ATPG (automatic test pattern generation) and fault simulation and FIG. 21C shows the scan clock waveforms in actual test application, both for detecting or locating transition faults or path-delay faults launched from shift, with regard to clock grouping in a fifteenth embodiment of the present invention. This embodiment is basically the same as the embodiment shown in FIG. 17. The only difference is that this embodiment uses one at-speed pulse for each capture. This allows this embodiment to detect or locate transition faults or path-delay faults launched from shift. Refer to the descriptions of FIG. 17 for more details.

Figure 22A:
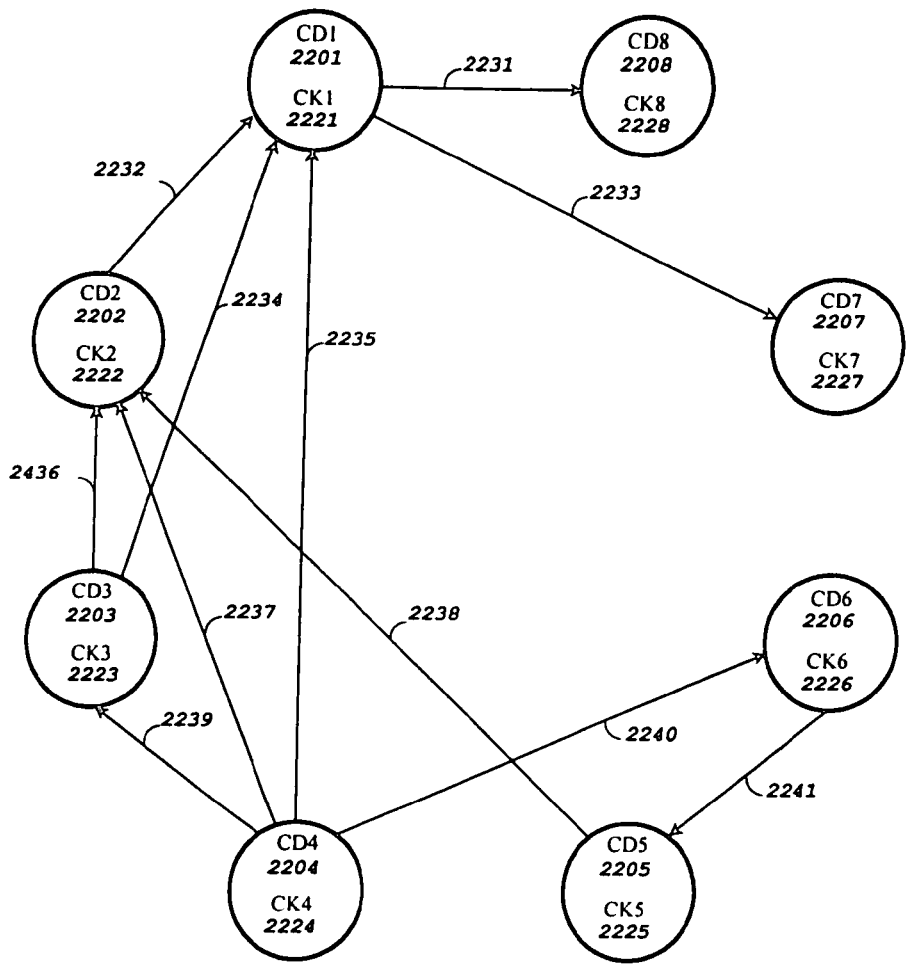
FIG. 22A shows a domain-interconnect graph for 8 inter-related clock domains.

FIG. 22A shows a domain-interconnect graph used to represent the relationship among 8 inter-related clock domains, CD1 2201 to CD8 2208. Here, 8 vertexes are used to represent the 8 clock domains, CD1 2201 to CD8 2208. The corresponding clocks, CK1 2221 to CK8 2228, for the clock domains are also shown in the vertexes for the purpose of easy comprehension. The directed arc between any two vertexes represents a cross-clock domain logic block. For example, the arc 2232 represents the cross-clock domain logic block from the clock domain CD2 2202 to the clock domain CD1 2201.

Figure 22B:
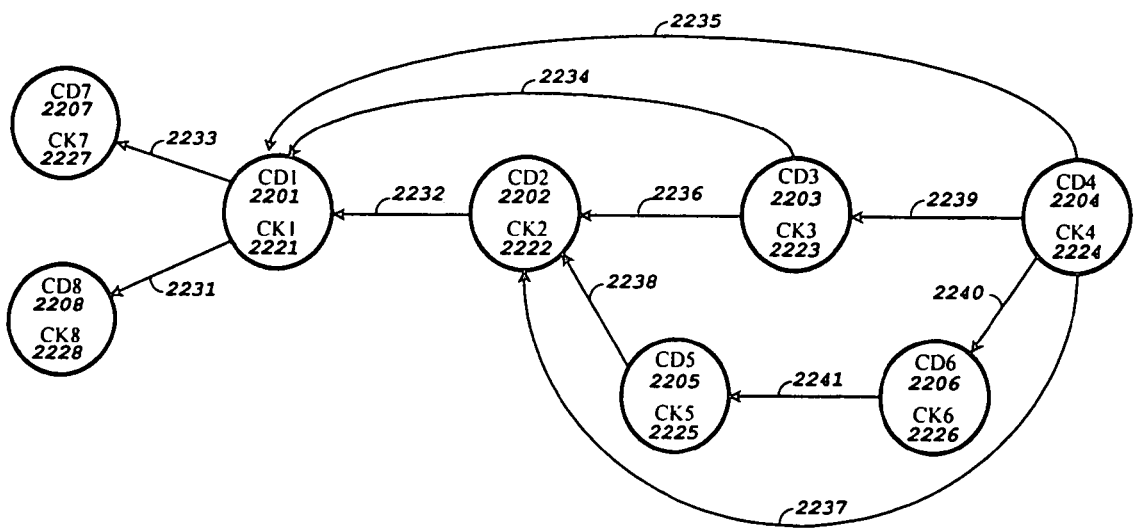
FIG. 22B shows the fault detection or location range for one ordered sequence of capture clocks for the clock domains shown in FIG. 22A, in accordance with the present invention, where clock domain grouping is conducted.

FIG. 22B shows the fault detection or location range for one ordered sequence of capture clocks for the clock domains shown in FIG. 22A, in accordance with the present invention, where clock domain grouping is conducted.

Since clock domains CD7 2207 and CD8 2208 do not interact with each other, they can be captured at the same time. In addition, since clock domains CD3 2203 and CD5 2205 do not interact with each other, they can be captured at the same time. Similarly, since clock domains CD3 2203 and CD6 2206 do not interact with each other, they can be captured at the same time. However, since clock domains CD5 2205 and CD6 2206 interact with each other, they cannot be captured at the same time. Based on this analysis, it can be seen the ordered sequence of capture clocks can be picked up as follows: {CK7 2227, CK8 2228}→CK1 2221→CK2 2222→{CK3 2223, CK5 2225}→CK6 2226→CK4 2224. Alternatively, the ordered sequence of capture clocks can be picked up as follows: {CD7 2227, CD8 2228}→CD1 2221→CK2 2222→{CK3 2223, CK6 2224}→CK5 2225→CK4 2224. That is, some clock domains can be grouped together and captured simultaneously. This will reduce test time.

Figure 23A:
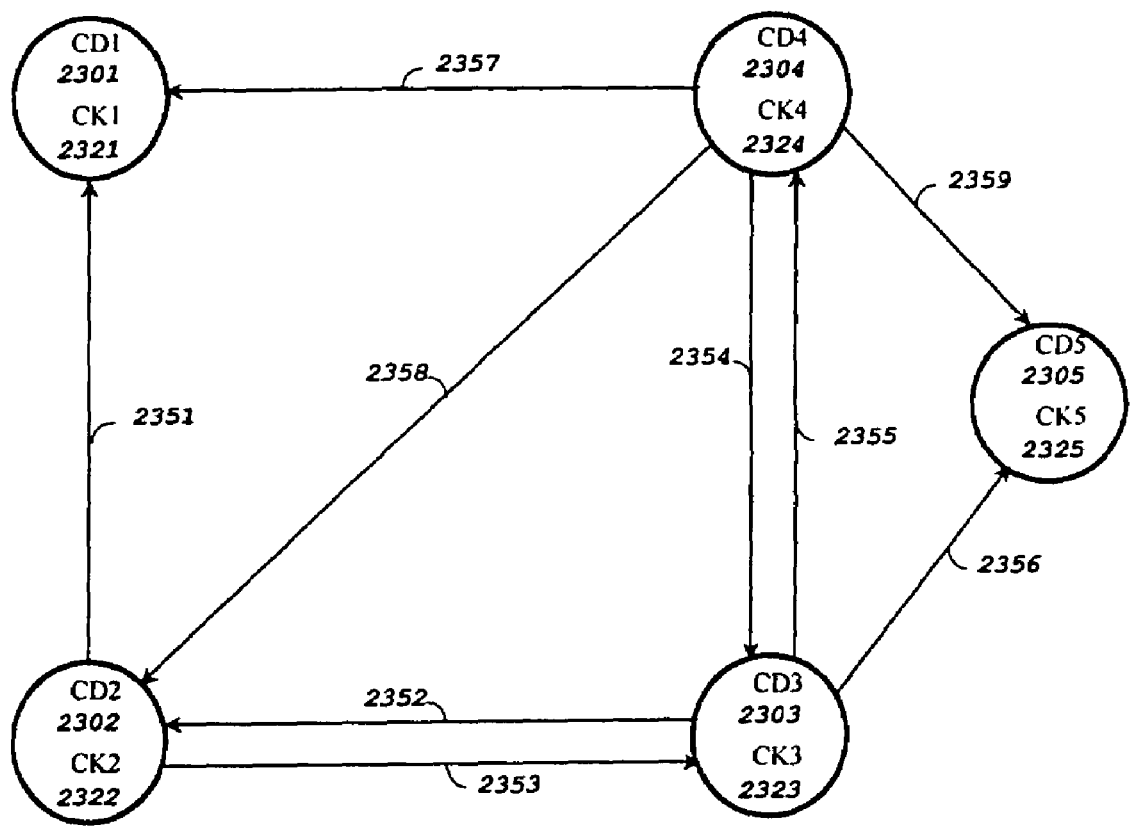
FIG. 23A shows a domain-interconnect graph for 5 inter-related clock domains.

FIG. 23A shows a domain-interconnect graph used to represent the relationship among 5 inter-related clock domains, CD1 2301 to CD4 2305. Here, 5 vertexes are used to represent the 5 clock domains, CD1 2301 to CD4 2305. The corresponding clocks, CK1 2321 to CK5 2325, for the clock domains are also shown in the vertexes for the purpose of easy comprehension. The directed arc between any two vertexes represents a cross-clock domain logic block. For example, the arc 2351 represents the cross-clock domain logic block from the clock domain CD2 2302 to the clock domain CD1 2301.

Figure 23B:
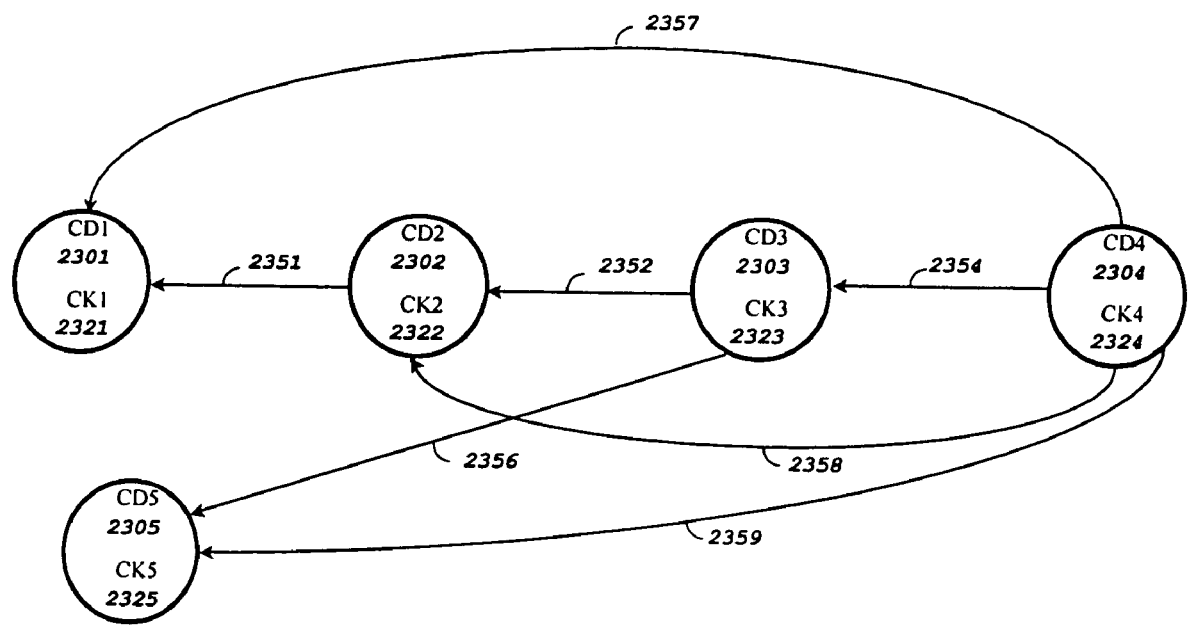
FIG. 23B shows the fault detection or location range for one ordered sequence of capture clocks for the clock domains shown in FIG. 23A, in accordance with the present invention.

FIG. 23B shows the fault detection or location range for one ordered sequence of capture clocks, {CK1 2321, CK5 2325}→CK2 2322→CK3 2323→CK4 2324, for the clock domains, CD1 2321 to CD4 2324, shown in FIG. 23A, in accordance with the present invention. The ordered sequence of capture clocks is determined automatically based on the domain-interconnect graph shown in FIG. 23A. It can also be specified directly.

Note that test stimuli are shifted into the scan chains in all clock domains simultaneously. Then the capture operation is conducted in the following manner: First, the clocks CK1 2321 and CK5 2325, which do not interact with each other, capture. As a result, faults in the clock domain CD1 2301 as well as in the cross-clock domain logic blocks 2351 and 2357 can be detected or located. In addition, faults in the clock domain CD5 2305 as well as in the cross-clock domain logic blocks 2356 and 2359 can be detected or located. Second, the clock CK2 2322 captures. As a result, faults in the clock domain CD2 2302 as well as in the cross-clock domain logic block 2352 can be detected or located. Third, the clock CK3 2323 captures. As a result, faults in the clock domain CD3 2303 as well as in the cross-clock domain logic block 2354 can be detected or located. Fourth, the clock CK4 2324 captures. As a result, faults in the clock domain CD4 2304 can be detected or located.

Obviously, after ATPG is conducted for the ordered sequence of capture clocks, {CK1 2321, CK5 2325}→CK2 2322→CK3 2323→CK4 2324, all faults except those in the cross-clock domain logic blocks represented by the arcs 2353 and 2355 can be detected or located. The reason is that, when the clocks CK2 2322 and CK3 2323 capture, test responses will be captured into all scan cells in the clock domains CD2 2302 and CD3 2303, replacing any previous values shifted into these scan cells when the clocks CK3 2323 and CK4 2324 capture, respectively.

Figure 23C:
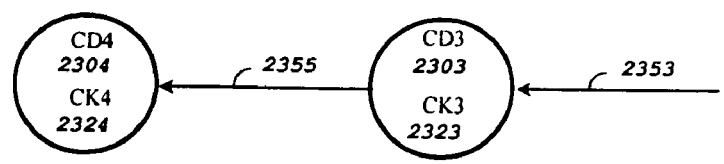
FIG. 23C shows the fault detection or location range for one more ordered sequence of capture clocks for the clock domains shown in FIG. 23A, in accordance with the present invention.

FIG. 23C shows the fault detection or location range for one more ordered sequence of capture clocks, CK4 2324→CK3 2323, for the clock domains, CD4 2304 to CD3 2303, shown in FIG. 23A, in accordance with the present invention. The ordered sequence of capture clocks is determined automatically based on the domain-interconnect graph shown in FIG. 23A. It can also be specified directly.

Note that test stimuli are shifted into the scan chains in all clock domains simultaneously. Then the capture operation is conducted in the following manner: First, the clock CK4 2324 captures. As a result, faults in the clock domain CD4 2304 as well as in the cross-clock domain logic block 2355 can be detected or located. Second, the clock CK3 2323 captures. As a result, faults in the clock domain CD3 2303 as well as in the cross-clock domain logic block 2353 can be detected or located.

Combined with results shown in FIG. 23B, it can be seen that all faults in the scan-based integrated circuit can be detected or located, after using these two ordered sequence of capture clocks.

Figure 23D:
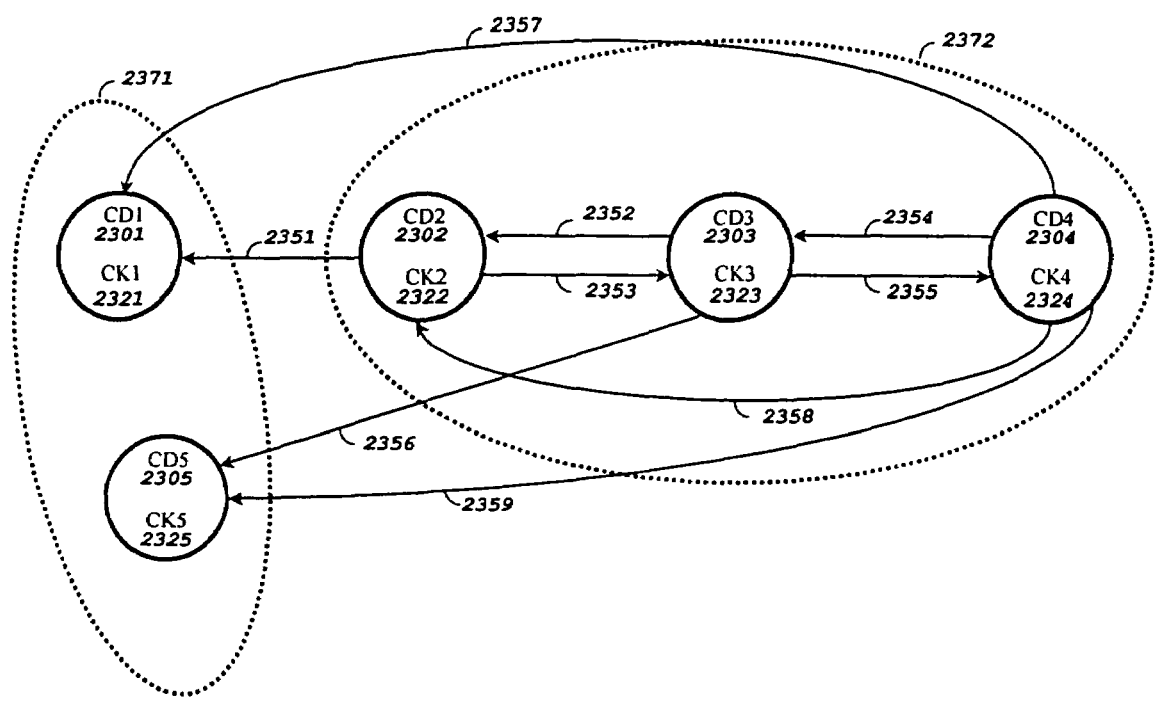
FIG. 23D shows the fault detection or location range for one ordered sequence of capture clocks for the clock domains shown in FIG. 23A, in accordance with the present invention, where clock domain merging is conducted.

FIG. 23D shows the fault detection or location range for one ordered sequence of capture clocks, {CK1 2321, CK5 2325}→CK2 2322→CK3 2323→CK4 2324, for the clock domains, CD1 2301 to CD4 2304, shown in FIG. 23A, in accordance with the present invention, where clock domain merging is conducted.

In this case, three clock domains, CD2 2302, CD3 2303, and CD4 2304, are merged together. It means that two-time frames will be used for circuit transformation related to these three clock domains and their corresponding cross-clock domain logic blocks. The benefits are as follows: Even the clock CK3 2323 captures after the clock CK2 2322 does, the controllability of the cross-clock domain logic block 2353 is still high since the clock domain CD2 2302 is also transformed to obtain the values in the clock domain CD2 2302 after the clock CK2 2322 captures. As a result, all faults in the cross-clock domain logic block 2353 can be detected or located. In addition, even the clock CK4 2324 captures after the clocks CK2 2322 and CK3 2323 do, the controllability of the cross-clock domain logic block 2355 is still high since the clock domains CD2 2302 and CD3 2303 as well as the cross-clock domain logic block 2353 are also transformed to obtain the values in the clock domains CD2

2302 and CD3 2303 as well as the cross-clock domain logic block 2353 after the clocks CK2 2322 and CK3 2323 capture. As a result, all faults in the cross-clock domain logic block 2355 can be detected or located. That is, by merging the 3 clock domains, CD2 2302, CD3 2303, and CD4 2304, only one ordered sequence of capture clocks is enough to detect or locate all faults in the scan-based integrated circuit.

Figure 24A:
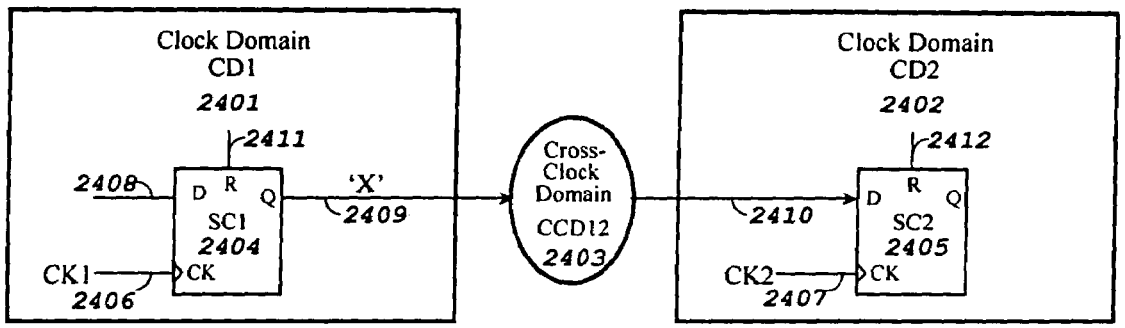
FIG. 24A shows a prior art solution for handling uncontrollability when using a single time-frame for the multiple-capture scheme.

FIG. 24A shows a prior art solution for handling uncontrollability when using a single time-frame in the multiple-capture scheme. The clock domain CD1 2401 interacts to the clock domain CD2 2402 through the cross-clock domain logic block CCD12 2403. The Q output 2409 of the scan cell SC1 2404, driven by the clock CK1 2406, is connected to the cross-clock domain logic block CCD12 2403. The D input 2410 of the D input of the scan cell SC2 2405, driven by the clock CK2 2407, is connected to the cross-clock domain logic block CCD12 2403.

Suppose that the clock CK1 2406 is activated before the clock CK2 2407 is activated in the multiple-capture scheme. When the clock CK1 2406 captures, the clock domain CD1 2401 needs to be transformed during ATPG (automatic test pattern generation) for detecting or locating all faults in the clock domain CD1 2401. Note that, after the clock CK1 2406 is activated, test responses will be captured into all scan cells in the clock domain CD1 2401, replacing any previous values shifted into these scan cells. Now, when the clock CK2 2407 captures, the clock domain CD1 2401, the cross-clock domain CCD12 2403, and the clock domain CD2 2402 need to be transformed during ATPG for detecting or locating all faults in the cross-clock domain logic block CCD12 303 and the clock domain CD2 2402. Here, two time-frames are involved: the first one for CK1 2406 and the second one for CK2 2407. The purpose of transforming the clock domain CD1 2401 is to get the values for the first time-frame for CK1 2406.

Due to the ATPG memory consumption issue, it is sometimes desirable to use a single time-frame even in the multiple-capture scheme for multiple capture clocks. In this example, this means to transform only the cross-clock domain CCD12 2403 and the clock domain CD2 2402 during ATPG when the clock CK2 2407 captures. The advantage of this approach is that it reduces memory usage during ATPG. However, it is necessary to provide a solution to handle the values provided from the clock domain CD1 2401 to the cross-clock domain logic block CCD21 2403.

A prior art solution for handling this uncontrollability issue is to use unknown values, represented by X. As shown in FIG. 24A, X is assigned to the Q output 2409 of the scan cell SC1 2404. The disadvantage of this solution is that it reduces the controllability significantly, which will results in a larger set of test patterns with lower fault coverage.

Figure 24B:
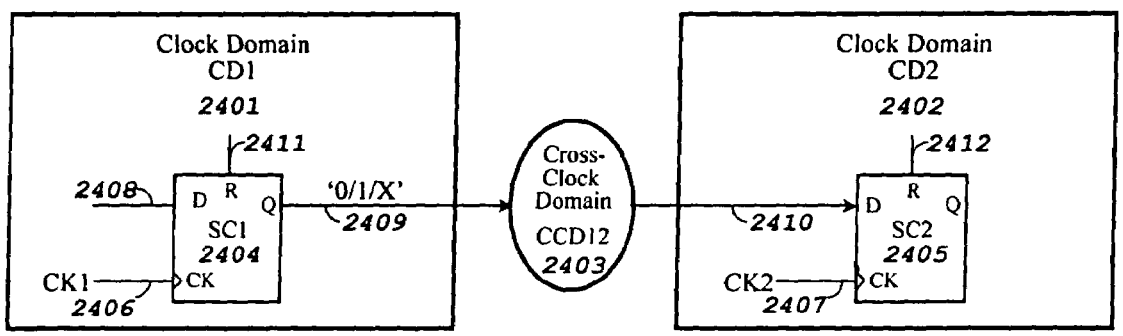
FIG. 24B shows an embodiment of the method for handling uncontrollability when using a single time-frame for the multiple-capture scheme, in accordance with the present invention.

FIG. 24B shows an embodiment of the method for handling uncontrollability when using a single time-frame in the multiple-capture scheme, in accordance with the present invention.

Same as the case shown in FIG. 24A, if the clock CK1 2406 captures before the clock CK2 2407 captures, test responses will be captured into all scan cells in the clock domain CD1 2401, replacing any previous values shifted into these scan cells. Suppose that a single time-frame needs to be used in the multiple-capture scheme for multiple capture clocks in order to reduce memory usage. In this example, this means to transform only the cross-clock domain CCD12 2403 and the clock domain CD2 2402 during ATPG when the clock CK2 2407 captures. Obviously, it is necessary to provide a solution to handle the values provided from the clock domain CD1 2401 to the cross-clock domain logic block CCD21 2403.

In order to handle this uncontrollability issue, the present invention makes sure that the value of the Q output 2409 of the scan cell SC1 2404 remains the same before and after the clock CK1 2406 captures. This can be achieved by setting a proper value either to the D input 2408 or the R (reset) input 2411 of the scan cell SC1 2404. Since a logic value, 0 or 1, is used instead of an unknown value X, the controllability for the cross-clock domain CCD12 2403 and the clock domain CD2 2402 can be improved significantly. This will result in a smaller set of test patterns with higher fault coverage.

Figure 25:
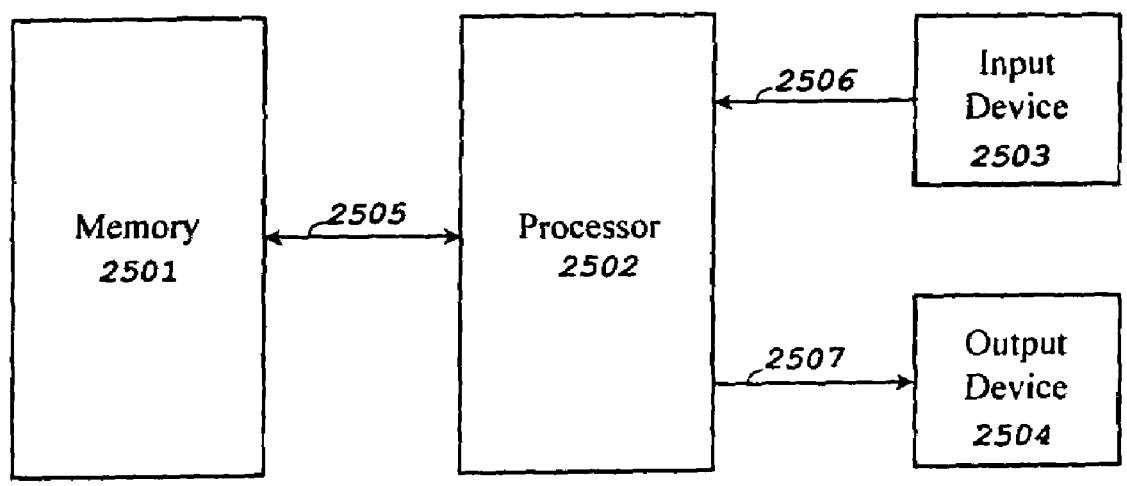
FIG. 25 shows an electronic design automation system, where a computer-readable program, in accordance with the present invention, performs clock grouping and circuit expansion based ATPG (automatic test pattern generation) and fault simulation for a scan-based integrated circuit.

FIG. 25 shows an electronic design automation system which includes a processor 2502, a bus 2505 coupled to the processor, a computer-readable memory 2501 coupled to the bus, an input device 2503, and an output device 2504. The computer-readable memory 2501 contains a computer-readable program, in accordance with the present invention and described in FIG. 6A and FIG. 6B, to cause the electronic design automation system to perform a method of ATPG (automatic test pattern generation) and fault simulation based on clock grouping and circuit expansion for testing a scan-based integrated in scan-test mode or self-test mode.

The processor 2502 may represent a central processing unit of a personal computer, workstation, mainframe computer or other suitable digital processing device. The memory 2501 can be an electronic memory or a magnetic or optical disk-based memory, or various combinations thereof. A designer interacts with the clock grouping and circuit expansion based ATPG and fault simulation software run by the processor 2502 to provide appropriate inputs via an input device 2503, which may be a keyboard, disk drive or other suitable source of design information. The processor 2502 provides outputs to the designer via an output device 2504, which may be a display, a printer, a disk drive or various combinations of these and other elements.

Having thus described presently preferred embodiments of the present invention, it can now be appreciated that the objectives of the invention have been fully achieved. And it will be understood by those skilled in the art that many changes in construction and circuitry, and widely differing embodiments and applications of the invention will suggest themselves without departing from the spirit and scope of the present invention. The disclosures and the description herein are intended to be illustrative and are not in any sense limitation of the invention, more preferably defined in scope by the following claims.

What is claimed is:

1. A method for generating stimuli and test responses for testing faults in a scan-based integrated circuit in a selected scan-test mode or a selected self-test mode, the scan-based integrated circuit containing a plurality of scan chains, N clock domains, and C cross-clock domain blocks, each scan chain comprising multiple scan cells coupled in series, each clock domain having one capture clock, each cross-clock domain block comprising a combinational logic network; said method comprising the computer implemented steps of:

(a) compiling a HDL (hardware description language) code modeled at RTL (register-transfer level) or at gate-level that represents said scan-based integrated circuit into a sequential circuit model;

(b) specifying input constraints on said scan-based integrated circuit during a shift and capture operation;

(c) specifying a clock grouping to map said N clock domains into G clock domain groups, where N>G>1;

(d) transforming said sequential circuit model into an equivalent combinational circuit model according to said input constraints and said clock grouping, by selectively performing circuit expansion on selected cross-clock domain blocks and selected clock domains embedded completely within selected clock domain groups, and selectively performing circuit expansion on selected cross-clock domain blocks across selected clock domain groups, said selected clock domain groups in said G clock domain groups, said selected clock domains in said N clock domains, and said selected cross-clock domain blocks in said C cross-clock domain blocks; and (e) generating said stimuli and said test responses on said equivalent combinational circuit model according to said input constraints.

2. The method of claim 1, wherein said specifying a clock grouping to map said N clock domains into G clock domain groups further comprises automatically generating said clock grouping based on said sequential circuit model and said input constraints.

3. The method of claim 1, wherein said generating said stimuli and said test responses on said equivalent combinational circuit model according to said input constraints further comprises performing fault simulation on said equivalent combinational circuit model selectively using a selected set of predetermined patterns as said stimuli and said test responses in said selected scan-test mode, or a selected set of pseudorandom patterns as said stimuli and said test responses in said selected self-test mode.

4. The method of claim 3, wherein said performing fault simulation on said equivalent combinational circuit model further comprises selectively using a one-hot method to perform said fault simulation on a plurality of selected first unexpanded blocks, wherein each said selected first unexpanded block is a clock domain in said N clock domains that is not in said selected clock domains, or a cross-clock domain block in said C cross-clock domain blocks that is not in said selected cross-clock domain blocks.

5. The method of claim 4, wherein said one-hot method further comprises testing said plurality of selected first unexpanded blocks one at a time by selectively applying a selected capture clock connected to one or more said selected first unexpanded blocks while disabling all other capture clocks connected to other said selected first unexpanded blocks during a selected capture operation.

6. The method of claim 3, wherein said performing fault simulation on said equivalent combinational circuit model further comprises selectively using a constrained-value method to perform said fault simulation on a plurality of selected second unexpanded blocks, wherein each said selected second unexpanded block is a clock domain in said N clock domains that is not in said selected clock domains, or a cross-clock domain block in said C cross-clock domain blocks that is not in said selected cross-clock domain blocks.

7. The method of claim 6, wherein said constrained-value method further comprises testing said plurality of selected second unexpanded blocks by setting constrained ('0', '1', 'X') values on all said plurality of selected second unexpanded blocks and applying all capture clocks connected to said plurality of selected second unexpanded blocks simultaneously during a selected capture operation.

8. The method of claim 3, wherein said performing fault simulation on said equivalent combinational circuit model further comprises selectively using a multi-timeframe fault simulation method to perform said fault simulation on a plurality of selected third unexpanded blocks, wherein each said selected third unexpanded block is a clock domain in said N clock domains that is not in said selected clock domains, or a cross-clock domain block in said C cross-clock domain blocks that is not in said selected cross-clock domain blocks.

9. The method of claim 8, wherein said multi-timeframe fault simulation method further comprises testing said plurality of selected third unexpanded blocks by performing said fault simulation on said selected third unexpanded blocks by applying all capture clocks connected to said selected third unexpanded blocks sequentially during a selected capture operation.

10. The method of claim 1, wherein said generating said stimuli and said test responses on said equivalent combinational circuit model according to said input constraints further comprises performing combinational ATPG (automatic test pattern generation) on said equivalent combinational circuit model to generate said stimuli and said test responses in said selected scan-test mode.

11. The method of claim 10, wherein said performing combinational ATPG on said equivalent combinational circuit model further comprises selectively using a one-hot method to perform said fault simulation on a plurality of selected fourth unexpanded blocks, wherein each said selected fourth unexpanded block is a clock domain in said N clock domains that is not in said selected clock domains, or a cross-clock domain block in said C cross-clock domain blocks that is not in said selected cross-clock domain blocks.

12. The method of claim 11, wherein said one-hot method further comprises testing said plurality of selected fourth unexpanded blocks one at a time by selectively applying a selected capture clock connected to one or more said selected fourth unexpanded blocks while disabling all other capture clocks connected to other said selected fourth unexpanded blocks during a selected capture operation.

13. The method of claim 10, wherein said performing combinational ATPG on said equivalent combinational circuit model further comprises selectively using a constrained-value method to perform said fault simulation on a plurality of selected fifth unexpanded blocks, wherein each said selected fifth unexpanded block is a clock domain in said N clock domains that is not in said selected clock domains, or a cross-clock domain block in said C cross-clock domain blocks that is not in said selected cross-clock domain blocks.

14. The method of claim 13, wherein said constrained-value method further comprises testing said plurality of selected second unexpanded blocks by setting constrained ('0', '1', 'X') values on all said plurality of selected fifth unexpanded blocks and applying all capture clocks connected to said plurality of selected fifth unexpanded blocks simultaneously during a selected capture operation.

15. The method of claim 10, wherein said performing combinational ATPG on said equivalent combinational circuit model further comprises selectively using a multi-timeframe fault simulation method to perform said fault simulation on a plurality of selected sixth unexpanded blocks, wherein each said selected sixth unexpanded block is a clock domain in said N clock domains that is not in said selected clock domains, or a cross-clock domain block in said C cross-clock domain blocks that is not in said selected cross-clock domain blocks.

16. The method of claim 15, wherein said multi-timeframe fault simulation method further comprises testing said plurality of selected sixth unexpanded blocks by performing said fault simulation on said selected sixth unexpanded blocks by applying all capture clocks connected to said selected sixth unexpanded blocks sequentially during a selected capture operation.

17. The method of claim 1, wherein said specifying input constraints on said scan-based integrated circuit further comprises specifying an ordered sequence of selected capture clocks in said capture operation.

18. The method of claim 17, wherein said specifying an ordered sequence of selected capture clocks further comprises performing clock-domain analysis on said sequential circuit model for generating an optimal ordered sequence of selected capture clocks automatically.

19. The method of claim 18, wherein said performing clock-domain analysis on said sequential circuit model for generating an optimal ordered sequence of selected capture clocks further comprises the computer implemented steps of:
(f) constructing a domain-interconnect graph comprising a plurality of vertexes and arcs, each said vertex denoting one of said N clock domains, and each said arc denoting one of said C cross-clock domains; and
(g) analyzing said domain-interconnect graph to find said optimal ordered sequence of capture clocks.

20. The method of claim 19, wherein analyzing said domain-interconnect graph to find said optimal ordered sequence of capture clocks further comprises the computer implemented steps of:
(h) breaking one selected arc from each vertex-pair with bi-directional links to form a directed graph; and
(i) levelizing said directed graph to obtain said optimal ordered sequence of capture clocks.

21. The method of claim 20, wherein said levelizing said directed graph to obtain said optimal ordered sequence of capture clocks further comprises analyzing said directed graph to determine which selected vertexes (or selected clock domains) do not interact each other directly or indirectly, and selectively replacing said capture clocks controlling said selected clock domains with one or more grouped capture clocks.

22. The method of claim 18, wherein said performing clock-domain analysis on said sequential circuit model for generating an optimal ordered sequence of capture clocks further comprises applying said optimal ordered sequence of capture clocks in reverse order.

23. The method of claim 22, wherein said applying said optimal ordered sequence of capture clocks in reverse order further comprises removing one or more selected capture clocks from said optimal ordered sequence of capture clocks in reverse order.

24. The method of claim 1, wherein said generating said stimuli and said test responses on said equivalent combinational circuit model according to said input constraints further comprises generating HDL test benches according to said stimuli and said test responses for verifying the correctness of said scan-based integrated circuit using simulation methods.

25. The method of claim 1, wherein said generating said stimuli and said test responses on said equivalent combinational circuit model according to said input constraints further comprises generating ATE (automatic test equipment) test programs according to said stimuli and said test responses for verifying the correctness of said scan-based integrated circuit in said ATE.

26. The method of claim 1, wherein said faults further include selected stuck-at faults, selected transition faults selectively launched from shift or launched from capture, selected path-delay faults selectively launched from shift or launched from capture, selected IDDQ (IDD quiescent current) faults, and selected bridging faults.

27. A computer-readable memory having computer-readable program code embodied therein for causing a computer system to perform a method for generating stimuli and test responses for testing faults in a scan-based integrated circuit in a selected scan-test mode or a selected self-test mode, the scan-based integrated circuit containing a plurality of scan chains, N clock domains, and C cross-clock domain blocks, each scan chain comprising multiple scan cells coupled in series, each clock domain having one capture clock, each cross-clock domain block comprising a combinational logic network; said method comprising the computer implemented steps of:
(a) compiling a HDL (hardware description language) code modeled at RTL (register-transfer level) or at gate-level that represents said scan-based integrated circuit into a sequential circuit model;
(b) specifying input constraints on said scan-based integrated circuit during a shift and capture operation;
(c) specifying a clock grouping to map said N clock domains into G clock domain groups, where N>G>1;
(d) transforming said sequential circuit model into an equivalent combinational circuit model according to said input constraints and said clock grouping, by selectively performing circuit expansion on selected cross-clock domain blocks and selected clock domains embedded completely within selected clock domain groups, and selectively performing circuit expansion on selected cross-clock domain blocks across selected clock domain groups, said selected clock domain groups in said G clock domain groups, said selected clock domains in said N clock domains, and said selected cross-clock domain blocks in said C cross-clock domain blocks; and
(e) generating said stimuli and said test responses on said equivalent combinational circuit model according to said input constraints.

28. The computer-readable memory of claim 27, wherein said specifying a clock grouping to map said N clock domains into G clock domain groups further comprises automatically generating said clock grouping based on said sequential circuit model and said input constraints.

29. The computer-readable memory of claim 27, wherein said generating said stimuli and said test responses on said equivalent combinational circuit model according to said input constraints further comprises performing fault simulation on said equivalent combinational circuit model selectively using a selected set of predetermined patterns as said stimuli and said test responses in said selected scan-test mode, or a selected set of pseudorandom patterns as said stimuli and said test responses in said selected self-test mode.

30. The computer-readable memory of claim 29, wherein said performing fault simulation on said equivalent combinational circuit model further comprises selectively using a one-hot method to perform said fault simulation on a plurality of selected first unexpanded blocks, wherein each said selected first unexpanded block is a clock domain in said N clock domains that is not in said selected clock domains, or a cross-clock domain block in said C cross-clock domain blocks that is not in said selected cross-clock domain blocks.

31. The computer-readable memory of claim 30, wherein said one-hot method further comprises testing said plurality of selected first unexpanded blocks one at a time by selectively applying a selected capture clock connected to one or more said selected first unexpanded blocks while disabling all other capture clocks connected to other said selected first unexpanded blocks during a selected capture operation.

32. The computer-readable memory of claim 29, wherein said performing fault simulation on said equivalent combinational circuit model further comprises selectively using a constrained-value method to perform said fault simulation on a plurality of selected second unexpanded blocks, wherein each said selected second unexpanded block is a clock domain in said N clock domains that is not in said selected clock domains, or a cross-clock domain block in said C cross-clock domain blocks that is not in said selected cross-clock domain blocks.

33. The computer-readable memory of claim 32, wherein said constrained-value method further comprises testing said plurality of selected second unexpanded blocks by setting constrained ('0', '1', 'X') values on all said plurality of selected second unexpanded blocks and applying all capture clocks connected to said plurality of selected second unexpanded blocks simultaneously during a selected capture operation.

34. The computer-readable memory of claim 29, wherein said performing fault simulation on said equivalent combinational circuit model further comprises selectively using a multi-timeframe fault simulation method to perform said fault simulation on a plurality of selected third unexpanded blocks, wherein each said selected third unexpanded block is a clock domain in said N clock domains that is not in said selected clock domains, or a cross-clock domain block in said C cross-clock domain blocks that is not in said selected cross-clock domain blocks.

35. The computer-readable memory of claim 34, wherein said multi-timeframe fault simulation method further comprises testing said plurality of selected third unexpanded blocks by performing said fault simulation on said selected third unexpanded blocks by applying all capture clocks connected to said selected third unexpanded blocks sequentially during a selected capture operation.

36. The computer-readable memory of claim 27, wherein said generating said stimuli and said test responses on said equivalent combinational circuit model according to said input constraints further comprises performing combinational ATPG (automatic test pattern generation) on said equivalent combinational circuit model to generate said stimuli and said test responses in said selected scan-test mode.

37. The computer-readable memory of claim 36, wherein said performing combinational ATPG on said equivalent combinational circuit model further comprises selectively using a one-hot method to perform said fault simulation on a plurality of selected fourth unexpanded blocks, wherein each said selected fourth unexpanded block is a clock domain in said N clock domains that is not in said selected clock domains, or a cross-clock domain block in said C cross-clock domain blocks that is not in said selected cross-clock domain blocks.

38. The computer-readable memory of claim 37, wherein said one-hot method further comprises testing said plurality of selected fourth unexpanded blocks one at a time by selectively applying a selected capture clock connected to one or more said selected fourth unexpanded blocks while disabling all other capture clocks connected to other said selected fourth unexpanded blocks during a selected capture operation.

39. The computer-readable memory of claim 36, wherein said performing combinational ATPG on said equivalent combinational circuit model further comprises selectively using a constrained-value method to perform said fault simulation on a plurality of selected fifth unexpanded blocks, wherein each said selected fifth unexpanded block is a clock domain in said N clock domains that is not in said selected clock domains, or a cross-clock domain block in said C cross-clock domain blocks that is not in said selected cross-clock domain blocks.

40. The computer-readable memory of claim 39, wherein said constrained-value method further comprises testing said plurality of selected second unexpanded blocks by setting constrained ('0', '1', 'X') values on all said plurality of selected fifth unexpanded blocks and applying all capture clocks connected to said plurality of selected fifth unexpanded blocks simultaneously during a selected capture operation.

41. The computer-readable memory of claim 36, wherein said performing combinational ATPG on said equivalent combinational circuit model further comprises selectively using a multi-timeframe fault simulation method to perform said fault simulation on a plurality of selected sixth unexpanded blocks, wherein each said selected sixth unexpanded block is a clock domain in said N clock domains that is not in said selected clock domains, or a cross-clock domain block in said C cross-clock domain blocks that is not in said selected cross-clock domain blocks.

42. The computer-readable memory of claim 41, wherein said multi-timeframe fault simulation method further comprises testing said plurality of selected sixth unexpanded blocks by performing said fault simulation on said selected sixth unexpanded blocks by applying all capture clocks connected to said selected sixth unexpanded blocks sequentially during a selected capture operation.

43. The computer-readable memory of claim 27, wherein said specifying input constraints on said scan-based integrated circuit further comprises specifying an ordered sequence of selected capture clocks in said capture operation.

44. The computer-readable memory of claim 43, wherein said specifying an ordered sequence of selected capture clocks further comprises performing clock-domain analysis on said sequential circuit model for generating an optimal ordered sequence of selected capture clocks automatically.

45. The computer-readable memory of claim 44, wherein said performing clock-domain analysis on said sequential circuit model for generating an optimal ordered sequence of selected capture clocks further comprises the computer implemented steps of:
(f) constructing a domain-interconnect graph comprising a plurality of vertexes and arcs, each said vertex denoting one of said N clock domains, and each said arc denoting one of said C cross-clock domains; and
(g) analyzing said domain-interconnect graph to find said optimal ordered sequence of capture clocks.

46. The computer-readable memory of claim 45, wherein analyzing said domain-interconnect graph to find said optimal ordered sequence of capture clocks further comprises the computer implemented steps of:
(h) breaking one selected arc from each vertex-pair with bi-directional links to form a directed graph; and
(i) levelizing said directed graph to obtain said optimal ordered sequence of capture clocks.

47. The computer-readable memory of claim 46, wherein said levelizing said directed graph to obtain said optimal ordered sequence of capture clocks further comprises analyzing said directed graph to determine which selected vertexes (or selected clock domains) do not interact each other directly or indirectly, and selectively replacing said capture clocks controlling said selected clock domains with one or more grouped capture clocks.

48. The computer-readable memory of claim 44, wherein said performing clock-domain analysis on said sequential circuit model for generating an optimal ordered sequence of capture clocks further comprises applying said optimal ordered sequence of capture clocks in reverse order.

49. The computer-readable memory of claim 48, wherein said applying said optimal ordered sequence of capture clocks in reverse order further comprises removing one or more selected capture clocks from said optimal ordered sequence of capture clocks in reverse order.

50. The computer-readable memory of claim 27, wherein said generating said stimuli and said test responses on said equivalent combinational circuit model according to said input constraints further comprises generating HDL test benches according to said stimuli and said test responses for verifying the correctness of said scan-based integrated circuit using simulation methods.

51. The computer-readable memory of claim 27, wherein said generating said stimuli and said test responses on said equivalent combinational circuit model according to said input constraints further comprises generating ATE (automatic test equipment) test programs according to said stimuli and said test responses for verifying the correctness of said scan-based integrated circuit in said ATE.

52. The computer-readable memory of claim 27, wherein said faults further include selected stuck-at faults, selected transition faults selectively launched from shift or launched from capture, selected path-delay faults selectively launched from shift or launched from capture, selected IDDQ (IDD quiescent current) faults, and selected bridging faults.

53. An electronic design automation system comprising: a processor; a bus coupled to said processor; and a computer-readable memory coupled to said bus and having computer-readable program code embodied therein for causing a computer system to perform a method for generating stimuli and test responses for testing faults in a scan-based integrated circuit in a selected scan-test mode or a selected self-test mode, the scan-based integrated circuit containing a plurality of scan chains, N clock domains, and C cross-clock domain blocks, each scan chain comprising multiple scan cells coupled in series, each clock domain having one capture clock, each cross-clock domain block comprising a combinational logic network; said method comprising the computer implemented steps of:
 (a) compiling a HDL (hardware description language) code modeled at RTL (register-transfer level) or at gate-level that represents said scan-based integrated circuit into a sequential circuit model;
 (b) specifying input constraints on said scan-based integrated circuit during a shift and capture operation;
 (c) specifying a clock grouping to map said N clock domains into G clock domain groups, where N>G≥1;
 (d) transforming said sequential circuit model into an equivalent combinational circuit model according to said input constraints and said clock grouping, by selectively performing circuit expansion on selected cross-clock domain blocks and selected clock domains embedded completely within selected clock domain groups, and selectively performing circuit expansion on selected cross-clock domain blocks across selected clock domain groups, said selected clock domain groups in said G clock domain groups, said selected clock domains in said N clock domains, and said selected cross-clock domain blocks in said C cross-clock domain blocks; and
 (e) generating said stimuli and said test responses on said equivalent combinational circuit model according to said input constraints.

54. The system of claim 53, wherein said specifying a clock grouping to map said N clock domains into G clock domain groups further comprises automatically generating said clock grouping based on said sequential circuit model and said input constraints.

55. The system of claim 53, wherein said generating said stimuli and said test responses on said equivalent combinational circuit model according to said input constraints further comprises performing fault simulation on said equivalent combinational circuit model selectively using a selected set of predetermined patterns as said stimuli and said test responses in said selected scan-test mode, or a selected set of pseudorandom patterns as said stimuli and said test responses in said selected self-test mode.

56. The system of claim 55, wherein said performing fault simulation on said equivalent combinational circuit model further comprises selectively using a one-hot method to perform said fault simulation on a plurality of selected first unexpanded blocks, wherein each said selected first unexpanded block is a clock domain in said N clock domains that is not in said selected clock domains, or a cross-clock domain block in said C cross-clock domain blocks that is not in said selected cross-clock domain blocks.

57. The system of claim 56, wherein said one-hot method further comprises testing said plurality of selected first unexpanded blocks one at a time by selectively applying a selected capture clock connected to one or more said selected first unexpanded blocks while disabling all other capture clocks connected to other said selected first unexpanded blocks during a selected capture operation.

58. The system of claim 55, wherein said performing fault simulation on said equivalent combinational circuit model further comprises selectively using a constrained-value method to perform said fault simulation on a plurality of selected second unexpanded blocks, wherein each said selected second unexpanded block is a clock domain in said N clock domains that is not in said selected clock domains, or a cross-clock domain block in said C cross-clock domain blocks that is not in said selected cross-clock domain blocks.

59. The system of claim 58, wherein said constrained-value method further comprises testing said plurality of selected second unexpanded blocks by setting constrained ('0', '1', 'X') values on all said plurality of selected second unexpanded blocks and applying all capture clocks connected to said plurality of selected second unexpanded blocks simultaneously during a selected capture operation.

60. The system of claim 55, wherein said performing fault simulation on said equivalent combinational circuit model further comprises selectively using a multi-timeframe fault simulation method to perform said fault simulation on a plurality of selected third unexpanded blocks, wherein each said selected third unexpanded block is a clock domain in said N clock domains that is not in said selected clock domains, or a cross-clock domain block in said C cross-clock domain blocks that is not in said selected cross-clock domain blocks.

61. The system of claim 60, wherein said multi-timeframe fault simulation method further comprises testing said plurality of selected third unexpanded blocks by performing said fault simulation on said selected third unexpanded blocks by applying all capture clocks connected to said selected third unexpanded blocks sequentially during a selected capture operation.

62. The system of claim 53, wherein said generating said stimuli and said test responses on said equivalent combinational circuit model according to said input constraints further comprises performing combinational ATPG (automatic test pattern generation) on said equivalent combinational circuit model to generate said stimuli and said test responses in said selected scan-test mode.

63. The system of claim 62, wherein said performing combinational ATPG on said equivalent combinational circuit model further comprises selectively using a one-hot method to perform said fault simulation on a plurality of selected fourth unexpanded blocks, wherein each said selected fourth unexpanded block is a clock domain in said N clock domains that is not in said selected clock domains, or a cross-clock domain block in said C cross-clock domain blocks that Is not in said selected cross-clock domain blocks.

64. The system of claim 63, wherein said one-hot method further comprises testing said plurality of selected fourth unexpanded blocks one at a time by selectively applying a selected capture clock connected to one or more said selected fourth unexpanded blocks while disabling all other capture clocks connected to other said selected fourth unexpanded blocks during a selected capture operation.

65. The system of claim 62, wherein said performing combinational ATPG on said equivalent combinational circuit model further comprises selectively using a constrained-value method to perform said fault simulation on a plurality of selected fifth unexpanded blocks, wherein each said selected fifth unexpanded block is a clock domain in said N clock domains that is not in said selected clock domains, or a cross-clock domain block in said C cross-clock domain blocks that is not in said selected cross-clock domain blocks.

66. The system of claim 65, wherein said constrained-value method further comprises testing said plurality of selected second unexpanded blocks by setting constrained ('0', '1', 'X') values on all said plurality of selected fifth unexpanded blocks and applying all capture clocks connected to said plurality of selected fifth unexpanded blocks simultaneously during a selected capture operation.

67. The system of claim 62, wherein said performing combinational ATPG on said equivalent combinational circuit model further comprises selectively using a multi-timeframe fault simulation method to perform said fault simulation on a plurality of selected sixth unexpanded blocks, wherein each said selected sixth unexpanded block is a clock domain in said N clock domains that is not in said selected clock domains, or a cross-clock domain block in said C cross-clock domain blocks that is not in said selected cross-clock domain blocks.

68. The system of claim 67, wherein said multi-timeframe fault simulation method further comprises testing said plurality of selected sixth unexpanded blocks by performing said fault simulation on said selected sixth unexpanded blocks by applying all capture clocks connected to said selected sixth unexpanded blocks sequentially during a selected capture operation.

69. The system of claim 53, wherein said specifying input constraints on said scan-based integrated circuit further comprises specifying an ordered sequence of selected capture clocks in said capture operation.

70. The system of claim 69, wherein said specifying an ordered sequence of selected capture clocks further comprises performing clock-domain analysis on said sequential circuit model for generating an optimal ordered sequence of selected capture clocks automatically.

71. The system of claim 70, wherein said performing clock-domain analysis on said sequential circuit model for generating an optimal ordered sequence of selected capture clocks further comprises the computer implemented steps of:
(f) constructing a domain-interconnect graph comprising a plurality of vertexes and arcs, each said vertex denoting one of said N clock domains, and each said arc denoting one of said C cross-clock domains; and
(g) analyzing said domain-interconnect graph to find said optimal ordered sequence of capture clocks.

72. The system of claim 71, wherein analyzing said domain-interconnect graph to find said optimal ordered sequence of capture clocks further comprises the computer implemented steps of:
(h) breaking one selected arc from each vertex-pair with bi-directional links to form a directed graph; and
(i) levelizing said directed graph to obtain said optimal ordered sequence of capture clocks.

73. The system of claim 72, wherein said levelizing said directed graph to obtain said optimal ordered sequence of capture clocks further comprises analyzing said directed graph to determine which selected vertexes (or selected clock domains) do not interact each other directly or indirectly, and selectively replacing said capture clocks controlling said selected clock domains with one or more grouped capture clocks.

74. The system of claim 70, wherein said performing clock-domain analysis on said sequential circuit model for generating an optimal ordered sequence of capture clocks further comprises applying said optimal ordered sequence of capture clocks in reverse order.

75. The system of claim 74, wherein said applying said optimal ordered sequence of capture clocks in reverse order further comprises removing one or more selected capture clocks from said optimal ordered sequence of capture clocks in reverse order.

76. The system of claim 53, wherein said generating said stimuli and said test responses on said equivalent combinational circuit model according to said input constraints further comprises generating HDL test benches according to said stimuli and said test responses for verifying the correctness of said scan-based integrated circuit using simulation methods.

77. The system of claim 53, wherein said generating said stimuli and said test responses on said equivalent combinational circuit model according to said input constraints further comprises generating ATE (automatic test equipment) test programs according to said stimuli and said test responses for verifying the correctness of said scan-based integrated circuit in said ATE.

78. The system of claim 53, wherein said faults further include selected stuck-at faults, selected transition faults selectively launched from shift or launched from capture, selected path-delay faults selectively launched from shift or launched from capture, selected IDDQ (IDD quiescent current) faults, and selected bridging faults.

79. A method for generating stimuli and test responses for testing faults in a scan-based integrated circuit in a selected scan-test mode or a selected self-test mode, the scan-based integrated circuit containing a plurality of scan chains, N clock domains, and C cross-clock domain blocks, each scan chain comprising multiple scan cells coupled in series, each clock domain having one capture clock, each cross-clock domain block comprising a combinational logic network; said method comprising the computer implemented steps of:
(a) compiling a HDL (hardware description language) code modeled at RTL (register-transfer level) or at gate-level that represents said scan-based integrated circuit into a sequential circuit model;

(b) specifying input constraints on said scan-based integrated circuit during a shift and capture operation;

(c) specifying a clock grouping to map said N clock domains into G clock domain groups, where N>G>1;

(d) transforming said sequential circuit model into an equivalent combinational circuit model according to said input constraints; and (e) generating said stimuli and said test responses on said equivalent combinational circuit model according to said input constraints and said clock grouping, by selectively performing a multi-timeframe fault simulation on selected cross-clock domain blocks and selected clock domains embedded completely within selected clock domain groups, and selectively performing a multi-timeframe fault simulation on selected cross-clock domain blocks across selected clock domain groups, said selected clock domain groups in said G clock domain groups, said selected clock domains in said N clock domains, and said selected cross-clock domain blocks in said C cross-clock domain blocks.

80. The method of claim 79, wherein said specifying a clock grouping to map said N clock domains into G clock domain groups further comprises automatically generating said clock grouping based on said sequential circuit model and said input constraints.

81. The method of claim 79, wherein said generating said stimuli and said test responses on said equivalent combinational circuit model according to said input constraints and said clock grouping further comprises performing fault simulation on said equivalent combinational circuit model selectively using a selected set of predetermined patterns as said stimuli and said test responses in said selected scan-test mode, or a selected set of pseudorandom patterns as said stimuli and said test responses in said selected self-test mode.

82. The method of claim 81, wherein said performing fault simulation on said equivalent combinational circuit model further comprises selectively using a one-hot method to perform said fault simulation on a plurality of selected first unexpanded blocks, wherein each said selected first unexpanded block is a clock domain in said N clock domains that is not in said selected clock domains, or a cross-clock domain block in said C cross-clock domain blocks that is not in said selected cross-clock domain blocks.

83. The method of claim 82, wherein said one-hot method further comprises testing said plurality of selected first unexpanded blocks one at a time by selectively applying a selected capture clock connected to one or more said selected first unexpanded blocks while disabling all other capture clocks connected to other said selected first unexpanded blocks during a selected capture operation.

84. The method of claim 81, wherein said performing fault simulation on said equivalent combinational circuit model further comprises selectively using a constrained-value method to perform said fault simulation on a plurality of selected second unexpanded blocks, wherein each said selected second unexpanded block is a clock domain in said N clock domains that is not in said selected clock domains, or a cross-clock domain block in said C cross-clock domain blocks that is not in said selected cross-clock domain blocks.

85. The method of claim 84, wherein said constrained-value method further comprises testing said plurality of selected second unexpanded blocks by setting constrained ('0', '1', 'X') values on all said plurality of selected second unexpanded blocks and applying all capture clocks connected to said plurality of selected second unexpanded blocks simultaneously during a selected capture operation.

86. The method of claim 81, wherein said generating said stimuli and said test responses on said equivalent combinational circuit model according to said input constraints and said clock grouping further comprises performing combinational ATPG (automatic test pattern generation) on said equivalent combinational circuit model to generate said stimuli and said test responses in said selected scan-test mode.

87. The method of claim 86, wherein said performing combinational ATPG on said equivalent combinational circuit model further comprises selectively using a one-hot method to perform said fault simulation on a plurality of selected fourth unexpanded blocks, wherein each said selected fourth unexpanded block is a clock domain in said N clock domains that is not in said selected clock domains, or a cross-clock domain block in said C cross-clock domain blocks that is not in said selected cross-clock domain blocks.

88. The method of claim 87, wherein said one-hot method further comprises testing said plurality of selected fourth unexpanded blocks one at a time by selectively applying a selected capture clock connected to one or more said selected fourth unexpanded blocks while disabling all other capture clocks connected to other said selected fourth unexpanded blocks during a selected capture operation.

89. The method of claim 86, wherein said performing combinational ATPG on said equivalent combinational circuit model further comprises selectively using a constrained-value method to perform said fault simulation on a plurality of selected fifth unexpanded blocks, wherein each said selected fifth unexpanded block is a clock domain in said N clock domains that is not in said selected clock domains, or a cross-clock domain block in said C cross-clock domain blocks that is not in said selected cross-clock domain blocks.

90. The method of claim 89, wherein said constrained-value method further comprises testing said plurality of selected second unexpanded blocks by setting constrained ('0', '1', 'X') values on all said plurality of selected fifth unexpanded blocks and applying all capture clocks connected to said plurality of selected fifth unexpanded blocks simultaneously during a selected capture operation.

91. The method of claim 79, wherein said specifying input constraints on said scan-based integrated circuit further comprises specifying an ordered sequence of selected capture clocks in said capture operation.

92. The method of claim 91, wherein said specifying an ordered sequence of selected capture clocks further comprises performing clock-domain analysis on said sequential circuit model for generating an optimal ordered sequence of selected capture clocks automatically.

93. The method of claim 92, wherein said performing clock-domain analysis on said sequential circuit model for generating an optimal ordered sequence of selected capture clocks further comprises the computer implemented steps of:

(f) constructing a domain-interconnect graph comprising a plurality of vertexes and arcs, each said vertex denoting one of said N clock domains, and each said arc denoting one of said C cross-clock domains; and (g) analyzing said domain-interconnect graph to find said optimal ordered sequence of capture clocks.

94. The method of claim 93, wherein analyzing said domain-interconnect graph to find said optimal ordered sequence of capture clocks further comprises the computer implemented steps of:

(h) breaking one selected arc from each vertex-pair with bi-directional links to form a directed graph; and (i) levelizing said directed graph to obtain said optimal ordered sequence of capture clocks.

95. The method of claim 94, wherein said levelizing said directed graph to obtain said optimal ordered sequence of capture clocks further comprises analyzing said directed graph to determine which selected vertexes (or selected clock domains) do not interact each other directly or indirectly, and selectively replacing said capture clocks controlling said selected clock domains with one or more grouped capture clocks.

96. The method of claim 91, wherein said performing clock-domain analysis on said sequential circuit model for generating an optimal ordered sequence of capture clocks further comprises applying said optimal ordered sequence of capture clocks in reverse order.

97. The method of claim 96, wherein said applying said optimal ordered sequence of capture clocks in reverse order further comprises removing one or more selected capture clocks from said optimal ordered sequence of capture clocks in reverse order.

98. The method of claim 79, wherein said generating said stimuli and said test responses on said equivalent combinational circuit model according to said input constraints further comprises generating HDL test benches according to said stimuli and said test responses for verifying the correctness of said scan-based integrated circuit using simulation methods.

99. The method of claim 79, wherein said generating said stimuli and said test responses on said equivalent combinational circuit model according to said input constraints further comprises generating ATE (automatic test equipment) test programs according to said stimuli and said test responses for verifying the correctness of said scan-based integrated circuit in said ATE.

100. The method of claim 79, wherein said faults further include selected stuck-at faults, selected transition faults selectively launched from shift or launched from capture, selected path-delay faults selectively launched from shift or launched from capture, selected IDDQ (IDD quiescent current) faults, and selected bridging faults.

101. A computer-readable memory having computer-readable program code embodied therein for causing a computer system to perform a method for generating stimuli and test responses for testing faults in a scan-based integrated circuit in a selected scan-test mode or a selected self-test mode, the scan-based integrated circuit containing a plurality of scan chains, N clock domains, and C cross-clock domain blocks, each scan chain comprising multiple scan cells coupled in series, each clock domain having one capture clock, each cross-clock domain block comprising a combinational logic network; said method comprising the computer implemented steps of:

(a) compiling a HDL (hardware description language) code modeled at RTL (register-transfer level) or at gate-level that represents said scan-based integrated circuit into a sequential circuit model;

(b) specifying input constraints on said scan-based integrated circuit during a shift and capture operation;

(c) specifying a clock grouping to map said N clock domains into G clock domain groups, where N>G>1;

(d) transforming said sequential circuit model into an equivalent combinational circuit model according to said input constraints; and (e) generating said stimuli and said test responses on said equivalent combinational circuit model according to said input constraints and said clock grouping, by selectively performing a multi-timeframe fault simulation on selected cross-clock domain blocks and selected clock domains embedded completely within selected clock domain groups, and selectively performing a multi-timeframe fault simulation on selected cross-clock domain blocks across selected clock domain groups, said selected clock domain groups in said G clock domain groups, said selected clock domains in said N clock domains, and said selected cross-clock domain blocks in said C cross-clock domain blocks.

102. An electronic design automation system comprising: a processor; a bus coupled to said processor; and a computer-readable memory coupled to said bus and having computer-readable program code embodied therein for causing a computer system to perform a method for generating stimuli and test responses for testing faults in a scan-based integrated circuit in a selected scan-test mode or a selected self-test mode, the scan-based integrated circuit containing a plurality of scan chains, N clock domains, and C cross-clock domain blocks, each scan chain comprising multiple scan cells coupled in series, each clock domain having one capture clock, each cross-clock domain block comprising a combinational logic network; said method comprising the computer implemented steps of:

(a) compiling a HDL (hardware description language) code modeled at RTL (register-transfer level) or at gate-level that represents said scan-based integrated circuit into a sequential circuit model;

(b) specifying input constraints on said scan-based integrated circuit during a shift and capture operation;

(c) specifying a clock grouping to map said N clock domains into G clock domain groups, where N>G>1;

(d) transforming said sequential circuit model into an equivalent combinational circuit model according to said input constraints; and (e) generating said stimuli and said test responses on said equivalent combinational circuit model according to said input constraints and said clock grouping, by selectively performing a multi-timeframe fault simulation on selected cross-clock domain blocks and selected clock domains embedded completely within selected clock domain groups, and selectively performing a multi-timeframe fault simulation on selected cross-clock domain blocks across selected clock domain groups, said selected clock domain groups in said G clock domain groups, said selected clock domains in said N clock domains, and said selected cross-clock domain blocks in said C cross-clock domain blocks.

* * * * *